(12) United States Patent
Shen et al.

(10) Patent No.: US 7,559,010 B2
(45) Date of Patent: Jul. 7, 2009

(54) SHORT LENGTH LDPC (LOW DENSITY PARITY CHECK) CODE AND MODULATION ADAPTED FOR HIGH SPEED ETHERNET APPLICATIONS

(75) Inventors: Ba-Zhong Shen, Irvine, CA (US); Kelly Brian Cameron, Irvine, CA (US); Hau Thien Tran, Irvine, CA (US); Scott Richard Powell, Carlsbad, CA (US)

(73) Assignee: Broadcom Corporation, Irvine, CA (US)

( * ) Notice: Subject to any disclaimer, the term of this patent is extended or adjusted under 35 U.S.C. 154(b) by 659 days.

(21) Appl. No.: 11/190,657

(22) Filed: Jul. 27, 2005

(65) Prior Publication Data

US 2006/0041821 A1 Feb. 23, 2006

Related U.S. Application Data

(60) Provisional application No. 60/602,692, filed on Aug. 19, 2004, provisional application No. 60/602,553, filed on Aug. 18, 2004.

(51) Int. Cl.
 *H03M 13/00* (2006.01)
(52) U.S. Cl. .................................... 714/807; 714/752
(58) Field of Classification Search ................. 714/807, 714/758, 752, 786, 796, 790, 792, 755; 375/298, 375/265, 316, 329
See application file for complete search history.

(56) References Cited

U.S. PATENT DOCUMENTS

| | | | |
|---|---|---|---|
| 3,542,756 A | 11/1970 | Gray | |
| 3,665,396 A | 5/1972 | Forney, Jr. | |
| 4,295,218 A | 10/1981 | Tanner | |
| 6,034,996 A * | 3/2000 | Herzberg | 375/265 |
| 6,430,233 B1 | 8/2002 | Dillon et al. | |
| 6,473,010 B1 | 10/2002 | Vityaev et al. | |
| 6,567,465 B2 | 5/2003 | Goldstein et al. | |
| 6,633,856 B2 | 10/2003 | Richardson et al. | |
| 6,963,622 B2 * | 11/2005 | Eroz et al. | 375/298 |
| 2003/0104788 A1 | 6/2003 | Kim | |

OTHER PUBLICATIONS

R. G. Gallager, "Low density parity check codes," IRE Trans. Info. Theory, vol. IT-8, pp. 21-28, Jan. 1962.

(Continued)

*Primary Examiner*—M. Mujtaba K Chaudry
*Assistant Examiner*—Fritz Alphonse
(74) *Attorney, Agent, or Firm*—Garlick Harrison & Markison; Shayne X. Short

(57) ABSTRACT

A short length LDPC (Low Density Parity Check) code and modulation adapted for high speed Ethernet applications. In some instances, the short length LDPC code and modulation may be employed within the recommended practices currently being developed by the IEEE 802.3an (10GBASE-T) Task Force. The IEEE 802.3an (10GBASE-T) Task Force has been commissioned to develop and standardize communications protocol adapted particularly for Ethernet operation over 4 wire twisted pair cables. A new LDPC code, some possible embodiments of constellations and the corresponding mappings, as well as possible embodiments of various parity check matrices, H, of the LDPC code are presented herein to provide for better overall performance than other proposed LDPC codes existent in the art of high speed Ethernet applications. Moreover, this proposed LDPC code may be decoded using a communication device having much less complexity than required to decode other proposed LDPC codes existent in this technology space.

20 Claims, 14 Drawing Sheets

OTHER PUBLICATIONS

R. Gallager, Low-Density Parity-Check Codes, Cambridge, MA: MIT Press, 1963.

M. Luby, M. Mitzenmacher, M. A. Shokrollahi, D. A. Spielman, and V. Stemann, "Practical Loss-Resilient Codes", Proc. 29 th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, pp. 599-618, Feb. 2001.

"Modifications to LDPC Proposal offering Lower Symbol Rate and Lower Latency," by D. Dabiri, J. Tellado of Teranetics (IEEE 802.3an (10GBASE-T) Mar. 2004 meeting).

I. Djurdjevic, J. Xu, K. Abdel-Ghaffar and S. Lin, "A Class of Low-Density Parity-Check Codes Constructed Based on Reed-Solomon Codes With Two Information Symbols," IEEE Communications Letter, vol. 7, No. 7, pp. 317-319, Jul. 2003.

* cited by examiner

SHORT LENGTH LDPC (LOW DENSITY PARITY CHECK) CODE AND MODULATION ADAPTED FOR HIGH SPEED ETHERNET APPLICATIONS

CROSS REFERENCE TO RELATED PATENTS/PATENT APPLICATIONS

Provisional Priority claim

The present U.S. Utility patent application claims priority pursuant to 35 U.S.C. § 119(e) to the following U.S. Provisional Patent Applications which are hereby incorporated herein by reference in their entirety and made part of the present U.S. Utility Patent Application for all purposes:

1. U.S. Provisional Application Ser. No. 60/602,553, "A short length LDPC (Low Density Parity Check) code and modulation adapted for high speed Ethernet applications,", filed Wednesday, Aug. 18, 2004 (Aug. 18, 2004), pending.

2. U.S. Provisional Application Ser. No. 60/602,692, "A short length LDPC (Low Density Parity Check) code and modulation adapted for high speed Ethernet applications,", filed Thursday, Aug. 19, 2004 (Aug. 19, 2004), pending.

BACKGROUND OF THE INVENTION

1. Technical Field of the Invention

The invention relates generally to communication systems; and, more particularly, it relates to coding (including encoding and/or decoding) of signals within such communication systems.

2. Description of Related Art

Data communication systems have been under continual development for many years. One such type of communication system that has been of significant interest lately is a communication system that employs turbo codes. Another type of communication system that has also received interest is a communication system that employs LDPC (Low Density Parity Check) code. Each of these different types of communication systems is able to achieve relatively low BERs (Bit Error Rates).

A continual and primary directive in this area of development has been to try continually to lower the error floor within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

The use of LDPC coded signals continues to be explored within many newer application areas. For example, the use of LDPC coded signals has been of significant concern within the IEEE (Institute of Electrical & Electronics Engineers) P802.3an (10GBASE-T) Task Force. This IEEE P802.3an (10GBASE-T) Task Force has been created by the IEEE to develop and standardize a copper 10 Giga-bit Ethernet standard that operates over twisted pair cabling according the IEEE 802.3 CSMA/CD Ethernet protocols. Carrier Sense Multiple Access/Collision Detect (CSMA/CD) is the protocol for carrier transmission access in Ethernet networks. IEEE 802.3an (10GBASE-T) is an emerging standard for 10 Gbps (Giga-bits per second) Ethernet operation over 4 wire twisted pair cables. More public information is available concerning the IEEE P802.3an (10GBASE-T) Task Force at the following Internet address:

"http://www.ieee802.org/3/an/".

This high data rate provided in such applications is relatively close to the theoretical maximum rate possible over the worst case 100 meter cable. Near-capacity achieving error correction codes are required to enable 10 Gbps operation. The latency constraints, which would be involved by using traditional concatenated codes, simply preclude their use in such applications.

Clearly, there is a need in the art for some alternative coding type and implementation that can provide near-capacity achieving error correction.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
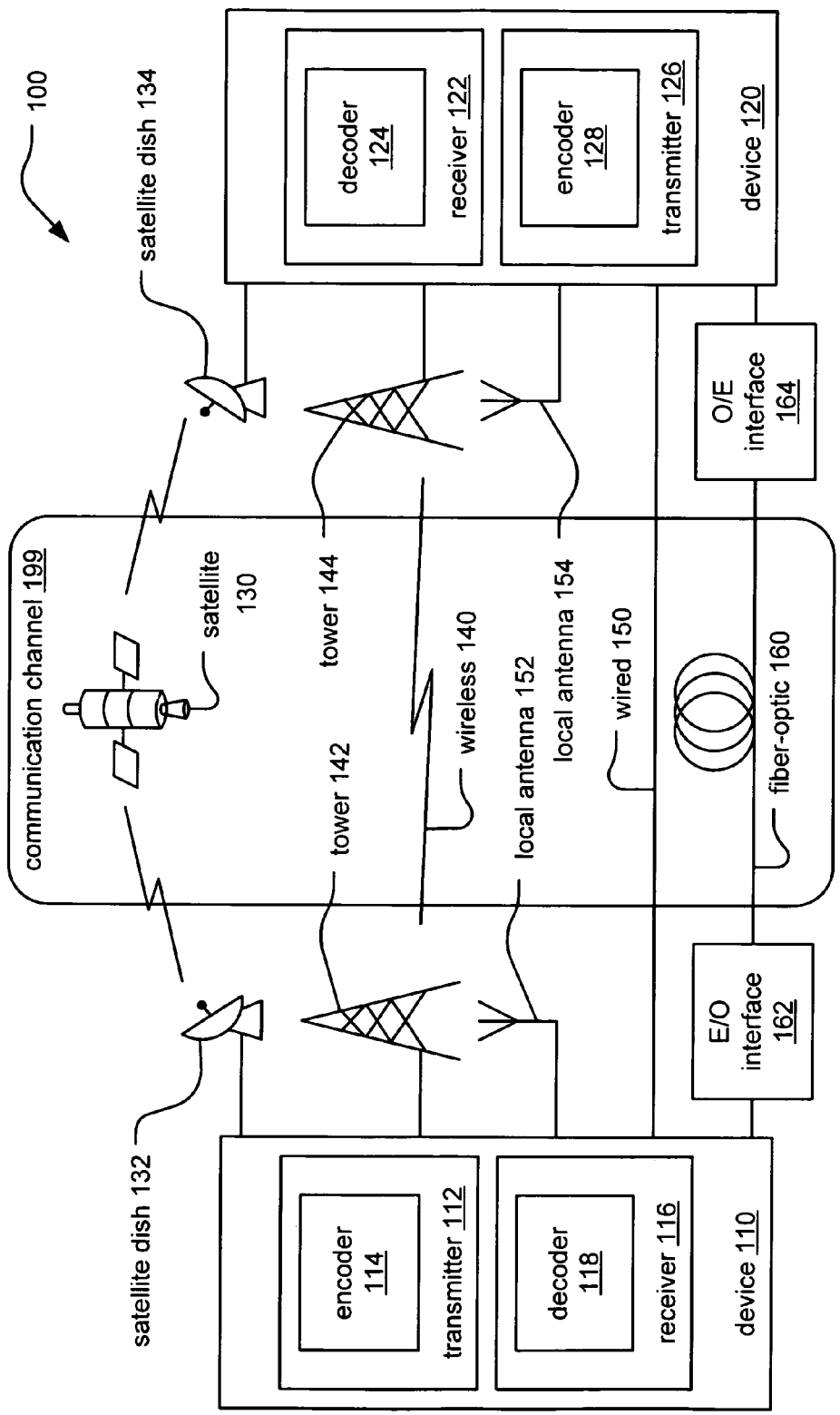
FIG. 1 and FIG. 2 are diagrams illustrating various embodiments of communication systems that may be built in accordance with certain aspects of the invention.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

Figure 2:
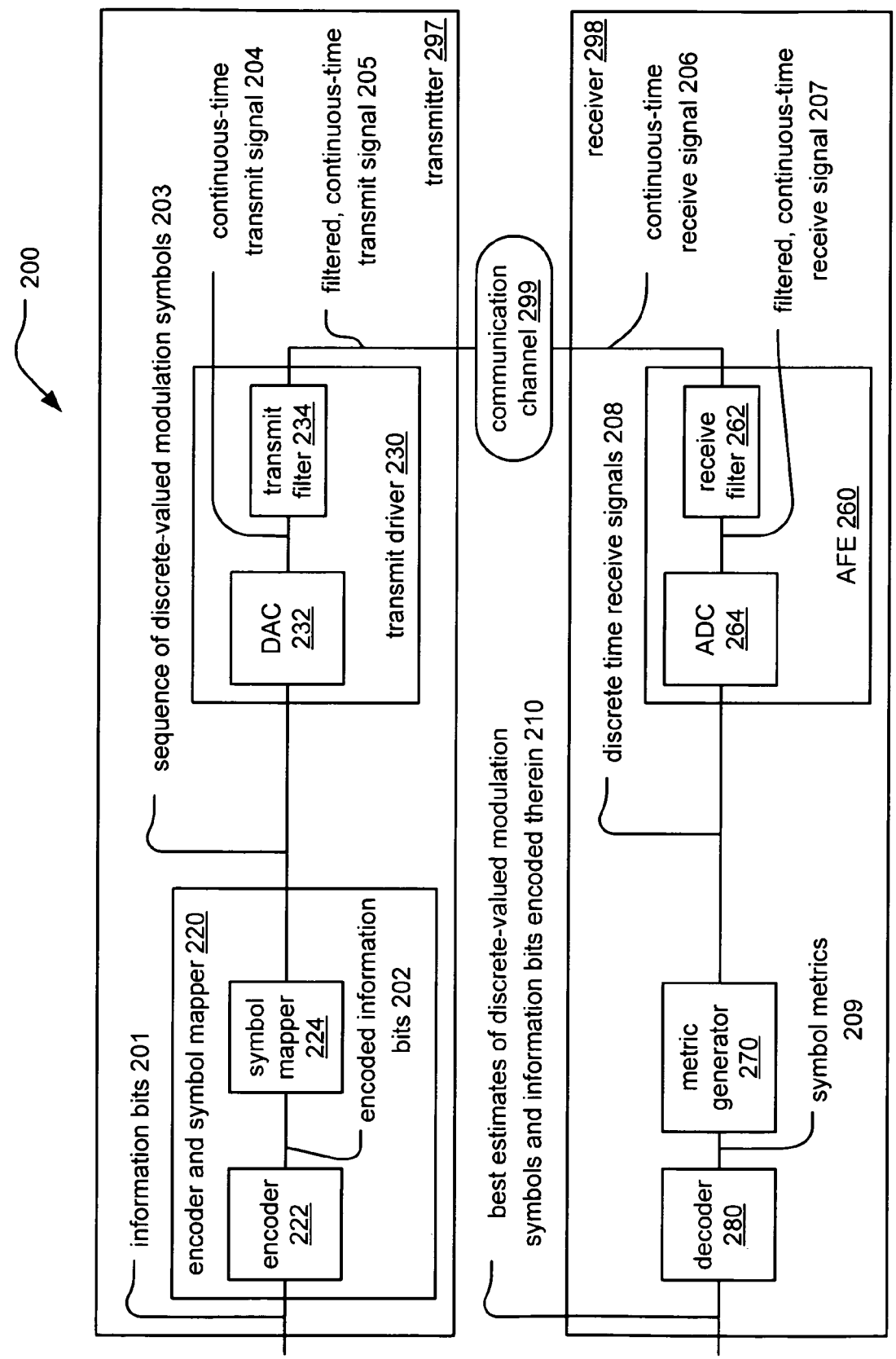

FIG. 1 and FIG. 2 are diagrams illustrating various embodiments of communication systems, 100 and 200, respectively, that may be built in accordance with certain aspects of the invention.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 tat is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The communication devices of either of the previous embodiments may be implemented to include various aspects of the invention therein. In addition, several of the following Figures describe other and particular embodiments (some in more detail) that may be used to support the devices, systems, functionality and/or methods that may be implemented in accordance with certain aspects of the invention. One particular type of signal that is processed according to certain aspects of the invention is an LDPC coded signal. Before more details are provided below, a general description of LDPC codes is provided.

Several of the following Figures describe other and particular embodiments (some in more detail) that may be used to support the devices, systems, functionality and/or methods that may be implemented in accordance with certain aspects of the invention. One particular type of signal that is processed according to certain aspects of the invention is an LDPC coded signals. Before more details are provided below, a general description of LDPC codes is provided.

Figure 3:
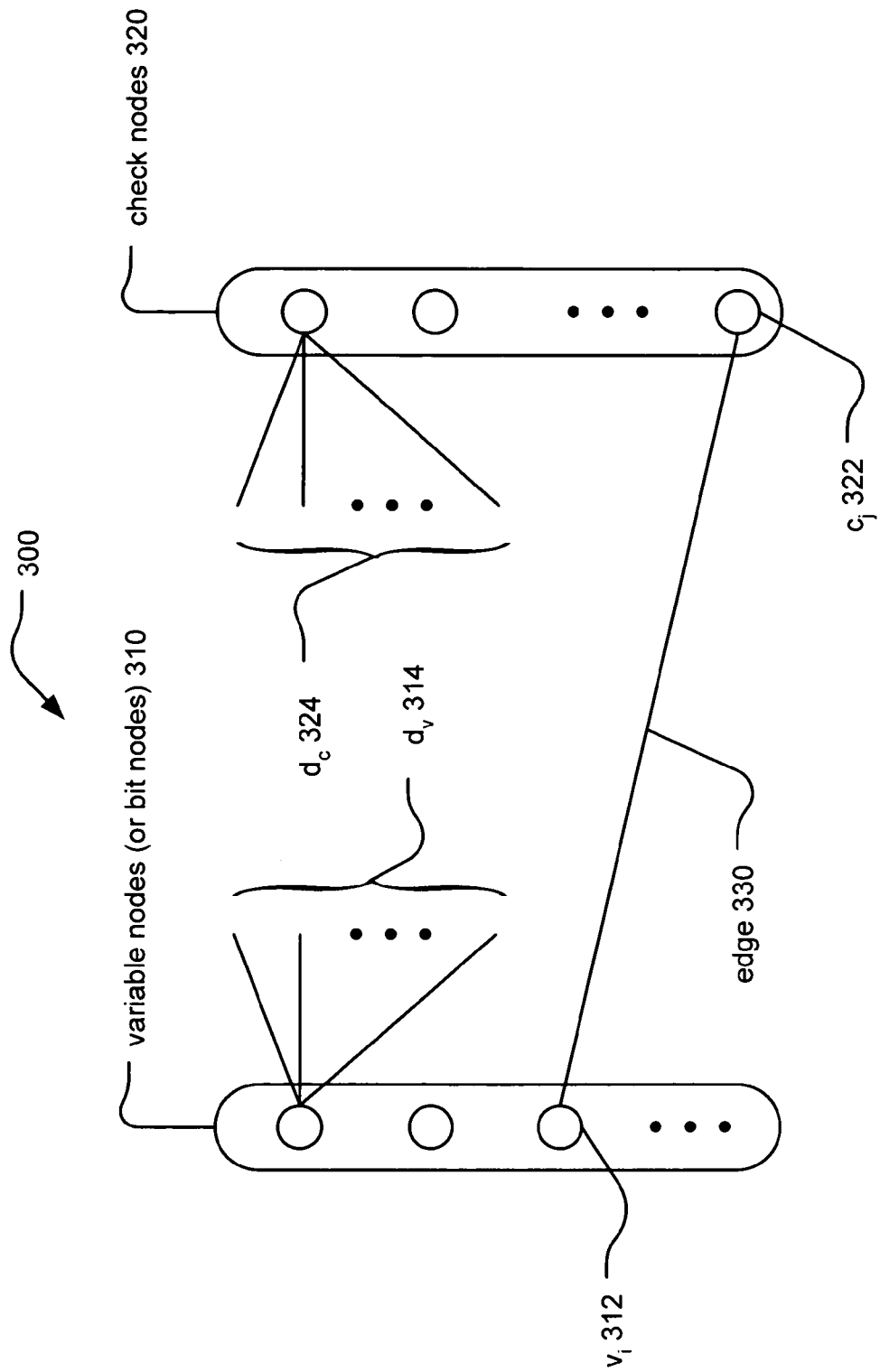
FIG. 3 is a diagram illustrating an embodiment of an LDPC (Low Density Parity Check) code bipartite graph.

FIG. 3 is a diagram illustrating an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, Mass.: MIT Press, 1963.

[2] M. Luby, M. Mitzenmacher, M. A. Shokrollahi, D. A. Spielman, and V. Stemann, "Practical Loss-Resilient Codes", Proc. 29$^{th}$ Symp. on Theory of Computing, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by $e=(i,j)$. However, on the other hand, given an edge $e=(i,j)$, the nodes of the edge may alternatively be denoted as by $e=(v(e),c(e))$ (or $e=(b(e),c(e))$). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(i)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$, and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference [3]:

[3] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda,\rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects of the invention are also operable to accommodate both regular LDPC codes and irregular LDPC codes.

Figure 4:
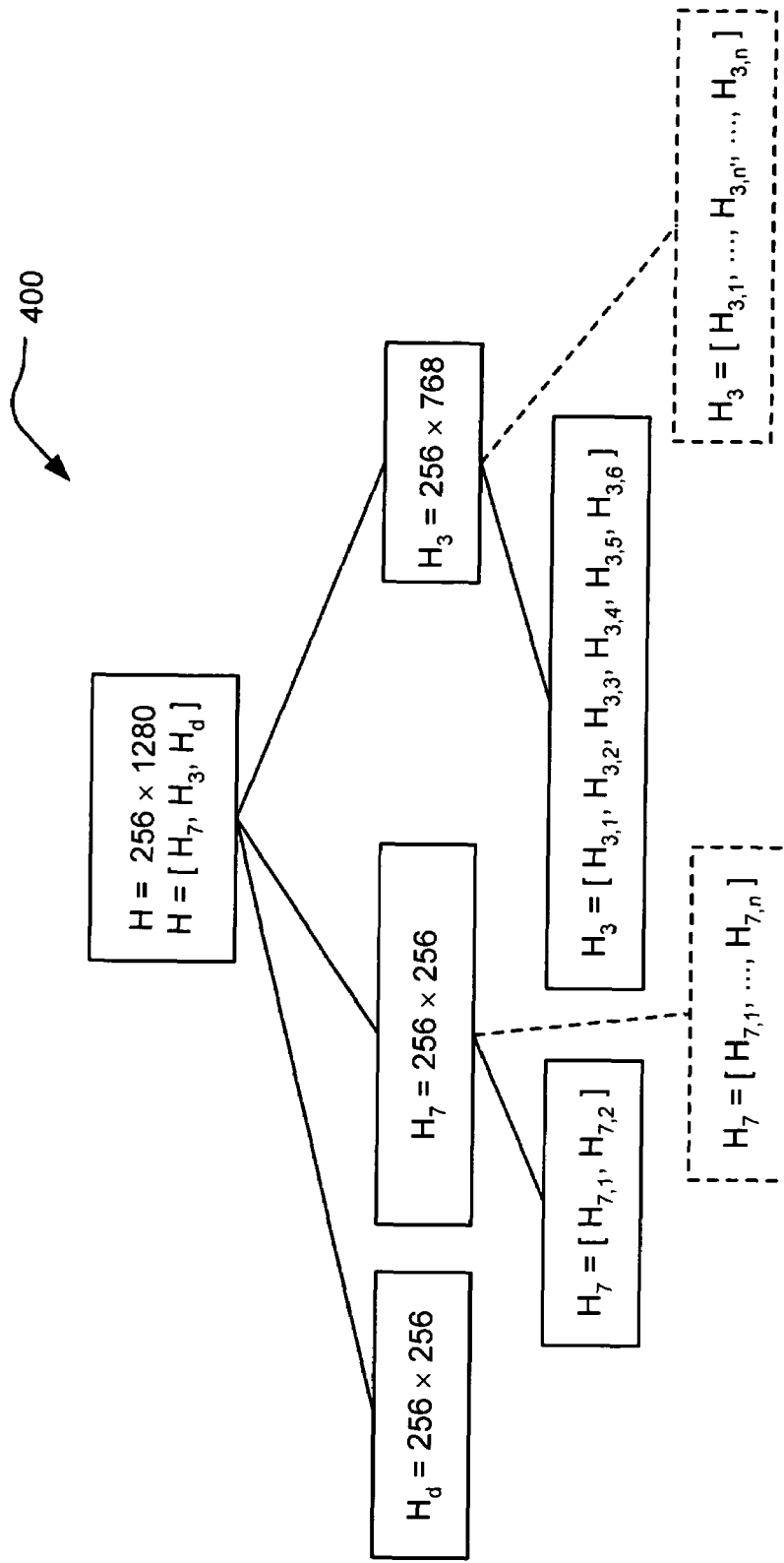
FIG. 4 is a diagram illustrating an embodiment of decomposition of a parity check matrix, H, according to certain aspects of the invention.

FIG. 4 is a diagram illustrating an embodiment of decomposition of a parity check matrix, H, 400 according to certain aspects of the invention. As described above, a parity check matrix (e.g., $H=(h_{i,j})_{M\times N}$) is used to perform coding of an LDPC coded signal.

A (1280,1024) LDPC code is presented herein that is a rate 4/5 binary code with 256 redundancy bits. The parity check matrix H is a 256×1280 LDPC matrix. The LDPC code has 4 different bit node degrees, namely, 1 degree one bit node, 255 degree two bit nodes, 768 degree three bit nodes and 256 degree seven bit nodes.

All of the check nodes of the LDPC code, but one, have degree 18. The other check node has degree 17. Therefore, the LDPC bipartite graph of the LDPC code has 4607 edges. The parity check matrix H can further be decomposed to 3 parts as follows:

$$H=[H_7,H_3,Hd] \tag{EQ 5}$$

1. The sub-matrix $H_d$ is a 256×256 matrix constructed as follows:

$$H_d = \begin{bmatrix} 1 & & & & & & \\ 1 & 1 & & & & & \\ & 1 & 1 & & & & \\ & & & \cdots & & & \\ & & & & 1 & & \\ & & & & 1 & 1 & \\ & & & & & 1 & 1 \end{bmatrix} \tag{EQ 6}$$

where the empty entry stands for "0". This construction is a convention. The advantage of using this structure are many, including: 1) the code constructed by this sub-matrix is systematic; 2) encoding and decoding can share the same parity check matrix; and 3) it provides a large unclosed loop is the LDPC bipartite graph of the corresponded LDPC code.

2. The sub-matrix $H_7$ is a 256 by 256 matrix. Every column of $H_7$ has seven 1s. Furthermore, this matrix is further decomposed to another two sub-matrices, as follows:

$$H_7=[H_{7,1},H_{7,2}] \tag{EQ 7}$$

The sub-matrix $H_{7,i}$ is a 2-cyclic matrix. At first, 7 positions among the positions 0 to 255 are randomly chosen. The first column of the matrix is defined by these 7 positions. The entries of the chosen positions are 1 and the others are 0. The following columns of $H_{7,i}$ constructed by cyclic shift two positions of the previous column.

3. The sub-matrix $H_3$ is a 256 by 768 matrix. Every column of $H_3$ has three 1s. Matrix is decomposed to 6 sub-matrices, as follows:

$$H_3=[H_{3,1}, H_{3,2}, H_{3,3}, H_{3,4}, H_{3,5}, H_{3,6}] \tag{EQ 8}$$

The sub-matrix $H_{3,i}$ is a 2-cyclic matrix. At first, 3 positions among 0 to 255 are randomly chosen. The first column of the matrix is defined by these 3 positions. The entries of the chosen positions are 1 and the others are 0. The following columns of $H_{3,i}$ is constructed by cyclic shift two position of the previous column.

4. Further criteria of the construction are:

a) The 8 sets of random number should be chosen in the way that after 2-cyclic shift that the number of 1's in every rows of $[H_7, H_3]$ should exactly equal to 16;

b) The bipartite graph of the code should have no size 4 loops.

Below, several embodiments of possible parity check matrices are provided, according to the approach given above.

Of the first example parity check matrix constructed according to the approach provided above, the LDPC bipartite graph of this code has no size 4 loop. It has 50298 size 6 loops. A size 4 loop and a size 6 loop can be depicted as shown within the following diagrams.

Figure 5B:
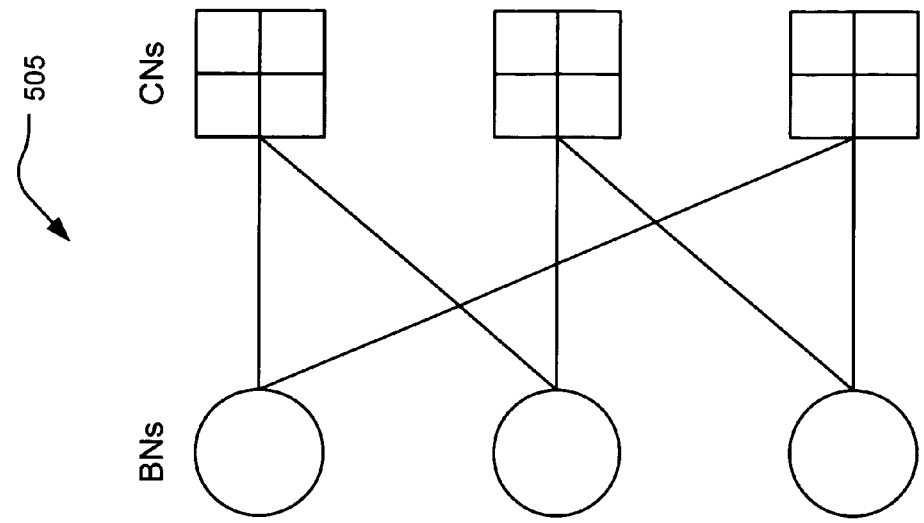
FIG. 5A and FIG. 5B are diagrams illustrating embodiment of a size 4 loop and a size 6 loop, respectively, that may exist within an LDPC code bipartite graph according to certain aspects of the invention.
Figure 5A:
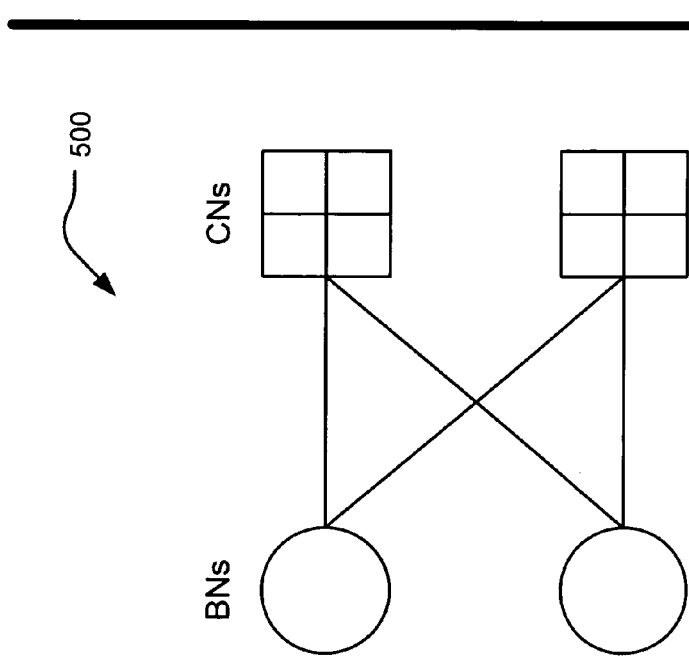

FIG. 5A and FIG. 5B are diagrams illustrating embodiment of a size 4 loop and a size 6 loop, respectively, that may exist within an LDPC code bipartite graph according to certain aspects of the invention.

As can be seen in FIG. 5A, a size 4 loop 500 is shown as having two bit nodes and two check nodes appropriately interconnected via edges. Analogously, as can be seen in FIG. 5B, a size 6 loop 505 is shown as having three bit nodes and three check nodes appropriately interconnected via edges.

Referring back to the FIG. 4, the operations depicted above with respect to steps 2 and 3 may be generalized even more (as shown by 2' and 3' below).

2'. The sub-matrix $H_7$ is decomposed to $n(n \geq 1)$ sub-matrices, as follows:

$$H_7 = [H_{7,1}, \ldots, H_{7,n}] \quad (EQ\ 9)$$

The sub-matrix $H_7$ is a n-cyclic matrix. At first, 7 positions among 0 to 255 are randomly chosen. The first column of the matrix is defined by these 7 positions. The entries of the chosen positions are 1 and the others are 0. The following columns of $H_{7,i}$ constructed by cyclic shift n positions of the previous column.

3'. The sub-matrix $H_3$ is decomposed to $3n$ ($n \geq 1$) sub-matrices, as follows:

$$H_3 = [H_{3,1}, \ldots, H_{3,n}, \ldots, H_{3,3n}] \quad (EQ\ 10)$$

The sub-matrix $H_{3,i}$ is a n-cyclic matrix. At first, 3 positions among 0 to 255 are randomly chosen. The first column of the matrix is defined by these 3 positions. The entries of the chosen positions are 1 and the others are 0. The following columns of $H_{3,i}$ is constructed by cyclic shift n position of the previous column.

In the following referenced paper, a regular LDPC code is constructed based on two codewords of a R-S (Reed-Solomon) code.

[4] I. Djurdjevic, J. Xu, K. Abdel-Ghaffar and S. Lin, "A Class of Low-Density Parity-Check Codes Constructed Based on Reed-Solomon Codes With Two Information Symbols," *IEEE Communications Letter*, vol. 7, no. 7, pp. 317-319, July 2003.

Consider a code (1024, 833), which has rate 8.13 constructed using the approach of the Djurdjevic, et al., paper [4] as identified above. Every bit node of the code has degree 10 and every check node has degree 32. Therefore the code has 10240 edges. Furthermore, the bipartite graph of the code has 2286604 size 6 loops.

Therefore, a (1280,1024) LDPC code, which has 4607 edges, constructed as described according to certain aspects of the invention is less complex; several examples of such codes are provided below as well. Therefore, a (1280, 1024) code would save a considerable amount of hardware with reduced complexity within an actual device.

Figure 6:
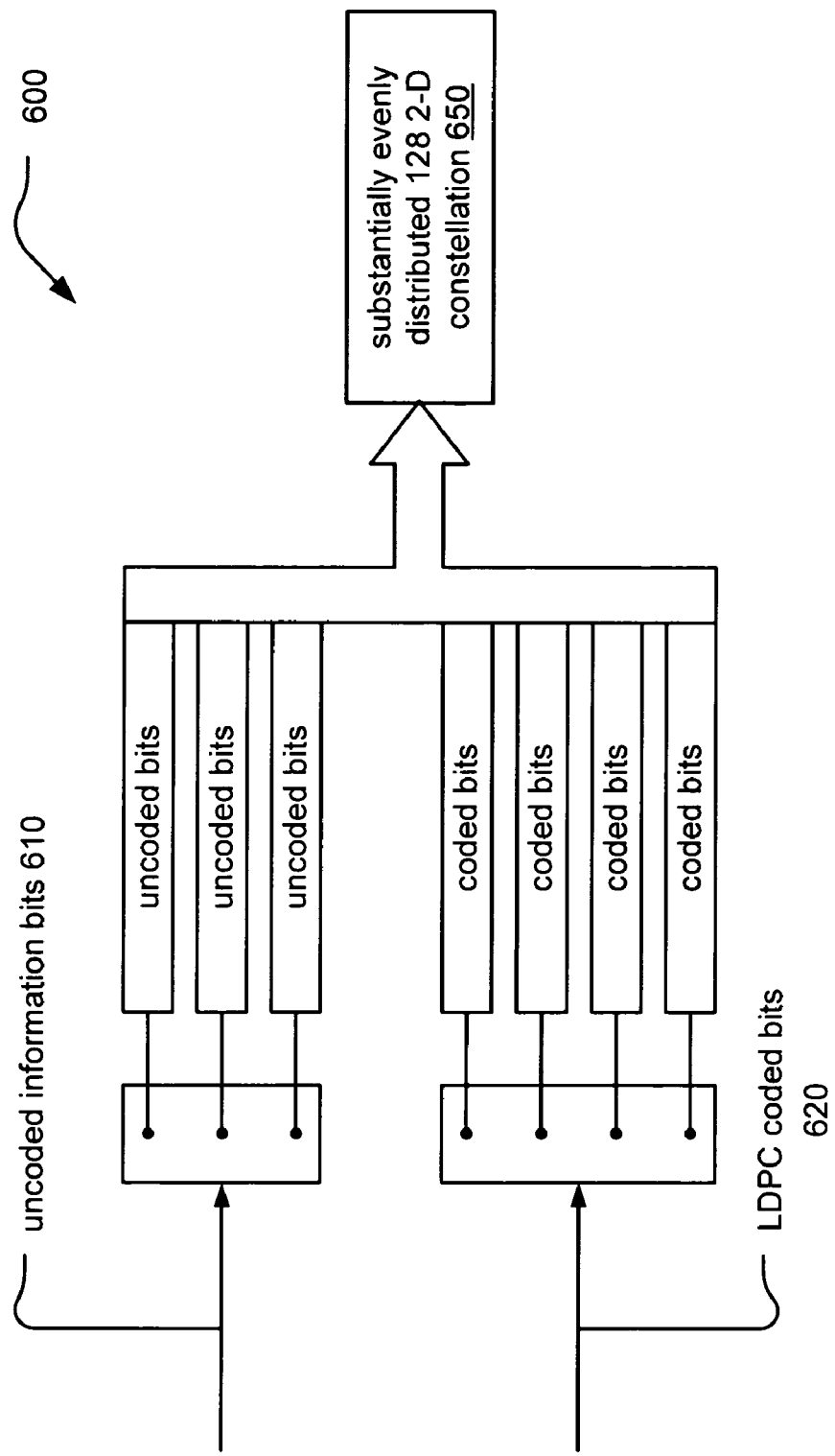
FIG. 6 is a diagram illustrating an embodiment of a system that employs LDPC coding with 3 uncoded bits and 4 coded bits according to certain aspects of the invention.

FIG. 6 is a diagram illustrating an embodiment of a system 600 that employs LDPC coding with 3 uncoded bits and 4 coded bits according to certain aspects of the invention.

This diagram shows an embodiment where uncoded information bits 610 and LDPC coded bits 620 are provided and subsequently arranged to form 7 bit symbols. These 7 bit symbols have 128 possible values (e.g., $2^7 = 128$). Each of these 7 bit symbols included 3 uncoded bits (selected form the uncoded information bits 610) and 4 LDPC coded bits (selected from the LDPC coded bits 620) that are provided to this system 600. These 7 bit symbols are operable to be symbol mapped according to a substantially evenly distributed 128 2-D constellation 650. Some possible embodiments of such an substantially evenly distributed 128 2-D constellation are provided below with respect to some other of the embodiments disclosed herein.

Figure 7:
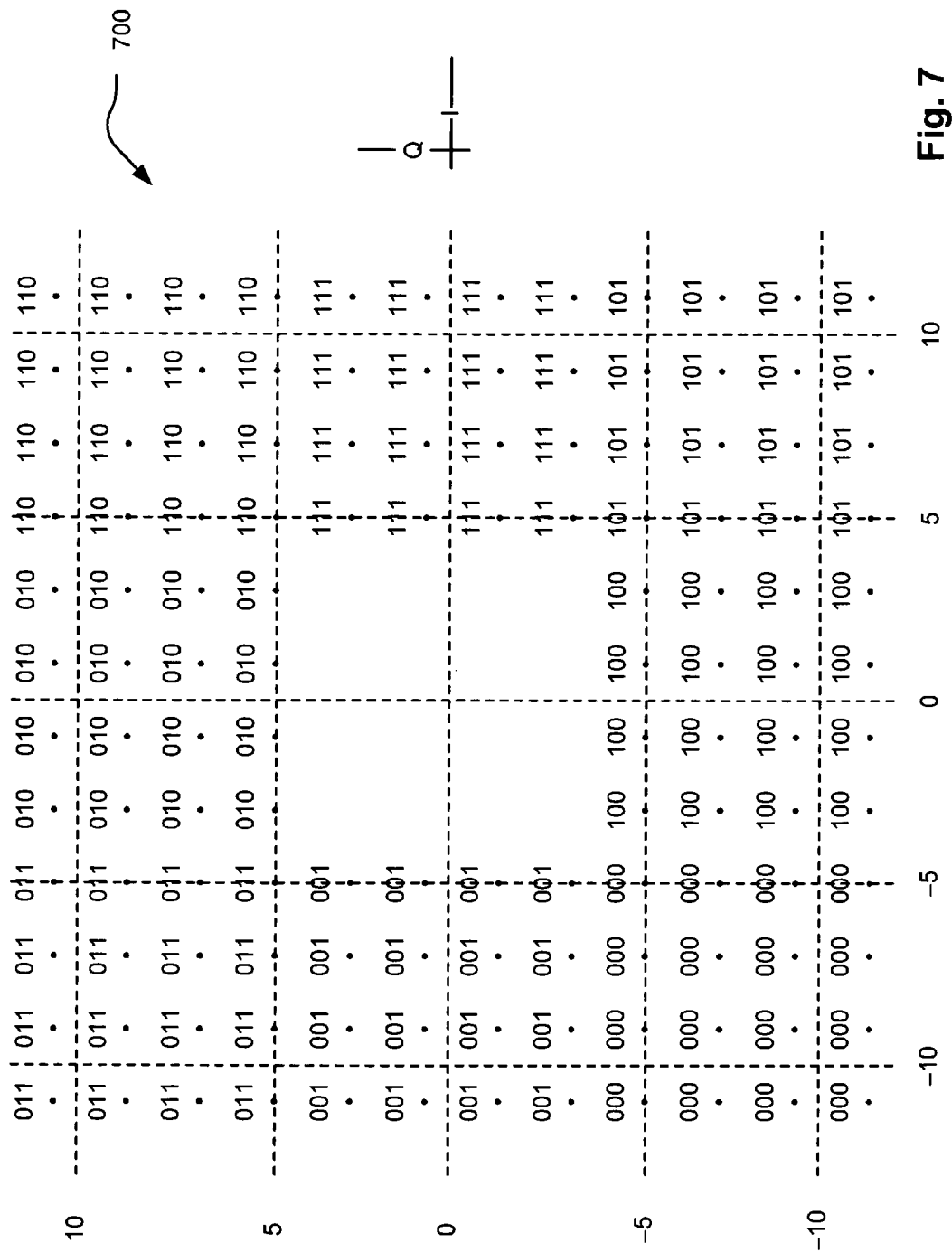
FIG. 7 is a diagram illustrating an embodiment of a doughnut 128 2-D 12-PAM (Pulse Amplitude Modulation) constellation.

FIG. 7 is a diagram illustrating an embodiment of a doughnut 128 2-D 12-PAM (Pulse Amplitude Modulation) constellation 700. In a presentation "Modifications to LDPC Proposal offering Lower Symbol Rate and Lower Latency," by D. Dabiri, J. Tellado of Teranetics (IEEE 802.3an (10GBASE-T) March 2004 meeting) a 128 2-D 12-PAM constellation is constructed as depicted in this diagram.

This document is publicly available at the following Internet address:

"http://www.ieee802.org/3/an/public/mar04/dabiri_1_0304.pdf".

This constellation is referred to herein as a "doughnut" constellation. The labeling of every constellation point is for uncoded bits. In fact, every signal point will transmit 7 bits which include 3 uncoded bits and 4 coded bits from an LDPC code.

Since the center part of this construction is taken out, the distribution of the "doughnut" constellation is not even. Let E be the average power of 1-D 12-PAM constellation. Then the noise variance is as follows:

$$\sigma_1 = E/SNR_1 \quad (EQ\ 11)$$

Since the doughnut 2D-constellation is not exactly 2-D 12-PAM, (EQ 11) cannot be used to compute the noise variance with this constellation. In fact, with the average power $E_2$ of the 2-D constellation the variance should be as follows:

$$\sigma_2 = E_2/2SNR_2 \quad (EQ\ 12)$$

If the 2D Constellation is exact 2-D 12-PAM which has 144 signals, then $E_2 = 95.333$ and thus $SNR_1 = SNR_2$ when $\sigma_2 = \sigma_1$. However, the doughnut constellation only has 128 signals. Moreover, the average power of the constellation is $E_2 = 106$. Thus, when $\sigma_1 = \sigma_2$, then $$SNR_2 = \frac{106}{95.333} SNR_1,$$

i.e. in dB (decibels).

$$SNR_2 = 0.46 + SNR_1 \text{ (dB)} \quad (EQ\ 13)$$

Figure 8:
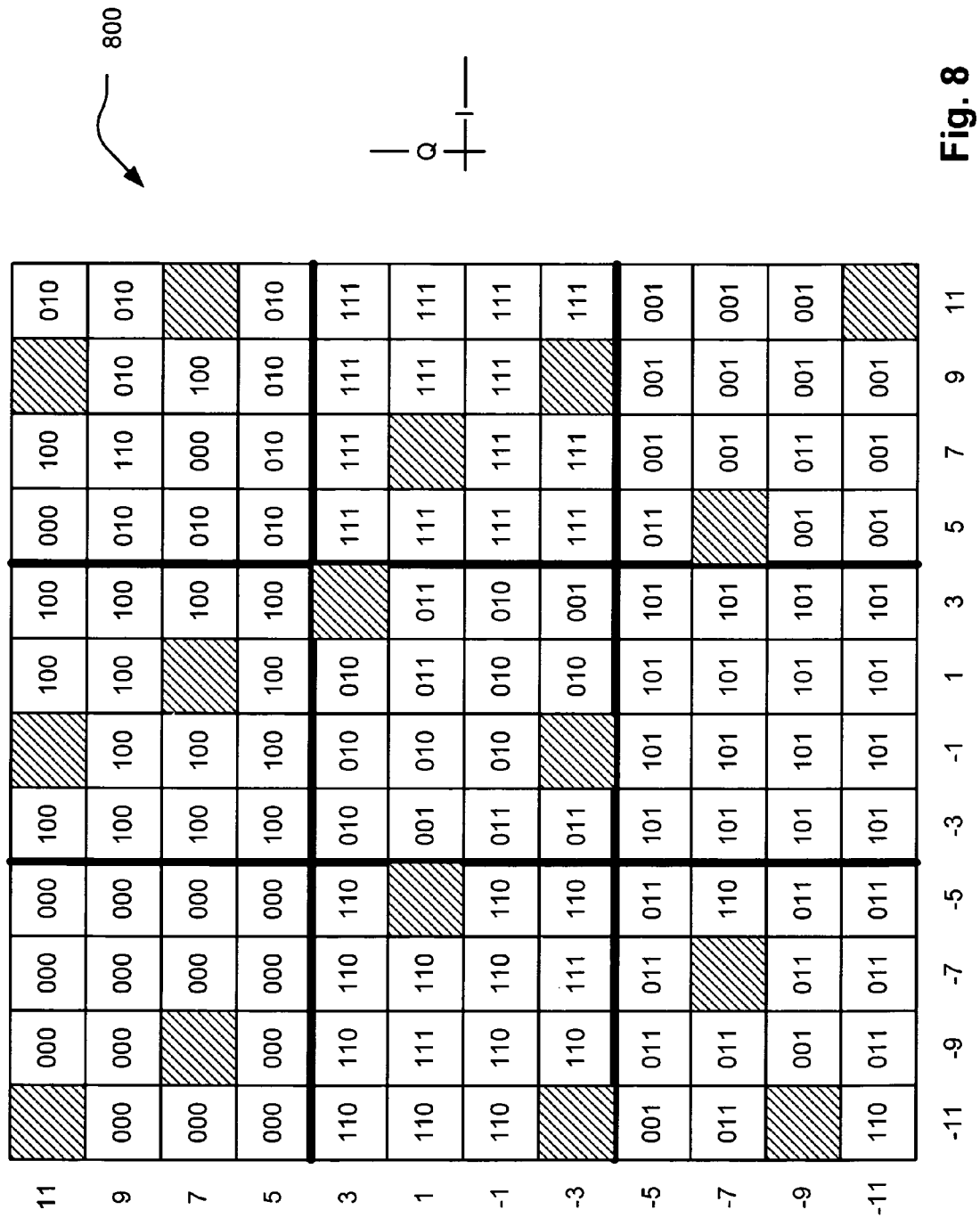
FIG. 8 is a diagram illustrating an embodiment of a substantially evenly distributed 128 2-D (128 2-Dimensional) constellation according to certain aspects of the invention.

FIG. 8 is a diagram illustrating an embodiment of a substantially evenly distributed 128 2-D (128 2-Dimensional) constellation 800 according to certain aspects of the invention. The inventors have developed a different modulation (constellation and mapping) whose constellation points are substantially evenly distributed when compared to the constellation points of the "doughnut" constellation described above. The constellation points of this modulation may be referred to as a substantially evenly distributed 128 2-D constellation.

The construction and placement of the constellation points of this substantially evenly distributed 128 2-D constellation is made in the following way.

1. Set-partitioning of the total 144 possible signals of a true 2-D 12-PAM to 9 regions with 16 constellation points within each of the 9 regions.

2. Delete 1 signal from every region so that the distribution of the deleted signals is as even as possible.

The mapping of these constellation points is based on the set-partition of the left 8 signals in every subset. With this new 2-D 128 constellation, the average power is provided as follows:

$$E_2 = 92.75 \quad (EQ\ 14)$$

Thus, when $\sigma_1 = \sigma_2$, then $$SNR_2 = \frac{92.75}{95.333} SNR_1,$$

i.e. in dB.

$$SNR_2 = SNR_1 - 0.1193 \text{ (dB)} \quad (EQ\ 15)$$

Because of this, the new "substantially evenly distributed 128 2-D constellation" outperforms the "doughnut" constellation described above. The following diagram depicting performance gives the comparison of the two constellations and the two LDPC codes described above.

This substantially evenly distributed 128 2-D constellation 800 may be viewed as being a constellation that is generated from a 2-D 12-PAM (2-Dimensional 12-Pulse Amplitude Modulation) constellation that includes all 144 possible constellation points. These 144 constellation points are then evenly partitioned into 9 regions such that each region includes 16 possible constellation points therein. Of these 9 regions, 8 of the 9 regions comprise 14 constellation points therein, and 1 of the 9 regions comprises all 16 possible constellation points therein. As can also be seen, the uncoded bit assignment is provided as shown in each of the remaining 128 constellation point locations. It can be seen that there are 16 corresponding constellation points for each 3 valued uncoded bit symbol. For example, the uncoded bits 000 have 16 corresponding constellation points; the uncoded bits 001 have 16 corresponding constellation points; and so on for all of the 8 possible 3 bit symbols composed of the uncoded bits. Each of these 3 uncoded bits indicate which subset, among 8 subsets each containing the corresponding 16 constellation points, to which the 4 coded bits correspond and are symbol mapped. As can be seen in this embodiment, for 7 of the 8 subsets, the 16 constellation points therein are distributed among at least 2 of the 9 regions. For 1 of the 8 subsets, all of the 16 possible constellation points are included within the same region (i.e., of the 9 possible regions that are generated by dividing up the 144 constellation points of the 2-D 12-PAM constellation.

Figure 9:
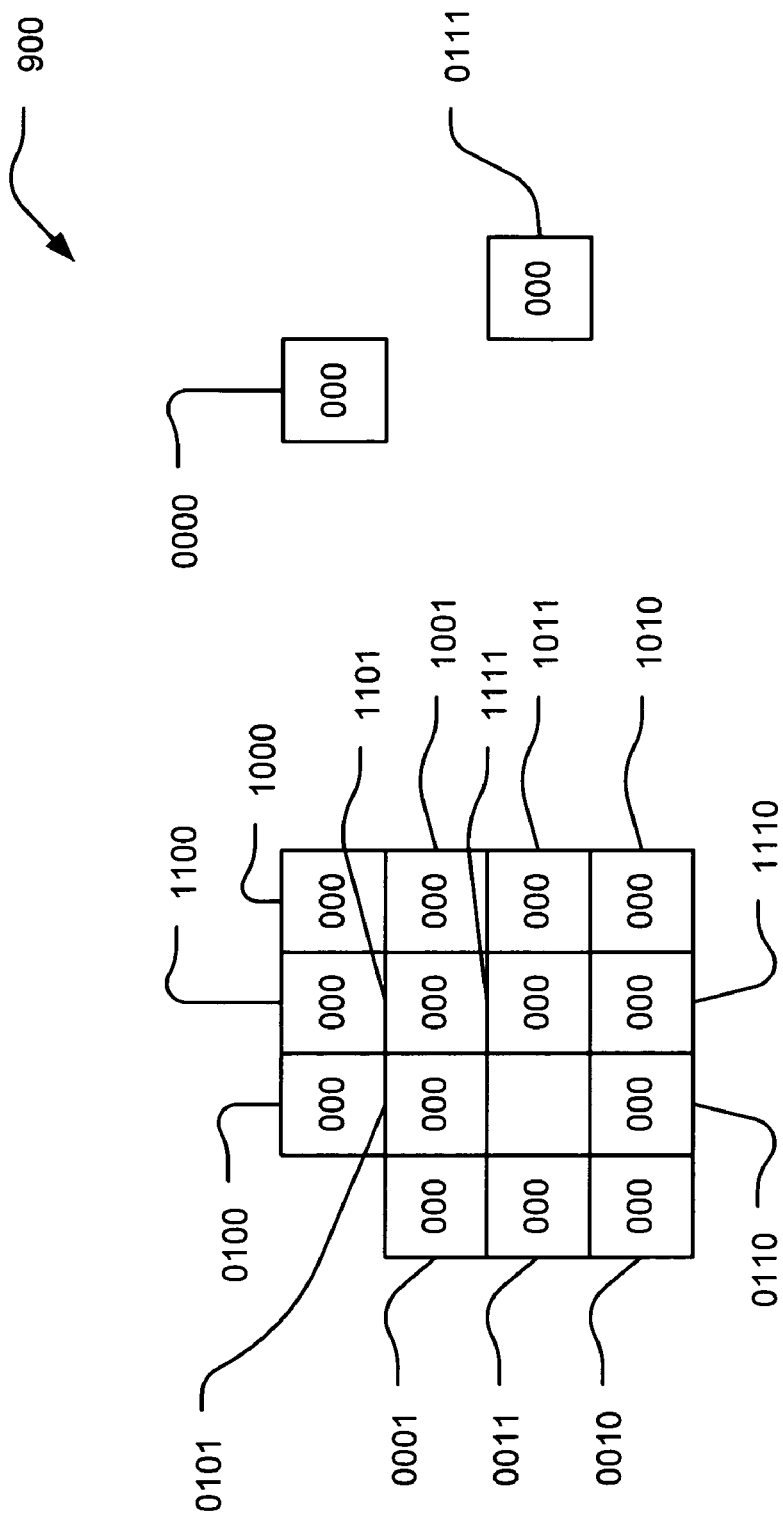
FIG. 9 is a diagram illustrating one possible embodiment of a Gray code mapping for the 16 constellation points associated with the uncoded bits 000 according to certain aspects of the invention.

FIG. 9 is a diagram illustrating one possible embodiment of a Gray code mapping 900 for the 16 constellation points associated with the uncoded bits 000 according to certain aspects of the invention. Generally speaking, a working definition of a "Gray code" is as follows:

Gray code: a binary sequence with the property that only one bit changes between any two consecutive elements (i.e., the two codes have a Hamming distance of one).

As mentioned above, some of the 16 constellation points corresponding to each of the 8 subsets may have different mappings may be deleted and distributed among other of the possible constellation point locations. As for the uncoded bits 000, two of the 16 constellation points of this subset are located outside of the region that includes the 16 possible constellation point locations. Specifically, the LDPC coded bits 0000 and 0111 correspond to constellation point locations outside of the region that includes the majority of the constellation points corresponding to the uncoded bits 000. The remaining 14 constellation points are all located within the same region. The 4 bit assignment of the other of the LDPC coded bits corresponding to the uncoded bits 000 are as depicted in the diagram.

Figure 10:
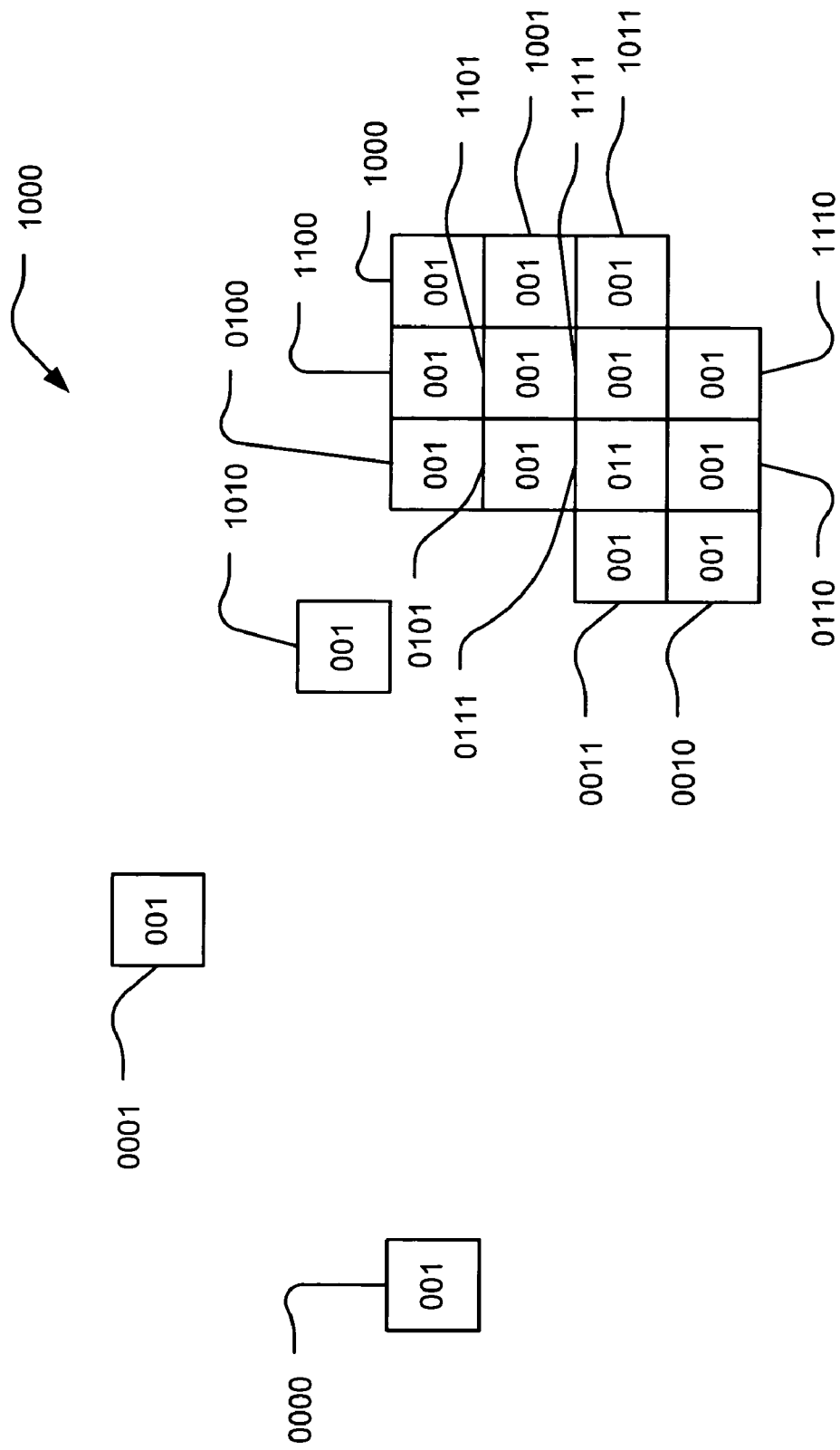
FIG. 10 is a diagram illustrating one possible embodiment of a Gray code mapping for the 16 constellation points associated with the uncoded bits 001 according to certain aspects of the invention.

FIG. 10 is a diagram illustrating one possible embodiment of a Gray code mapping 1000 for the 16 constellation points associated with the uncoded bits 001 according to certain aspects of the invention.

Again, some of the 16 constellation points corresponding to each of the 8 subsets may have different mappings may be deleted and distributed among other of the possible constellation point locations. As for the uncoded bits 001, three of the 16 constellation points of this subset are located outside of the region that includes the 16 possible constellation point locations. Specifically, the LDPC coded bits 0000, 0001, and 1010 correspond to constellation point locations outside of the region that includes the majority of the constellation points corresponding to the uncoded bits 001. The remaining 13 constellation points are all located within the same region. The 4 bit assignment of the other of the LDPC coded bits corresponding to the uncoded bits 001 are as depicted in the diagram.

It is noted that there are a wide variety of possible Gray code mappings that may be employed to map the 16 constellation points of each of the 16 constellation points within each of the 8 subsets of uncoded bits depicted herein. These diagrams shown within the FIG. 9 and the FIG. 10 are just one possible embodiment of Gray code mapping of the 16 constellation points within each of the 8 subsets corresponding to the uncoded bit groups. Clearly, there are other mappings (including non-Gray code mappings) that may alternatively be employed for each of the 16 constellation points. If desired, each of the groups of 16 constellation points corresponding to each of the 8 subsets may have a common mapping; alternatively, each (or some) of the groups of 16 constellation points corresponding to each of the 8 subsets may different mappings.

Figure 11:
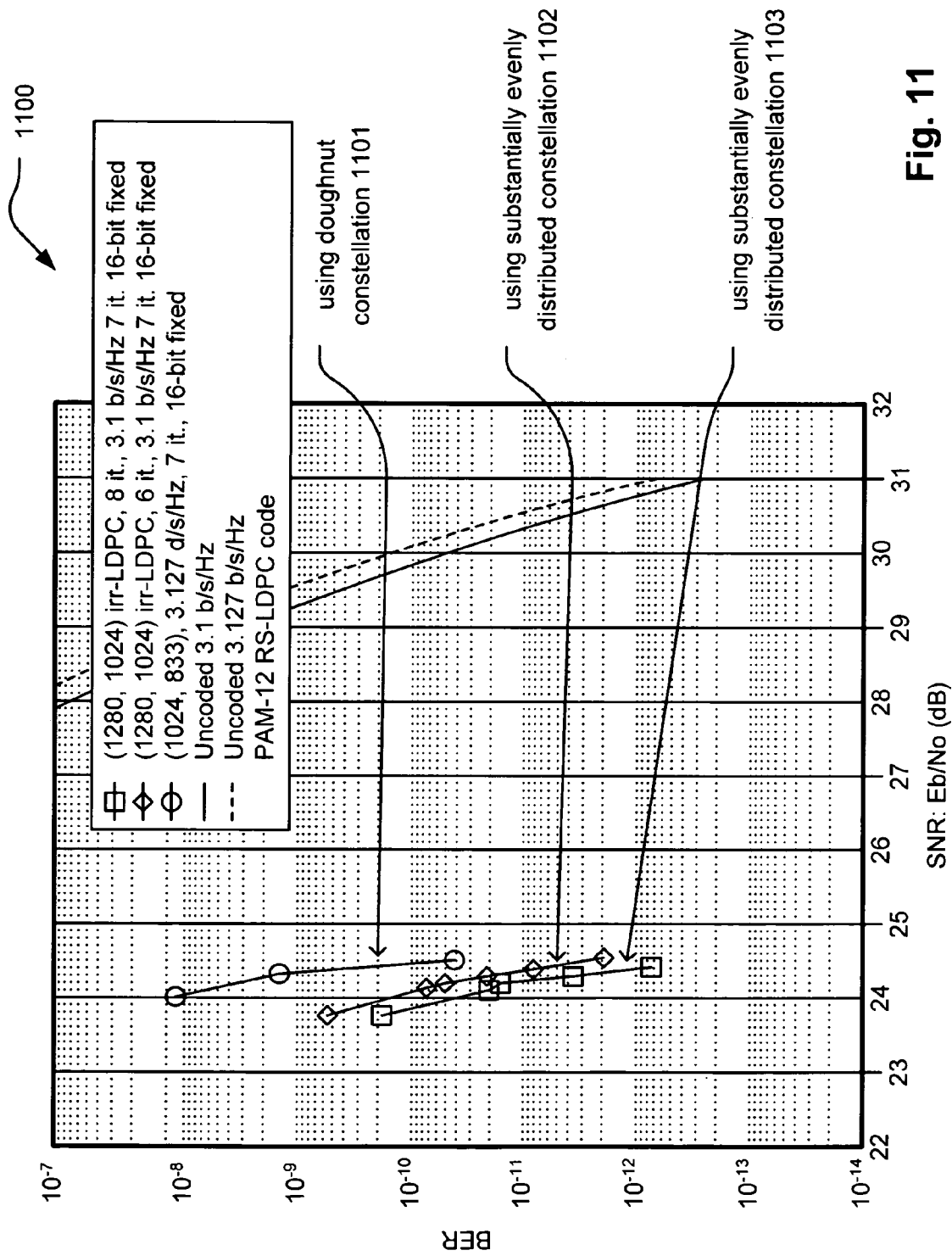
FIG. 11 is a diagram illustrating an embodiment of performance comparison of decoding of an LDPC coded signal employing the substantially evenly distributed 128 2-D constellation, implemented according to certain aspects of the invention, with decoding of an LDPC coded signal employing the doughnut 128 2-D 12-PAM constellation.

FIG. 11 is a diagram illustrating an embodiment of performance comparison 1100 of decoding of an LDPC coded signal employing the substantially evenly distributed 128 2-D constellation, implemented according to certain aspects of the invention, with decoding of an LDPC coded signal employing the doughnut 128 2-D 12-PAM constellation.

This performance comparison diagram is described in the context of BER (Bit Error Rate) versus $E_b/N_o$ (ratio of energy per bit $E_b$ to the Spectral Noise Density $N_o$). This term $E_b/N_o$ is the measure of SNR (Signal to Noise Ratio) for a digital communication system. When looking at these performance curves, the BER may be determined for any given $E_b/N_o$ (or SNR) thereby providing a relatively concise representation of the performance of the decoding approach.

As can be seen, LDPC coded signals (shown as using the substantially evenly distributed constellation 1102 (e.g., the substantially evenly distributed 128 2-D constellation) and using the substantially evenly distributed constellation 1103 (e.g., the substantially evenly distributed 128 2-D constellation)) that employ the new "substantially evenly distributed 128 2-D constellation" provide for a much lower BER than the "doughnut" constellation described above (shown as using the "doughnut" constellation 1101) when operating at the same $E_b/N_o$ (or SNR). As such, it can be seen that by selecting an appropriate generator matrix, G, and its corresponding parity check matrix, H, for use with the LDPC code, and by selecting an appropriate modulation (i.e., constellation and mapping), a significant improvement in performance may be achieved.

Figure 12:
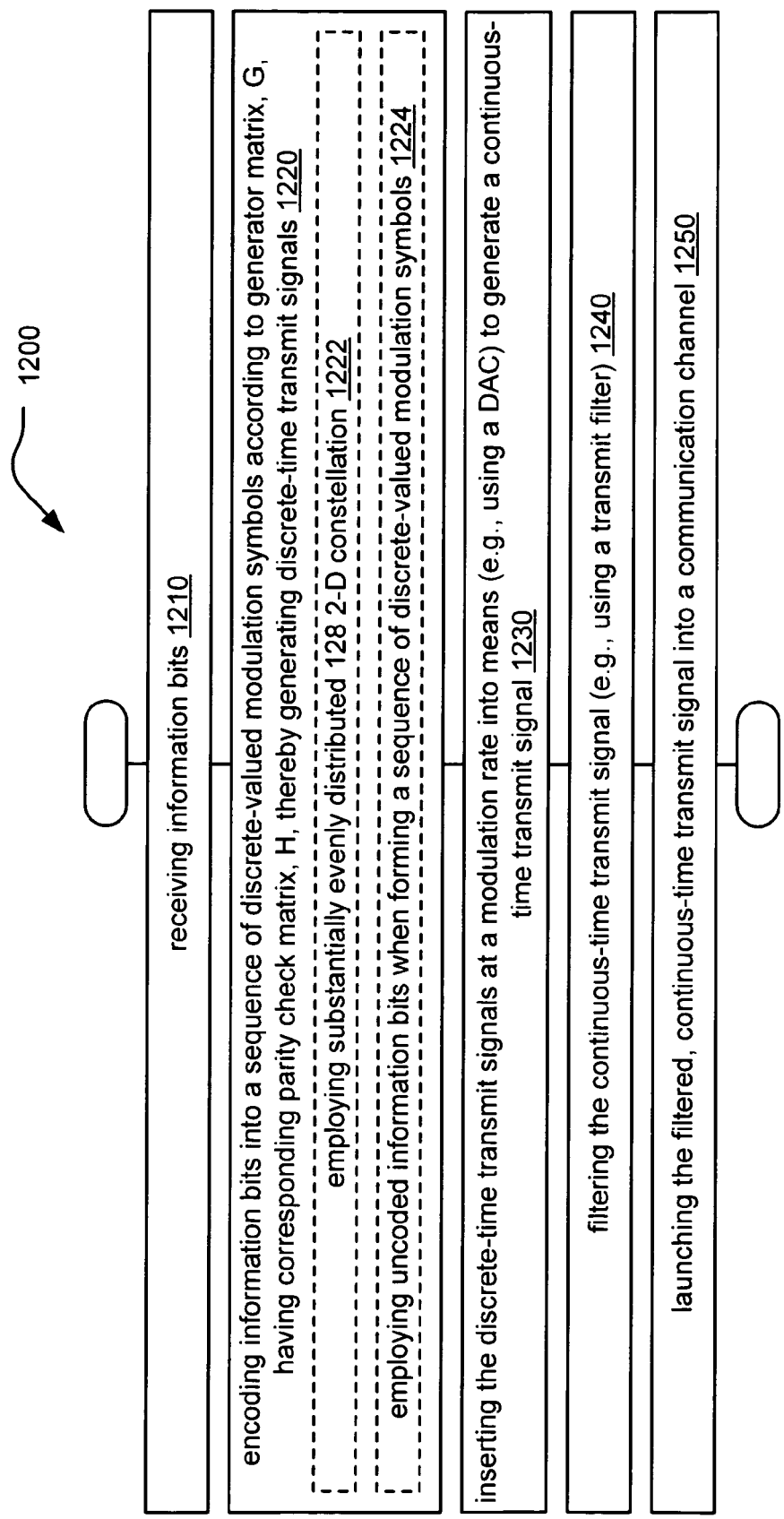
FIG. 12 is a flowchart illustrating an embodiment of a method for transmit processing of LDPC coded signals in accordance with certain aspects of the invention.

FIG. 12 is a flowchart illustrating an embodiment of a method for transmit processing of LDPC coded signals 1200 in accordance with certain aspects of the invention.

The method involves receiving 1 or more information bits, as shown in a block 1210. The method then involves encoding the 1 or more information bits into a sequence of discrete-valued modulation symbols according to an LDPC generator matrix, G, having a corresponding LDPC parity check matrix, H, thereby generating discrete-time transmit signals, as shown in a block 1220. This may be performed by employing the substantially evenly distributed 128 2-D constellation presented above, as shown in a block 1222. This may also involve employing 1 or more uncoded information bits when forming a sequence of discrete-valued modulation symbols, as shown in a block 1224.

The method then involves inserting the discrete-time transmit signals at a modulation rate into means (e.g., using a DAC) to generate a continuous-time transmit signal, as shown in a block 1230. The method then involves filtering the continuous-time transmit signal (e.g., using a transmit filter), as shown in a block 1240. The method then involves launching the filtered, continuous-time transmit signal into a communication channel, as shown in a block 1250.

Figure 13:
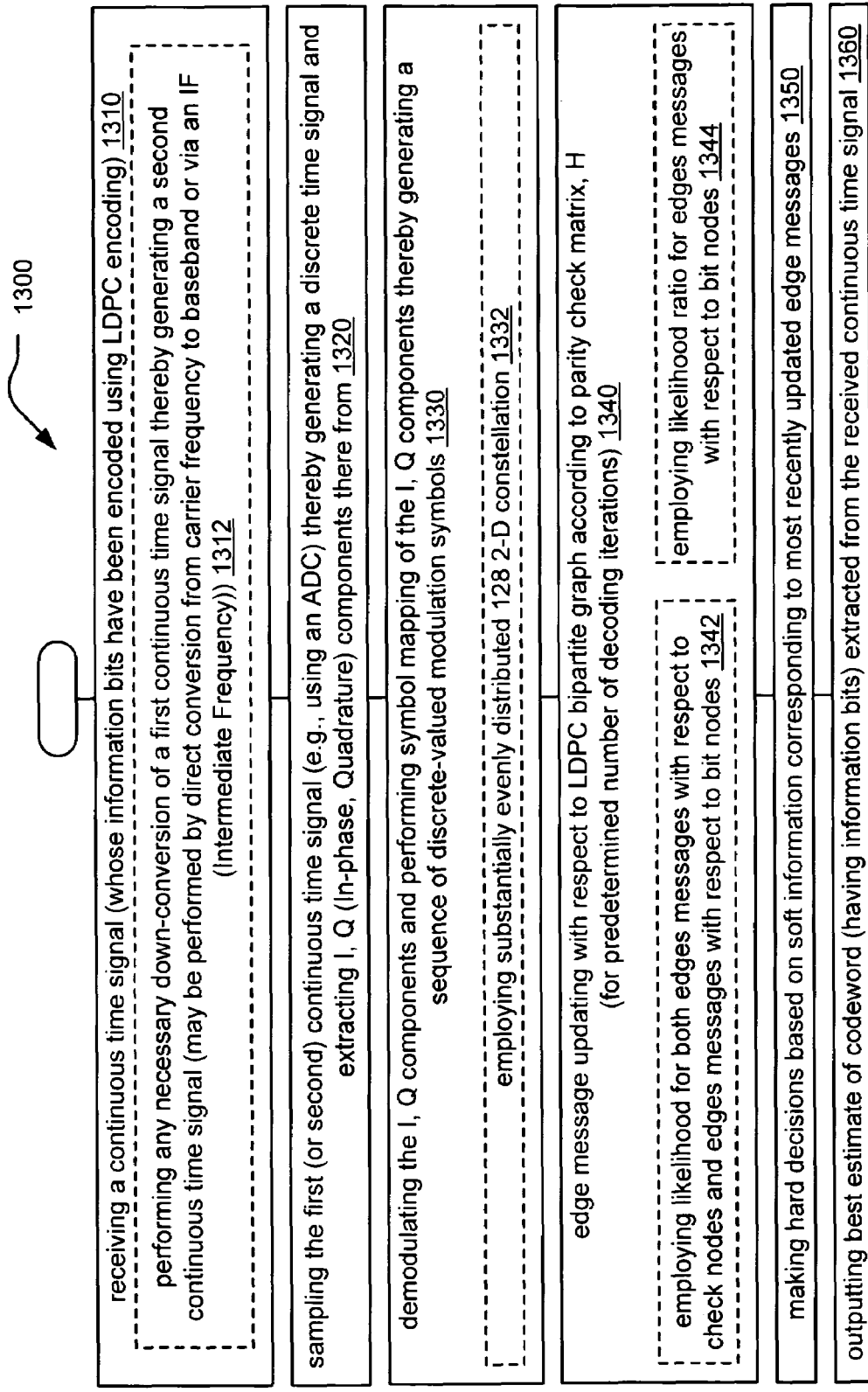
FIG. 13 and FIG. 14 are flowcharts illustrating embodiments of methods for receive processing of LDPC coded signals in accordance with certain aspects of the invention.
Figure 14:
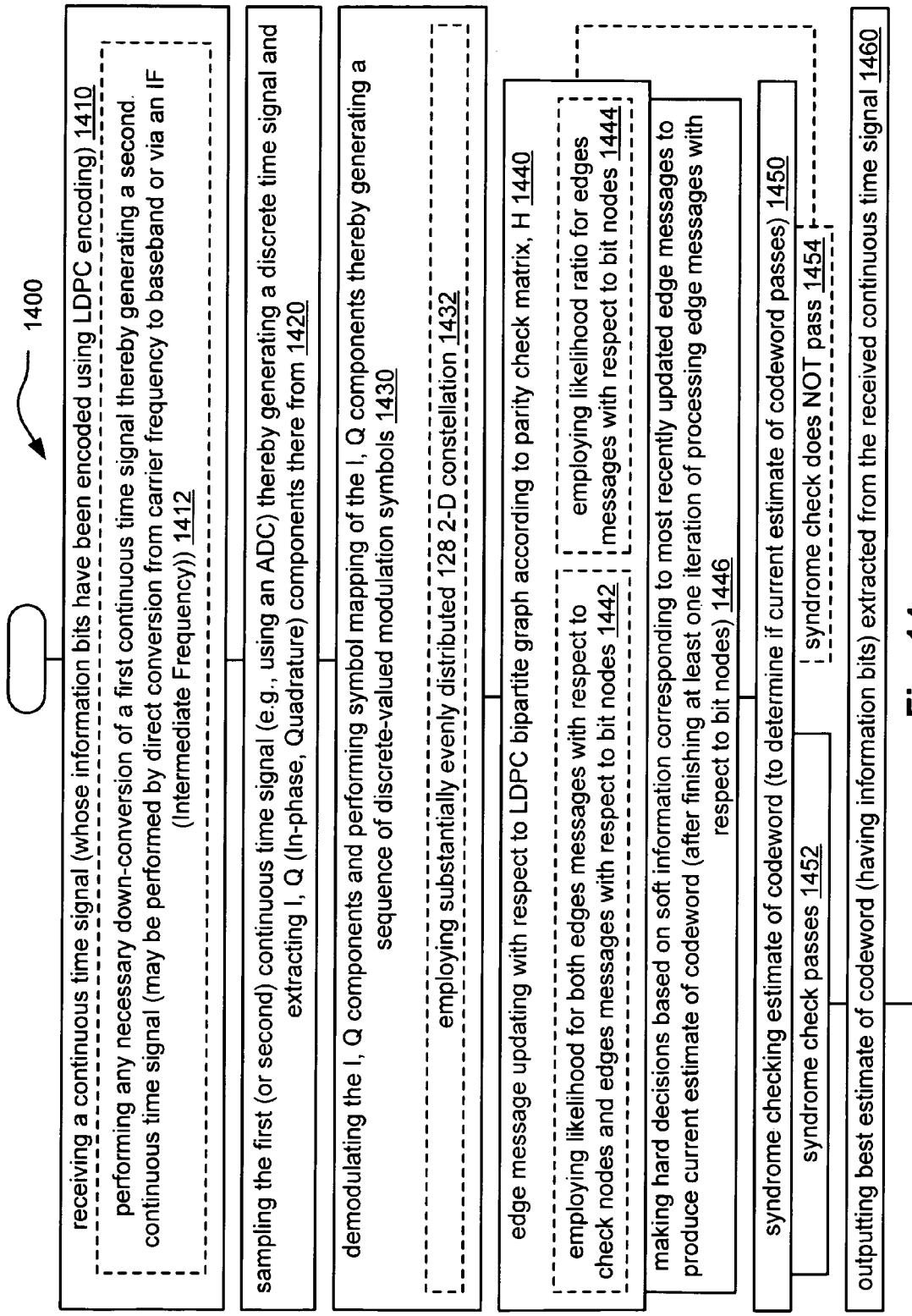

FIG. 13 and FIG. 14 are flowcharts illustrating embodiments of methods for receive processing of LDPC coded signals in accordance with certain aspects of the invention Referring to FIG. 13, the method 1300 involves receiving a continuous time signal, as shown in a block 1310. The information bits that have been encoded within this continuous time signal have been encoded using LDPC encoding in accordance with certain aspects of the invention. Upon the receiving of this continuous time signal, it is also noted that the method may involve performing any necessary down-conversion of a first continuous time signal (e.g., the originally received continuous time signal) thereby generating a second continuous time signal, as shown in a block 1312. This down conversion may be performed by direct conversion from carrier frequency to baseband, or it may alternatively be performed by passing through an IF (Intermediate Frequency) as well without departing from the scope and spirit of the invention. Moreover, this may also include performing any appropriate receive filtering as well.

The method then involves sampling the first (or second) continuous time signal (e.g., using an ADC) thereby generating a discrete time signal and extracting I, Q (In-phase, Quadrature) components there from, as shown in a block 1320. The method then also involves demodulating the I, Q components and performing symbol mapping of the I, Q components thereby generating a sequence of discrete-valued modulation symbols, as shown in a block 1330. In doing this, this may be performed by employing the substantially evenly distributed 128 2-D constellation presented above, as shown in a block 1332.

The method then involves performing edge message updating with respect to LDPC bipartite graph according to the parity check matrix, H, as shown in a block 1340. This is performed for predetermined number of decoding iterations within this particular embodiment. This updating may be performed a number of ways. For example, the method may involve employing likelihood for both edges messages with respect to check nodes and edges messages with respect to bit nodes, as shown in a block 1342. Alternatively, the method may involve employing likelihood ratio for edges messages with respect to bit nodes, as shown in a block 1344.

The method also involves making hard decisions based on soft information corresponding to the finally updated edge messages, as shown in a block 1350. Using these hard decisions, the method then involves outputting a best estimate of the transmitted codeword (having at least one information bit included therein) that is extracted from the received continuous time signal, as shown in a block 1360.

Referring to FIG. 14, initially, this particular method 1400 operates very similarly to the embodiment described above with respect to the FIG. 13. The method involves receiving a continuous time signal, as shown in a block 1410. The information bits that have been encoded within this continuous time signal have been encoded using LDPC encoding. Upon the receiving of this continuous time signal, it is also noted that the method may involve performing any necessary down-conversion of a first continuous time signal (e.g., the originally received continuous time signal) thereby generating a second continuous time signal, as shown in a block 1412. This down conversion may be performed by direct conversion from carrier frequency to baseband, or it may alternatively be performed by passing through an IF (Intermediate Frequency) as well without departing from the scope and spirit of the invention. Again, this may also include performing any appropriate receive filtering as well.

The method then involves sampling the first (or second) continuous time signal (e.g., using an ADC) thereby generating a discrete time signal and extracting I, Q (In-phase, Quadrature) components there from, as shown in a block 1420. The method then also involves demodulating the I, Q components and performing symbol mapping of the I, Q components thereby generating a sequence of discrete-valued modulation symbols, as shown in a block 1430. In doing this, this may be performed by employing the substantially evenly distributed 128 2-D constellation presented above, as shown in a block 1432.

The method then involves performing edge message updating with respect to LDPC bipartite graph according to parity check matrix, H, as shown in a block 1440. This updating may be performed a number of ways. For example, the method may involve employing likelihood for both edges messages with respect to check nodes and edges messages with respect to bit nodes, as shown in a block 1442. Alternatively, the method may involve employing likelihood ratio for edges messages with respect to bit nodes, as shown in a block 1444.

However, this method now departs from the operation of the method of the FIG. 13. In this particular embodiment, the method involves making hard decisions based on soft information corresponding to edge messages to produce a current estimate of the codeword, as shown in a block 1446. It is noted that this is performed after bit engine processing has finished at least one decoding iteration. After this current estimate of the codeword is made, then the method involves performing syndrome checking of the current estimate of the codeword, as shown in a block 1450. This is performed to determine if this current estimate of the codeword indeed passes the syndrome check. If the syndrome check does NOT pass, as shown in a block 1454, then the method involves returning to the edge message updating using only multiplication (or log domain addition) on both sides of LDPC bipartite graph. However, if it is found that the syndrome check does in fact pass, as shown in a block 1452, then the method involves outputting a best estimate of the transmitted codeword (having at least one information bit included therein) that is extracted from the received continuous time signal, as shown in a block 1460.

Various examples of possible parity check matrices, H, are provided in the Appendix A and Appendix B below that may be constructed in accordance with certain aspects of the invention.

It is also noted that the methods described within the preceding figures may also be performed within any of the appropriate system and/or apparatus designs (communication systems, communication transmitters, communication receivers, communication transceivers, and/or functionality described therein) that are described above without departing from the scope and spirit of the invention.

In view of the above detailed description of the invention and associated drawings, other modifications and variations will now become apparent. It should also be apparent that such other modifications and variations may be effected without departing from the spirit and scope of the invention.

Appendix Introduction

Several examples of various parity check matrices are provided in this Appendix.

These parity check matrices are provided and presented with respect to the matrices depicted above.

In the following tables depicting these parity check matrices, "b" stands for the bit node number, and "c" stands for the check node number in the context of an LDPC bipartite graph.

Appendix A

1. One possible embodiment of a parity check matrix of a (1280, 1024) LDPC code is presented below.

The following presents a another possible embodiment of a (1280,1024) LDPC code parity check matrix that is constructed in accordance with certain aspects of the invention. The parity check matrix is presented in the following format:

$$H=[H(7,1), H(7,2), H(3,1), H(3,3), H(3,4), H(3,5), H(3,6), H(d)]$$

TABLE 1

H(7, 1)

| b | c | c | c | c | c | c | c |
|---|---|---|---|---|---|---|---|
| 1 | 1 | 194 | 177 | 143 | 65 | 61 | 123 |
| 2 | 3 | 196 | 179 | 145 | 67 | 63 | 125 |
| 3 | 5 | 198 | 181 | 147 | 69 | 65 | 127 |
| 4 | 7 | 200 | 183 | 149 | 71 | 67 | 129 |
| 5 | 9 | 202 | 185 | 151 | 73 | 69 | 131 |
| 6 | 11 | 204 | 187 | 153 | 75 | 71 | 133 |
| 7 | 13 | 206 | 189 | 155 | 77 | 73 | 135 |
| 8 | 15 | 208 | 191 | 157 | 79 | 75 | 137 |
| 9 | 17 | 210 | 193 | 159 | 81 | 77 | 139 |
| 10 | 19 | 212 | 195 | 161 | 83 | 79 | 141 |
| 11 | 21 | 214 | 197 | 163 | 85 | 81 | 143 |
| 12 | 23 | 216 | 199 | 165 | 87 | 83 | 145 |
| 13 | 25 | 218 | 201 | 167 | 89 | 85 | 147 |
| 14 | 27 | 220 | 203 | 169 | 91 | 87 | 149 |
| 15 | 29 | 222 | 205 | 171 | 93 | 89 | 151 |
| 16 | 31 | 224 | 207 | 173 | 95 | 91 | 153 |
| 17 | 33 | 226 | 209 | 175 | 97 | 93 | 155 |
| 18 | 35 | 228 | 211 | 177 | 99 | 95 | 157 |
| 19 | 37 | 230 | 213 | 179 | 101 | 97 | 159 |
| 20 | 39 | 232 | 215 | 181 | 103 | 99 | 161 |
| 21 | 41 | 234 | 217 | 183 | 105 | 101 | 163 |
| 22 | 43 | 236 | 219 | 185 | 107 | 103 | 165 |
| 23 | 45 | 238 | 221 | 187 | 109 | 105 | 167 |
| 24 | 47 | 240 | 223 | 189 | 111 | 107 | 169 |
| 25 | 49 | 242 | 225 | 191 | 113 | 109 | 171 |
| 26 | 51 | 244 | 227 | 193 | 115 | 111 | 173 |
| 27 | 53 | 246 | 229 | 195 | 117 | 113 | 175 |
| 28 | 55 | 248 | 231 | 197 | 119 | 115 | 177 |
| 29 | 57 | 250 | 233 | 199 | 121 | 117 | 179 |
| 30 | 59 | 252 | 235 | 201 | 123 | 119 | 181 |
| 31 | 61 | 254 | 237 | 203 | 125 | 121 | 183 |
| 32 | 63 | 256 | 239 | 205 | 127 | 123 | 185 |
| 33 | 65 | 2 | 241 | 207 | 129 | 125 | 187 |
| 34 | 67 | 4 | 243 | 209 | 131 | 127 | 189 |
| 35 | 69 | 6 | 245 | 211 | 133 | 129 | 191 |
| 36 | 71 | 8 | 247 | 213 | 135 | 131 | 193 |
| 37 | 73 | 10 | 249 | 215 | 137 | 133 | 195 |
| 38 | 75 | 12 | 251 | 217 | 139 | 135 | 197 |
| 39 | 77 | 14 | 253 | 219 | 141 | 137 | 199 |
| 40 | 79 | 16 | 255 | 221 | 143 | 139 | 201 |
| 41 | 81 | 18 | 1 | 223 | 145 | 141 | 203 |
| 42 | 83 | 20 | 3 | 225 | 147 | 143 | 205 |
| 43 | 85 | 22 | 5 | 227 | 149 | 145 | 207 |
| 44 | 87 | 24 | 7 | 229 | 151 | 147 | 209 |
| 45 | 89 | 26 | 9 | 231 | 153 | 149 | 211 |
| 46 | 91 | 28 | 11 | 233 | 155 | 151 | 213 |
| 47 | 93 | 30 | 13 | 235 | 157 | 153 | 215 |
| 48 | 95 | 32 | 15 | 237 | 159 | 155 | 217 |
| 49 | 97 | 34 | 17 | 239 | 161 | 157 | 219 |
| 50 | 99 | 36 | 19 | 241 | 163 | 159 | 221 |
| 51 | 101 | 38 | 21 | 243 | 165 | 161 | 223 |
| 52 | 103 | 40 | 23 | 245 | 167 | 163 | 225 |
| 53 | 105 | 42 | 25 | 247 | 169 | 165 | 227 |
| 54 | 107 | 44 | 27 | 249 | 171 | 167 | 229 |
| 55 | 109 | 46 | 29 | 251 | 173 | 169 | 231 |
| 56 | 111 | 48 | 31 | 253 | 175 | 171 | 233 |
| 57 | 113 | 50 | 33 | 255 | 177 | 173 | 235 |

TABLE 1-continued

H(7, 1)

| b | c | c | c | c | c | c | c |
|---|---|---|---|---|---|---|---|
| 58 | 115 | 52 | 35 | 1 | 179 | 175 | 237 |
| 59 | 117 | 54 | 37 | 3 | 181 | 177 | 239 |
| 60 | 119 | 56 | 39 | 5 | 183 | 179 | 241 |
| 61 | 121 | 58 | 41 | 7 | 185 | 181 | 243 |
| 62 | 123 | 60 | 43 | 9 | 187 | 183 | 245 |
| 63 | 125 | 62 | 45 | 11 | 189 | 185 | 247 |
| 64 | 127 | 64 | 47 | 13 | 191 | 187 | 249 |
| 65 | 129 | 66 | 49 | 15 | 193 | 189 | 251 |
| 66 | 131 | 68 | 51 | 17 | 195 | 191 | 253 |
| 67 | 133 | 70 | 53 | 19 | 197 | 193 | 255 |
| 68 | 135 | 72 | 55 | 21 | 199 | 195 | 1 |
| 69 | 137 | 74 | 57 | 23 | 201 | 197 | 3 |
| 70 | 139 | 76 | 59 | 25 | 203 | 199 | 5 |
| 71 | 141 | 78 | 61 | 27 | 205 | 201 | 7 |
| 72 | 143 | 80 | 63 | 29 | 207 | 203 | 9 |
| 73 | 145 | 82 | 65 | 31 | 209 | 205 | 11 |
| 74 | 147 | 84 | 67 | 33 | 211 | 207 | 13 |
| 75 | 149 | 86 | 69 | 35 | 213 | 209 | 15 |
| 76 | 151 | 88 | 71 | 37 | 215 | 211 | 17 |
| 77 | 153 | 90 | 73 | 39 | 217 | 213 | 19 |
| 78 | 155 | 92 | 75 | 41 | 219 | 215 | 21 |
| 79 | 157 | 94 | 77 | 43 | 221 | 217 | 23 |
| 80 | 159 | 96 | 79 | 45 | 223 | 219 | 25 |
| 81 | 161 | 98 | 81 | 47 | 225 | 221 | 27 |
| 82 | 163 | 100 | 83 | 49 | 227 | 223 | 29 |
| 83 | 165 | 102 | 85 | 51 | 229 | 225 | 31 |
| 84 | 167 | 104 | 87 | 53 | 231 | 227 | 33 |
| 85 | 169 | 106 | 89 | 55 | 233 | 229 | 35 |
| 86 | 171 | 108 | 91 | 57 | 235 | 231 | 37 |
| 87 | 173 | 110 | 93 | 59 | 237 | 233 | 39 |
| 88 | 175 | 112 | 95 | 61 | 239 | 235 | 41 |
| 89 | 177 | 114 | 97 | 63 | 241 | 237 | 43 |
| 90 | 179 | 116 | 99 | 65 | 243 | 239 | 45 |
| 91 | 181 | 118 | 101 | 67 | 245 | 241 | 47 |
| 92 | 183 | 120 | 103 | 69 | 247 | 243 | 49 |
| 93 | 185 | 122 | 105 | 71 | 249 | 245 | 51 |
| 94 | 187 | 124 | 107 | 73 | 251 | 247 | 53 |
| 95 | 189 | 126 | 109 | 75 | 253 | 249 | 55 |
| 96 | 191 | 128 | 111 | 77 | 255 | 251 | 57 |
| 97 | 193 | 130 | 113 | 79 | 1 | 253 | 59 |
| 98 | 195 | 132 | 115 | 81 | 3 | 255 | 61 |
| 99 | 197 | 134 | 117 | 83 | 5 | 1 | 63 |
| 100 | 199 | 136 | 119 | 85 | 7 | 3 | 65 |
| 101 | 201 | 138 | 121 | 87 | 9 | 5 | 67 |
| 102 | 203 | 140 | 123 | 89 | 11 | 7 | 69 |
| 103 | 205 | 142 | 125 | 91 | 13 | 9 | 71 |
| 104 | 207 | 144 | 127 | 93 | 15 | 11 | 73 |
| 105 | 209 | 146 | 129 | 95 | 17 | 13 | 75 |
| 106 | 211 | 148 | 131 | 97 | 19 | 15 | 77 |
| 107 | 213 | 150 | 133 | 99 | 21 | 17 | 79 |
| 108 | 215 | 152 | 135 | 101 | 23 | 19 | 81 |
| 109 | 217 | 154 | 137 | 103 | 25 | 21 | 83 |
| 110 | 219 | 156 | 139 | 105 | 27 | 23 | 85 |
| 111 | 221 | 158 | 141 | 107 | 29 | 25 | 87 |
| 112 | 223 | 160 | 143 | 109 | 31 | 27 | 89 |
| 113 | 225 | 162 | 145 | 111 | 33 | 29 | 91 |
| 114 | 227 | 164 | 147 | 113 | 35 | 31 | 93 |
| 115 | 229 | 166 | 149 | 115 | 37 | 33 | 95 |
| 116 | 231 | 168 | 151 | 117 | 39 | 35 | 97 |
| 117 | 233 | 170 | 153 | 119 | 41 | 37 | 99 |
| 118 | 235 | 172 | 155 | 121 | 43 | 39 | 101 |
| 119 | 237 | 174 | 157 | 123 | 45 | 41 | 103 |
| 120 | 239 | 176 | 159 | 125 | 47 | 43 | 105 |
| 121 | 241 | 178 | 161 | 127 | 49 | 45 | 107 |
| 122 | 243 | 180 | 163 | 129 | 51 | 47 | 109 |
| 123 | 245 | 182 | 165 | 131 | 53 | 49 | 111 |
| 124 | 247 | 184 | 167 | 133 | 55 | 51 | 113 |
| 125 | 249 | 186 | 169 | 135 | 57 | 53 | 115 |
| 126 | 251 | 188 | 171 | 137 | 59 | 55 | 117 |
| 127 | 253 | 190 | 173 | 139 | 61 | 57 | 119 |
| 128 | 255 | 192 | 175 | 141 | 63 | 59 | 121 |

TABLE 2

H(7, 2)

| b | c | c | c | c | c | c | c |
|---|---|---|---|---|---|---|---|
| 129 | 2 | 253 | 142 | 250 | 124 | 90 | 202 |
| 130 | 4 | 255 | 144 | 252 | 126 | 92 | 204 |
| 131 | 6 | 1 | 146 | 254 | 128 | 94 | 206 |
| 132 | 8 | 3 | 148 | 256 | 130 | 96 | 208 |
| 133 | 10 | 5 | 150 | 2 | 132 | 98 | 210 |
| 134 | 12 | 7 | 152 | 4 | 134 | 100 | 212 |
| 135 | 14 | 9 | 154 | 6 | 136 | 102 | 214 |
| 136 | 16 | 11 | 156 | 8 | 138 | 104 | 216 |
| 137 | 18 | 13 | 158 | 10 | 140 | 106 | 218 |
| 138 | 20 | 15 | 160 | 12 | 142 | 108 | 220 |
| 139 | 22 | 17 | 162 | 14 | 144 | 110 | 222 |
| 140 | 24 | 19 | 164 | 16 | 146 | 112 | 224 |
| 141 | 26 | 21 | 166 | 18 | 148 | 114 | 226 |
| 142 | 28 | 23 | 168 | 20 | 150 | 116 | 228 |
| 143 | 30 | 25 | 170 | 22 | 152 | 118 | 230 |
| 144 | 32 | 27 | 172 | 24 | 154 | 120 | 232 |
| 145 | 34 | 29 | 174 | 26 | 156 | 122 | 234 |
| 146 | 36 | 31 | 176 | 28 | 158 | 124 | 236 |
| 147 | 38 | 33 | 178 | 30 | 160 | 126 | 238 |
| 148 | 40 | 35 | 180 | 32 | 162 | 128 | 240 |
| 149 | 42 | 37 | 182 | 34 | 164 | 130 | 242 |
| 150 | 44 | 39 | 184 | 36 | 166 | 132 | 244 |
| 151 | 46 | 41 | 186 | 38 | 168 | 134 | 246 |
| 152 | 48 | 43 | 188 | 40 | 170 | 136 | 248 |
| 153 | 50 | 45 | 190 | 42 | 172 | 138 | 250 |
| 154 | 52 | 47 | 192 | 44 | 174 | 140 | 252 |
| 155 | 54 | 49 | 194 | 46 | 176 | 142 | 254 |
| 156 | 56 | 51 | 196 | 48 | 178 | 144 | 256 |
| 157 | 58 | 53 | 198 | 50 | 180 | 146 | 2 |
| 158 | 60 | 55 | 200 | 52 | 182 | 148 | 4 |
| 159 | 62 | 57 | 202 | 54 | 184 | 150 | 6 |
| 160 | 64 | 59 | 204 | 56 | 186 | 152 | 8 |
| 161 | 66 | 61 | 206 | 58 | 188 | 154 | 10 |
| 162 | 68 | 63 | 208 | 60 | 190 | 156 | 12 |
| 163 | 70 | 65 | 210 | 62 | 192 | 158 | 14 |
| 164 | 72 | 67 | 212 | 64 | 194 | 160 | 16 |
| 165 | 74 | 69 | 214 | 66 | 196 | 162 | 18 |
| 166 | 76 | 71 | 216 | 68 | 198 | 164 | 20 |
| 167 | 78 | 73 | 218 | 70 | 200 | 166 | 22 |
| 168 | 80 | 75 | 220 | 72 | 202 | 168 | 24 |
| 169 | 82 | 77 | 222 | 74 | 204 | 170 | 26 |
| 170 | 84 | 79 | 224 | 76 | 206 | 172 | 28 |
| 171 | 86 | 81 | 226 | 78 | 208 | 174 | 30 |
| 172 | 88 | 83 | 228 | 80 | 210 | 176 | 32 |
| 173 | 90 | 85 | 230 | 82 | 212 | 178 | 34 |
| 174 | 92 | 87 | 232 | 84 | 214 | 180 | 36 |
| 175 | 94 | 89 | 234 | 86 | 216 | 182 | 38 |
| 176 | 96 | 91 | 236 | 88 | 218 | 184 | 40 |
| 177 | 98 | 93 | 238 | 90 | 220 | 186 | 42 |
| 178 | 100 | 95 | 240 | 92 | 222 | 188 | 44 |
| 179 | 102 | 97 | 242 | 94 | 224 | 190 | 46 |
| 180 | 104 | 99 | 244 | 96 | 226 | 192 | 48 |
| 181 | 106 | 101 | 246 | 98 | 228 | 194 | 50 |
| 182 | 108 | 103 | 248 | 100 | 230 | 196 | 52 |
| 183 | 110 | 105 | 250 | 102 | 232 | 198 | 54 |
| 184 | 112 | 107 | 252 | 104 | 234 | 200 | 56 |
| 185 | 114 | 109 | 254 | 106 | 236 | 202 | 58 |
| 186 | 116 | 111 | 256 | 108 | 238 | 204 | 60 |
| 187 | 118 | 113 | 2 | 110 | 240 | 206 | 62 |
| 188 | 120 | 115 | 4 | 112 | 242 | 208 | 64 |
| 189 | 122 | 117 | 6 | 114 | 244 | 210 | 66 |
| 190 | 124 | 119 | 8 | 116 | 246 | 212 | 68 |
| 191 | 126 | 121 | 10 | 118 | 248 | 214 | 70 |
| 192 | 128 | 123 | 12 | 120 | 250 | 216 | 72 |
| 193 | 130 | 125 | 14 | 122 | 252 | 218 | 74 |
| 194 | 132 | 127 | 16 | 124 | 254 | 220 | 76 |
| 195 | 134 | 129 | 18 | 126 | 256 | 222 | 78 |
| 196 | 136 | 131 | 20 | 128 | 2 | 224 | 80 |
| 197 | 138 | 133 | 22 | 130 | 4 | 226 | 82 |
| 198 | 140 | 135 | 24 | 132 | 6 | 228 | 84 |
| 199 | 142 | 137 | 26 | 134 | 8 | 230 | 86 |
| 200 | 144 | 139 | 28 | 136 | 10 | 232 | 88 |
| 201 | 146 | 141 | 30 | 138 | 12 | 234 | 90 |
| 202 | 148 | 143 | 32 | 140 | 14 | 236 | 92 |
| 203 | 150 | 145 | 34 | 142 | 16 | 238 | 94 |
| 204 | 152 | 147 | 36 | 144 | 18 | 240 | 96 |
| 205 | 154 | 149 | 38 | 146 | 20 | 242 | 98 |
| 206 | 156 | 151 | 40 | 148 | 22 | 244 | 100 |
| 207 | 158 | 153 | 42 | 150 | 24 | 246 | 102 |
| 208 | 160 | 155 | 44 | 152 | 26 | 248 | 104 |
| 209 | 162 | 157 | 46 | 154 | 28 | 250 | 106 |
| 210 | 164 | 159 | 48 | 156 | 30 | 252 | 108 |
| 211 | 166 | 161 | 50 | 158 | 32 | 254 | 110 |
| 212 | 168 | 163 | 52 | 160 | 34 | 256 | 112 |
| 213 | 170 | 165 | 54 | 162 | 36 | 2 | 114 |
| 214 | 172 | 167 | 56 | 164 | 38 | 4 | 116 |
| 215 | 174 | 169 | 58 | 166 | 40 | 6 | 118 |
| 216 | 176 | 171 | 60 | 168 | 42 | 8 | 120 |
| 217 | 178 | 173 | 62 | 170 | 44 | 10 | 122 |
| 218 | 180 | 175 | 64 | 172 | 46 | 12 | 124 |
| 219 | 182 | 177 | 66 | 174 | 48 | 14 | 126 |
| 220 | 184 | 179 | 68 | 176 | 50 | 16 | 128 |
| 221 | 186 | 181 | 70 | 178 | 52 | 18 | 130 |
| 222 | 188 | 183 | 72 | 180 | 54 | 20 | 132 |
| 223 | 190 | 185 | 74 | 182 | 56 | 22 | 134 |
| 224 | 192 | 187 | 76 | 184 | 58 | 24 | 136 |
| 225 | 194 | 189 | 78 | 186 | 60 | 26 | 138 |
| 226 | 196 | 191 | 80 | 188 | 62 | 28 | 140 |
| 227 | 198 | 193 | 82 | 190 | 64 | 30 | 142 |
| 228 | 200 | 195 | 84 | 192 | 66 | 32 | 144 |
| 229 | 202 | 197 | 86 | 194 | 68 | 34 | 146 |
| 230 | 204 | 199 | 88 | 196 | 70 | 36 | 148 |
| 231 | 206 | 201 | 90 | 198 | 72 | 38 | 150 |
| 232 | 208 | 203 | 92 | 200 | 74 | 40 | 152 |
| 233 | 210 | 205 | 94 | 202 | 76 | 42 | 154 |
| 234 | 212 | 207 | 96 | 204 | 78 | 44 | 156 |
| 235 | 214 | 209 | 98 | 206 | 80 | 46 | 158 |
| 236 | 216 | 211 | 100 | 208 | 82 | 48 | 160 |
| 237 | 218 | 213 | 102 | 210 | 84 | 50 | 162 |
| 238 | 220 | 215 | 104 | 212 | 86 | 52 | 164 |
| 239 | 222 | 217 | 106 | 214 | 88 | 54 | 166 |
| 240 | 224 | 219 | 108 | 216 | 90 | 56 | 168 |
| 241 | 226 | 221 | 110 | 218 | 92 | 58 | 170 |
| 242 | 228 | 223 | 112 | 220 | 94 | 60 | 172 |
| 243 | 230 | 225 | 114 | 222 | 96 | 62 | 174 |
| 244 | 232 | 227 | 116 | 224 | 98 | 64 | 176 |
| 245 | 234 | 229 | 118 | 226 | 100 | 66 | 178 |
| 246 | 236 | 231 | 120 | 228 | 102 | 68 | 180 |
| 247 | 238 | 233 | 122 | 230 | 104 | 70 | 182 |
| 248 | 240 | 235 | 124 | 232 | 106 | 72 | 184 |
| 249 | 242 | 237 | 126 | 234 | 108 | 74 | 186 |
| 250 | 244 | 239 | 128 | 236 | 110 | 76 | 188 |
| 251 | 246 | 241 | 130 | 238 | 112 | 78 | 190 |
| 252 | 248 | 243 | 132 | 240 | 114 | 80 | 192 |
| 253 | 250 | 245 | 134 | 242 | 116 | 82 | 194 |
| 254 | 252 | 247 | 136 | 244 | 118 | 84 | 196 |
| 255 | 254 | 249 | 138 | 246 | 120 | 86 | 198 |
| 256 | 256 | 251 | 140 | 248 | 122 | 88 | 200 |

TABLE 3

H(3, 1)

| b | c | c | c |
|---|---|---|---|
| 257 | 1 | 96 | 245 |
| 258 | 3 | 98 | 247 |
| 259 | 5 | 100 | 249 |
| 260 | 7 | 102 | 251 |
| 261 | 9 | 104 | 253 |
| 262 | 11 | 106 | 255 |
| 263 | 13 | 108 | 1 |
| 264 | 15 | 110 | 3 |
| 265 | 17 | 112 | 5 |
| 266 | 19 | 114 | 7 |
| 267 | 21 | 116 | 9 |
| 268 | 23 | 118 | 11 |

TABLE 3-continued

H(3, 1)

| b | c | c | c |
|---|---|---|---|
| 269 | 25 | 120 | 13 |
| 270 | 27 | 122 | 15 |
| 271 | 29 | 124 | 17 |
| 272 | 31 | 126 | 19 |
| 273 | 33 | 128 | 21 |
| 274 | 35 | 130 | 23 |
| 275 | 37 | 132 | 25 |
| 276 | 39 | 134 | 27 |
| 277 | 41 | 136 | 29 |
| 278 | 43 | 138 | 31 |
| 279 | 45 | 140 | 33 |
| 280 | 47 | 142 | 35 |
| 281 | 49 | 144 | 37 |
| 282 | 51 | 146 | 39 |
| 283 | 53 | 148 | 41 |
| 284 | 55 | 150 | 43 |
| 285 | 57 | 152 | 45 |
| 286 | 59 | 154 | 47 |
| 287 | 61 | 156 | 49 |
| 288 | 63 | 158 | 51 |
| 289 | 65 | 160 | 53 |
| 290 | 67 | 162 | 55 |
| 291 | 69 | 164 | 57 |
| 292 | 71 | 166 | 59 |
| 293 | 73 | 168 | 61 |
| 294 | 75 | 170 | 63 |
| 295 | 77 | 172 | 65 |
| 296 | 79 | 174 | 67 |
| 297 | 81 | 176 | 69 |
| 298 | 83 | 178 | 71 |
| 299 | 85 | 180 | 73 |
| 300 | 87 | 182 | 75 |
| 301 | 89 | 184 | 77 |
| 302 | 91 | 186 | 79 |
| 303 | 93 | 188 | 81 |
| 304 | 95 | 190 | 83 |
| 305 | 97 | 192 | 85 |
| 306 | 99 | 194 | 87 |
| 307 | 101 | 196 | 89 |
| 308 | 103 | 198 | 91 |
| 309 | 105 | 200 | 93 |
| 310 | 107 | 202 | 95 |
| 311 | 109 | 204 | 97 |
| 312 | 111 | 206 | 99 |
| 313 | 113 | 208 | 101 |
| 314 | 115 | 210 | 103 |
| 315 | 117 | 212 | 105 |
| 316 | 119 | 214 | 107 |
| 317 | 121 | 216 | 109 |
| 318 | 123 | 218 | 111 |
| 319 | 125 | 220 | 113 |
| 320 | 127 | 222 | 115 |
| 321 | 129 | 224 | 117 |
| 322 | 131 | 226 | 119 |
| 323 | 133 | 228 | 121 |
| 324 | 135 | 230 | 123 |
| 325 | 137 | 232 | 125 |
| 326 | 139 | 234 | 127 |
| 327 | 141 | 236 | 129 |
| 328 | 143 | 238 | 131 |
| 329 | 145 | 240 | 133 |
| 330 | 147 | 242 | 135 |
| 331 | 149 | 244 | 137 |
| 332 | 151 | 246 | 139 |
| 333 | 153 | 248 | 141 |
| 334 | 155 | 250 | 143 |
| 335 | 157 | 252 | 145 |
| 336 | 159 | 254 | 147 |
| 337 | 161 | 256 | 149 |
| 338 | 163 | 2 | 151 |
| 339 | 165 | 4 | 153 |
| 340 | 167 | 6 | 155 |
| 341 | 169 | 8 | 157 |
| 342 | 171 | 10 | 159 |
| 343 | 173 | 12 | 161 |
| 344 | 175 | 14 | 163 |
| 345 | 177 | 16 | 165 |
| 346 | 179 | 18 | 167 |
| 347 | 181 | 20 | 169 |
| 348 | 183 | 22 | 171 |
| 349 | 185 | 24 | 173 |
| 350 | 187 | 26 | 175 |
| 351 | 189 | 28 | 177 |
| 352 | 191 | 30 | 179 |
| 353 | 193 | 32 | 181 |
| 354 | 195 | 34 | 183 |
| 355 | 197 | 36 | 185 |
| 356 | 199 | 38 | 187 |
| 357 | 201 | 40 | 189 |
| 358 | 203 | 42 | 191 |
| 359 | 205 | 44 | 193 |
| 360 | 207 | 46 | 195 |
| 361 | 209 | 48 | 197 |
| 362 | 211 | 50 | 199 |
| 363 | 213 | 52 | 201 |
| 364 | 215 | 54 | 203 |
| 365 | 217 | 56 | 205 |
| 366 | 219 | 58 | 207 |
| 367 | 221 | 60 | 209 |
| 368 | 223 | 62 | 211 |
| 369 | 225 | 64 | 213 |
| 370 | 227 | 66 | 215 |
| 371 | 229 | 68 | 217 |
| 372 | 231 | 70 | 219 |
| 373 | 233 | 72 | 221 |
| 374 | 235 | 74 | 223 |
| 375 | 237 | 76 | 225 |
| 376 | 239 | 78 | 227 |
| 377 | 241 | 80 | 229 |
| 378 | 243 | 82 | 231 |
| 379 | 245 | 84 | 233 |
| 380 | 247 | 86 | 235 |
| 381 | 249 | 88 | 237 |
| 382 | 251 | 90 | 239 |
| 383 | 253 | 92 | 241 |
| 384 | 255 | 94 | 243 |

TABLE 4

H(3, 2)

| b | c | c | c |
|---|---|---|---|
| 385 | 2 | 157 | 192 |
| 386 | 4 | 159 | 194 |
| 387 | 6 | 161 | 196 |
| 388 | 8 | 163 | 198 |
| 389 | 10 | 165 | 200 |
| 390 | 12 | 167 | 202 |
| 391 | 14 | 169 | 204 |
| 392 | 16 | 171 | 206 |
| 393 | 18 | 173 | 208 |
| 394 | 20 | 175 | 210 |
| 395 | 22 | 177 | 212 |
| 396 | 24 | 179 | 214 |
| 397 | 26 | 181 | 216 |
| 398 | 28 | 183 | 218 |
| 399 | 30 | 185 | 220 |
| 400 | 32 | 187 | 222 |
| 401 | 34 | 189 | 224 |
| 402 | 36 | 191 | 226 |
| 403 | 38 | 193 | 228 |
| 404 | 40 | 195 | 230 |
| 405 | 42 | 197 | 232 |
| 406 | 44 | 199 | 234 |
| 407 | 46 | 201 | 236 |
| 408 | 48 | 203 | 238 |

TABLE 4-continued

H(3, 2)

| b | c | c | c |
|---|---|---|---|
| 409 | 50 | 205 | 240 |
| 410 | 52 | 207 | 242 |
| 411 | 54 | 209 | 244 |
| 412 | 56 | 211 | 246 |
| 413 | 58 | 213 | 248 |
| 414 | 60 | 215 | 250 |
| 415 | 62 | 217 | 252 |
| 416 | 64 | 219 | 254 |
| 417 | 66 | 221 | 256 |
| 418 | 68 | 223 | 2 |
| 419 | 70 | 225 | 4 |
| 420 | 72 | 227 | 6 |
| 421 | 74 | 229 | 8 |
| 422 | 76 | 231 | 10 |
| 423 | 78 | 233 | 12 |
| 424 | 80 | 235 | 14 |
| 425 | 82 | 237 | 16 |
| 426 | 84 | 239 | 18 |
| 427 | 86 | 241 | 20 |
| 428 | 88 | 243 | 22 |
| 429 | 90 | 245 | 24 |
| 430 | 92 | 247 | 26 |
| 431 | 94 | 249 | 28 |
| 432 | 96 | 251 | 30 |
| 433 | 98 | 223 | 32 |
| 434 | 100 | 225 | 34 |
| 435 | 102 | 1 | 36 |
| 436 | 104 | 3 | 38 |
| 437 | 106 | 5 | 40 |
| 438 | 108 | 7 | 42 |
| 439 | 110 | 9 | 44 |
| 440 | 112 | 11 | 46 |
| 441 | 114 | 13 | 48 |
| 442 | 116 | 15 | 50 |
| 443 | 118 | 17 | 52 |
| 444 | 120 | 19 | 54 |
| 445 | 122 | 21 | 56 |
| 446 | 124 | 23 | 58 |
| 447 | 126 | 25 | 60 |
| 448 | 128 | 27 | 62 |
| 449 | 130 | 29 | 64 |
| 450 | 132 | 31 | 66 |
| 451 | 134 | 33 | 68 |
| 452 | 136 | 35 | 70 |
| 453 | 138 | 37 | 72 |
| 454 | 140 | 39 | 74 |
| 455 | 142 | 41 | 76 |
| 456 | 144 | 43 | 78 |
| 457 | 146 | 45 | 80 |
| 458 | 148 | 47 | 82 |
| 459 | 150 | 49 | 84 |
| 460 | 152 | 51 | 86 |
| 461 | 154 | 53 | 88 |
| 462 | 156 | 55 | 90 |
| 463 | 158 | 57 | 92 |
| 464 | 160 | 59 | 94 |
| 465 | 162 | 61 | 96 |
| 466 | 164 | 63 | 98 |
| 467 | 166 | 65 | 100 |
| 468 | 168 | 67 | 102 |
| 469 | 170 | 69 | 104 |
| 470 | 172 | 71 | 106 |
| 471 | 174 | 73 | 108 |
| 472 | 176 | 75 | 110 |
| 473 | 178 | 77 | 112 |
| 474 | 180 | 79 | 114 |
| 475 | 182 | 81 | 116 |
| 476 | 184 | 83 | 118 |
| 477 | 186 | 85 | 120 |
| 478 | 188 | 87 | 122 |
| 479 | 190 | 89 | 124 |
| 480 | 192 | 91 | 126 |
| 481 | 194 | 93 | 128 |
| 482 | 196 | 95 | 130 |
| 483 | 198 | 97 | 132 |
| 484 | 200 | 99 | 134 |
| 485 | 202 | 101 | 136 |
| 486 | 204 | 103 | 138 |
| 487 | 206 | 105 | 140 |
| 488 | 208 | 107 | 142 |
| 489 | 210 | 109 | 144 |
| 490 | 212 | 111 | 146 |
| 491 | 214 | 113 | 148 |
| 492 | 216 | 115 | 150 |
| 493 | 218 | 117 | 152 |
| 494 | 220 | 119 | 154 |
| 495 | 222 | 121 | 156 |
| 496 | 224 | 123 | 158 |
| 497 | 226 | 125 | 160 |
| 498 | 228 | 127 | 162 |
| 499 | 230 | 129 | 164 |
| 500 | 232 | 131 | 166 |
| 501 | 234 | 133 | 168 |
| 502 | 236 | 135 | 170 |
| 503 | 238 | 137 | 172 |
| 504 | 240 | 139 | 174 |
| 505 | 242 | 141 | 176 |
| 506 | 244 | 143 | 178 |
| 507 | 246 | 145 | 180 |
| 508 | 248 | 147 | 182 |
| 509 | 250 | 149 | 184 |
| 510 | 252 | 151 | 186 |
| 511 | 254 | 153 | 188 |
| 512 | 256 | 155 | 190 |

TABLE 5

H(3, 3)

| b | c | c | c |
|---|---|---|---|
| 513 | 1 | 178 | 19 |
| 514 | 3 | 180 | 21 |
| 515 | 5 | 182 | 23 |
| 516 | 7 | 184 | 25 |
| 517 | 9 | 186 | 27 |
| 518 | 11 | 188 | 29 |
| 519 | 13 | 190 | 31 |
| 520 | 15 | 192 | 33 |
| 521 | 17 | 194 | 35 |
| 522 | 19 | 196 | 37 |
| 523 | 21 | 198 | 39 |
| 524 | 23 | 200 | 41 |
| 525 | 25 | 202 | 43 |
| 526 | 27 | 204 | 45 |
| 527 | 29 | 206 | 47 |
| 528 | 31 | 208 | 49 |
| 529 | 33 | 210 | 51 |
| 530 | 35 | 212 | 53 |
| 531 | 37 | 214 | 55 |
| 532 | 39 | 216 | 57 |
| 533 | 41 | 218 | 59 |
| 534 | 43 | 220 | 61 |
| 535 | 45 | 222 | 63 |
| 536 | 47 | 224 | 65 |
| 537 | 49 | 226 | 67 |
| 538 | 51 | 228 | 69 |
| 539 | 53 | 230 | 71 |
| 540 | 55 | 232 | 73 |
| 541 | 57 | 234 | 75 |
| 542 | 59 | 236 | 77 |
| 543 | 61 | 238 | 79 |
| 544 | 63 | 240 | 81 |
| 545 | 65 | 242 | 83 |
| 546 | 67 | 244 | 85 |
| 547 | 69 | 246 | 87 |
| 548 | 71 | 248 | 89 |

TABLE 5-continued

H(3, 3)

| b | c | c | c |
|---|---|---|---|
| 549 | 73 | 250 | 91 |
| 550 | 75 | 252 | 93 |
| 551 | 77 | 254 | 95 |
| 552 | 79 | 256 | 97 |
| 553 | 81 | 2 | 99 |
| 554 | 83 | 4 | 101 |
| 555 | 85 | 6 | 103 |
| 556 | 87 | 8 | 105 |
| 557 | 89 | 10 | 107 |
| 558 | 91 | 12 | 109 |
| 559 | 93 | 14 | 111 |
| 560 | 95 | 16 | 113 |
| 561 | 97 | 18 | 115 |
| 562 | 99 | 20 | 117 |
| 563 | 101 | 22 | 119 |
| 564 | 103 | 24 | 121 |
| 565 | 105 | 26 | 123 |
| 566 | 107 | 28 | 125 |
| 567 | 109 | 30 | 127 |
| 568 | 111 | 32 | 129 |
| 569 | 113 | 34 | 131 |
| 570 | 115 | 36 | 133 |
| 571 | 117 | 38 | 135 |
| 572 | 119 | 40 | 137 |
| 573 | 121 | 42 | 139 |
| 574 | 123 | 44 | 141 |
| 575 | 125 | 46 | 143 |
| 576 | 127 | 48 | 145 |
| 577 | 129 | 50 | 147 |
| 578 | 131 | 52 | 149 |
| 579 | 133 | 54 | 151 |
| 580 | 135 | 56 | 153 |
| 581 | 137 | 58 | 155 |
| 582 | 139 | 60 | 157 |
| 583 | 141 | 62 | 159 |
| 584 | 143 | 64 | 161 |
| 585 | 145 | 66 | 163 |
| 586 | 147 | 68 | 165 |
| 587 | 149 | 70 | 167 |
| 588 | 151 | 72 | 169 |
| 589 | 153 | 74 | 171 |
| 590 | 155 | 76 | 173 |
| 591 | 157 | 78 | 175 |
| 592 | 159 | 80 | 177 |
| 593 | 161 | 82 | 179 |
| 594 | 163 | 84 | 181 |
| 595 | 165 | 86 | 183 |
| 596 | 167 | 88 | 185 |
| 597 | 169 | 90 | 187 |
| 598 | 171 | 92 | 189 |
| 599 | 173 | 94 | 191 |
| 600 | 175 | 96 | 193 |
| 601 | 177 | 98 | 195 |
| 602 | 179 | 100 | 197 |
| 603 | 181 | 102 | 199 |
| 604 | 183 | 104 | 201 |
| 605 | 185 | 106 | 203 |
| 606 | 187 | 108 | 205 |
| 607 | 189 | 110 | 207 |
| 608 | 191 | 112 | 209 |
| 609 | 193 | 114 | 211 |
| 610 | 195 | 116 | 213 |
| 611 | 197 | 118 | 215 |
| 612 | 199 | 120 | 217 |
| 613 | 201 | 122 | 219 |
| 614 | 203 | 124 | 221 |
| 615 | 205 | 126 | 223 |
| 616 | 207 | 128 | 225 |
| 617 | 209 | 130 | 227 |
| 618 | 211 | 132 | 229 |
| 619 | 213 | 134 | 231 |
| 620 | 215 | 136 | 233 |
| 621 | 217 | 138 | 235 |
| 622 | 219 | 140 | 237 |
| 623 | 221 | 142 | 239 |
| 624 | 223 | 144 | 241 |
| 625 | 225 | 146 | 243 |
| 626 | 227 | 148 | 245 |
| 627 | 229 | 150 | 247 |
| 628 | 231 | 152 | 249 |
| 629 | 233 | 154 | 251 |
| 630 | 235 | 156 | 253 |
| 631 | 237 | 158 | 255 |
| 632 | 239 | 160 | 1 |
| 633 | 241 | 162 | 3 |
| 634 | 243 | 164 | 5 |
| 635 | 245 | 166 | 7 |
| 636 | 247 | 168 | 9 |
| 637 | 249 | 170 | 11 |
| 638 | 251 | 172 | 13 |
| 639 | 253 | 174 | 15 |
| 640 | 255 | 176 | 17 |
| 641 | 2 | 237 | 12 |
| 642 | 4 | 239 | 14 |
| 643 | 6 | 241 | 16 |
| 644 | 8 | 243 | 18 |
| 645 | 10 | 245 | 20 |
| 646 | 12 | 247 | 22 |
| 647 | 14 | 249 | 24 |
| 648 | 16 | 251 | 26 |
| 649 | 18 | 253 | 28 |
| 650 | 20 | 255 | 30 |
| 651 | 22 | 1 | 32 |
| 652 | 24 | 3 | 34 |
| 653 | 26 | 5 | 36 |
| 654 | 28 | 7 | 38 |
| 655 | 30 | 9 | 40 |
| 656 | 32 | 11 | 42 |
| 657 | 34 | 13 | 44 |
| 658 | 36 | 15 | 46 |
| 659 | 38 | 17 | 48 |
| 660 | 40 | 19 | 50 |
| 661 | 42 | 21 | 52 |
| 662 | 44 | 23 | 54 |
| 663 | 46 | 25 | 56 |
| 664 | 48 | 27 | 58 |
| 665 | 50 | 29 | 60 |
| 666 | 52 | 31 | 62 |
| 667 | 54 | 33 | 64 |
| 668 | 56 | 35 | 66 |
| 669 | 58 | 37 | 68 |
| 670 | 60 | 39 | 70 |
| 671 | 62 | 41 | 72 |
| 672 | 64 | 43 | 74 |
| 673 | 66 | 45 | 76 |
| 674 | 68 | 47 | 78 |
| 675 | 70 | 49 | 80 |
| 676 | 72 | 51 | 82 |
| 677 | 74 | 53 | 84 |
| 678 | 76 | 55 | 86 |
| 679 | 78 | 57 | 88 |
| 680 | 80 | 59 | 90 |
| 681 | 82 | 61 | 92 |
| 682 | 84 | 63 | 94 |
| 683 | 86 | 65 | 96 |
| 684 | 88 | 67 | 98 |
| 685 | 90 | 69 | 100 |
| 686 | 92 | 71 | 102 |
| 687 | 94 | 73 | 104 |
| 688 | 96 | 75 | 106 |
| 689 | 98 | 77 | 108 |
| 690 | 100 | 79 | 110 |
| 691 | 102 | 81 | 112 |
| 692 | 104 | 83 | 114 |
| 693 | 106 | 85 | 116 |
| 694 | 108 | 87 | 118 |
| 695 | 110 | 89 | 120 |
| 696 | 112 | 91 | 122 |
| 697 | 114 | 93 | 124 |
| 698 | 116 | 95 | 126 |

TABLE 5-continued

H(3, 3)

| b | c | c | c |
|---|---|---|---|
| 699 | 118 | 97 | 128 |
| 700 | 120 | 99 | 130 |
| 701 | 122 | 101 | 132 |
| 702 | 124 | 103 | 134 |
| 703 | 126 | 105 | 136 |
| 704 | 128 | 107 | 138 |
| 705 | 130 | 109 | 140 |
| 706 | 132 | 111 | 142 |
| 707 | 134 | 113 | 144 |
| 708 | 136 | 115 | 146 |
| 709 | 138 | 117 | 148 |
| 710 | 140 | 119 | 150 |
| 711 | 142 | 121 | 152 |
| 712 | 144 | 123 | 154 |
| 713 | 146 | 125 | 156 |
| 714 | 148 | 127 | 158 |
| 715 | 150 | 129 | 160 |
| 716 | 152 | 131 | 162 |
| 717 | 154 | 133 | 164 |
| 718 | 156 | 135 | 166 |
| 719 | 158 | 137 | 168 |
| 720 | 160 | 139 | 170 |
| 721 | 162 | 141 | 172 |
| 722 | 164 | 143 | 174 |
| 723 | 166 | 145 | 176 |
| 724 | 168 | 147 | 178 |
| 725 | 170 | 149 | 180 |
| 726 | 172 | 151 | 182 |
| 727 | 174 | 153 | 184 |
| 728 | 176 | 155 | 186 |
| 729 | 178 | 157 | 188 |
| 730 | 180 | 159 | 190 |
| 731 | 182 | 161 | 192 |
| 732 | 184 | 163 | 194 |
| 733 | 186 | 165 | 196 |
| 734 | 188 | 167 | 198 |
| 735 | 190 | 169 | 200 |
| 736 | 192 | 171 | 202 |
| 737 | 194 | 173 | 204 |
| 738 | 196 | 175 | 206 |
| 739 | 198 | 177 | 208 |
| 740 | 200 | 179 | 210 |
| 741 | 202 | 181 | 212 |
| 742 | 204 | 183 | 214 |
| 743 | 206 | 185 | 216 |
| 744 | 208 | 187 | 218 |
| 745 | 210 | 189 | 220 |
| 746 | 212 | 191 | 222 |
| 747 | 214 | 193 | 224 |
| 748 | 216 | 195 | 226 |
| 749 | 218 | 197 | 228 |
| 750 | 220 | 199 | 230 |
| 751 | 222 | 201 | 232 |
| 752 | 224 | 203 | 234 |
| 753 | 226 | 205 | 236 |
| 754 | 228 | 207 | 238 |
| 755 | 230 | 209 | 240 |
| 756 | 232 | 211 | 242 |
| 757 | 234 | 213 | 244 |
| 758 | 236 | 215 | 246 |
| 759 | 238 | 217 | 248 |
| 760 | 240 | 219 | 250 |
| 761 | 242 | 221 | 252 |
| 762 | 244 | 223 | 254 |
| 763 | 246 | 225 | 256 |
| 764 | 248 | 227 | 2 |
| 765 | 250 | 229 | 4 |
| 766 | 252 | 231 | 6 |
| 767 | 254 | 233 | 8 |
| 768 | 256 | 235 | 10 |

TABLE 7

H(3, 5)

| b | c | c | c |
|---|---|---|---|
| 769 | 1 | 64 | 110 |
| 770 | 3 | 66 | 112 |
| 771 | 5 | 68 | 114 |
| 772 | 7 | 70 | 116 |
| 773 | 9 | 72 | 118 |
| 774 | 11 | 74 | 120 |
| 775 | 13 | 76 | 122 |
| 776 | 15 | 78 | 124 |
| 777 | 17 | 80 | 126 |
| 778 | 19 | 82 | 128 |
| 779 | 21 | 84 | 130 |
| 780 | 23 | 86 | 132 |
| 781 | 25 | 88 | 134 |
| 782 | 27 | 90 | 136 |
| 783 | 29 | 92 | 138 |
| 784 | 31 | 94 | 140 |
| 785 | 33 | 96 | 142 |
| 786 | 35 | 98 | 144 |
| 787 | 37 | 100 | 146 |
| 788 | 39 | 102 | 148 |
| 789 | 41 | 104 | 150 |
| 790 | 43 | 106 | 152 |
| 791 | 45 | 108 | 154 |
| 792 | 47 | 110 | 156 |
| 793 | 49 | 112 | 158 |
| 794 | 51 | 114 | 160 |
| 795 | 53 | 116 | 162 |
| 796 | 55 | 118 | 164 |
| 797 | 57 | 120 | 166 |
| 798 | 59 | 122 | 168 |
| 799 | 61 | 124 | 170 |
| 800 | 63 | 126 | 172 |
| 801 | 65 | 128 | 174 |
| 802 | 67 | 130 | 176 |
| 803 | 69 | 132 | 178 |
| 804 | 71 | 134 | 180 |
| 805 | 73 | 136 | 182 |
| 806 | 75 | 138 | 184 |
| 807 | 77 | 140 | 186 |
| 808 | 79 | 142 | 188 |
| 809 | 81 | 144 | 190 |
| 810 | 83 | 146 | 192 |
| 811 | 85 | 148 | 194 |
| 812 | 87 | 150 | 196 |
| 813 | 89 | 152 | 198 |
| 814 | 91 | 154 | 200 |
| 815 | 93 | 156 | 202 |
| 816 | 95 | 158 | 204 |
| 817 | 97 | 160 | 206 |
| 818 | 99 | 162 | 208 |
| 819 | 101 | 164 | 210 |
| 820 | 103 | 166 | 212 |
| 821 | 105 | 168 | 214 |
| 822 | 107 | 170 | 216 |
| 823 | 109 | 172 | 218 |
| 824 | 111 | 174 | 220 |
| 825 | 113 | 176 | 222 |
| 826 | 115 | 178 | 224 |
| 827 | 117 | 180 | 226 |
| 828 | 119 | 182 | 228 |
| 829 | 121 | 184 | 230 |
| 830 | 123 | 186 | 232 |
| 831 | 125 | 188 | 234 |
| 832 | 127 | 190 | 236 |
| 833 | 129 | 192 | 238 |
| 834 | 131 | 194 | 240 |
| 835 | 133 | 196 | 242 |
| 836 | 135 | 198 | 244 |
| 837 | 137 | 200 | 246 |
| 838 | 139 | 202 | 248 |
| 839 | 141 | 204 | 250 |
| 840 | 143 | 206 | 252 |
| 841 | 145 | 208 | 254 |
| 842 | 147 | 210 | 256 |
| 843 | 149 | 212 | 2 |

TABLE 7-continued

H(3, 5)

| b | c | c | c |
|---|---|---|---|
| 844 | 151 | 214 | 4 |
| 845 | 153 | 216 | 6 |
| 846 | 155 | 218 | 8 |
| 847 | 157 | 220 | 10 |
| 848 | 159 | 222 | 12 |
| 849 | 161 | 224 | 14 |
| 850 | 163 | 226 | 16 |
| 851 | 165 | 228 | 18 |
| 852 | 167 | 230 | 20 |
| 853 | 169 | 232 | 22 |
| 854 | 171 | 234 | 24 |
| 855 | 173 | 236 | 26 |
| 856 | 175 | 238 | 28 |
| 857 | 177 | 240 | 30 |
| 858 | 179 | 242 | 32 |
| 859 | 181 | 244 | 34 |
| 860 | 183 | 246 | 36 |
| 861 | 185 | 248 | 38 |
| 862 | 187 | 250 | 40 |
| 863 | 189 | 252 | 42 |
| 864 | 191 | 254 | 44 |
| 865 | 193 | 256 | 46 |
| 866 | 195 | 2 | 48 |
| 867 | 197 | 4 | 50 |
| 868 | 199 | 6 | 52 |
| 869 | 201 | 8 | 54 |
| 870 | 203 | 10 | 56 |
| 871 | 205 | 12 | 58 |
| 872 | 207 | 14 | 60 |
| 873 | 209 | 16 | 62 |
| 874 | 211 | 18 | 64 |
| 875 | 213 | 20 | 66 |
| 876 | 215 | 22 | 68 |
| 877 | 217 | 24 | 70 |
| 878 | 219 | 26 | 72 |
| 879 | 221 | 28 | 74 |
| 880 | 223 | 30 | 76 |
| 881 | 225 | 32 | 78 |
| 882 | 227 | 34 | 80 |
| 883 | 229 | 36 | 82 |
| 884 | 231 | 38 | 84 |
| 885 | 233 | 40 | 86 |
| 886 | 235 | 42 | 88 |
| 887 | 237 | 44 | 90 |
| 888 | 239 | 46 | 92 |
| 889 | 241 | 48 | 94 |
| 890 | 243 | 50 | 96 |
| 891 | 245 | 52 | 98 |
| 892 | 247 | 54 | 100 |
| 893 | 249 | 56 | 102 |
| 894 | 251 | 58 | 104 |
| 895 | 253 | 60 | 106 |
| 896 | 255 | 62 | 108 |

TABLE 8

H(3, 6)

| b | c | c | c |
|---|---|---|---|
| 897 | 2 | 73 | 199 |
| 898 | 4 | 75 | 201 |
| 899 | 6 | 77 | 203 |
| 900 | 8 | 79 | 205 |
| 901 | 10 | 81 | 207 |
| 902 | 12 | 83 | 209 |
| 903 | 14 | 85 | 211 |
| 904 | 16 | 87 | 213 |
| 905 | 18 | 89 | 215 |
| 906 | 20 | 91 | 217 |
| 907 | 22 | 93 | 219 |
| 908 | 24 | 95 | 221 |

TABLE 8-continued

H(3, 6)

| b | c | c | c |
|---|---|---|---|
| 909 | 26 | 97 | 223 |
| 910 | 28 | 99 | 225 |
| 911 | 30 | 101 | 227 |
| 912 | 32 | 103 | 229 |
| 913 | 34 | 105 | 231 |
| 914 | 36 | 107 | 233 |
| 915 | 38 | 109 | 235 |
| 916 | 40 | 111 | 237 |
| 917 | 42 | 113 | 239 |
| 918 | 44 | 115 | 241 |
| 919 | 46 | 117 | 243 |
| 920 | 48 | 119 | 245 |
| 921 | 50 | 121 | 247 |
| 922 | 52 | 123 | 249 |
| 923 | 54 | 125 | 251 |
| 924 | 56 | 127 | 253 |
| 925 | 58 | 129 | 255 |
| 926 | 60 | 131 | 1 |
| 927 | 62 | 133 | 3 |
| 928 | 64 | 135 | 5 |
| 929 | 66 | 137 | 7 |
| 930 | 68 | 139 | 9 |
| 931 | 70 | 141 | 11 |
| 932 | 72 | 143 | 13 |
| 933 | 74 | 145 | 15 |
| 934 | 76 | 147 | 17 |
| 935 | 78 | 149 | 19 |
| 936 | 80 | 151 | 21 |
| 937 | 82 | 153 | 23 |
| 938 | 84 | 155 | 25 |
| 939 | 86 | 157 | 27 |
| 940 | 88 | 159 | 29 |
| 941 | 90 | 161 | 31 |
| 942 | 92 | 163 | 33 |
| 943 | 94 | 165 | 35 |
| 944 | 96 | 167 | 37 |
| 945 | 98 | 169 | 39 |
| 946 | 100 | 171 | 41 |
| 947 | 102 | 173 | 43 |
| 948 | 104 | 175 | 45 |
| 949 | 106 | 177 | 47 |
| 950 | 108 | 179 | 49 |
| 951 | 110 | 181 | 51 |
| 952 | 112 | 183 | 53 |
| 953 | 114 | 185 | 55 |
| 954 | 116 | 187 | 57 |
| 955 | 118 | 189 | 59 |
| 956 | 120 | 191 | 61 |
| 957 | 122 | 193 | 63 |
| 958 | 124 | 195 | 65 |
| 959 | 126 | 197 | 67 |
| 960 | 128 | 199 | 69 |
| 961 | 130 | 201 | 71 |
| 962 | 132 | 203 | 73 |
| 963 | 134 | 205 | 75 |
| 964 | 136 | 207 | 77 |
| 965 | 138 | 209 | 79 |
| 966 | 140 | 211 | 81 |
| 967 | 142 | 213 | 83 |
| 968 | 144 | 215 | 85 |
| 969 | 146 | 217 | 87 |
| 970 | 148 | 219 | 89 |
| 971 | 150 | 221 | 91 |
| 972 | 152 | 223 | 93 |
| 973 | 154 | 225 | 95 |
| 974 | 156 | 227 | 97 |
| 975 | 158 | 229 | 99 |
| 976 | 160 | 231 | 101 |
| 977 | 162 | 233 | 103 |
| 978 | 164 | 235 | 105 |
| 979 | 166 | 237 | 107 |
| 980 | 168 | 239 | 109 |
| 981 | 170 | 241 | 111 |
| 982 | 172 | 243 | 113 |
| 983 | 174 | 245 | 115 |

TABLE 8-continued

H(3, 6)

| b | c | c | c |
|---|---|---|---|
| 984 | 176 | 247 | 117 |
| 985 | 178 | 249 | 119 |
| 986 | 180 | 251 | 121 |
| 987 | 182 | 253 | 123 |
| 988 | 184 | 255 | 125 |
| 989 | 186 | 1 | 127 |
| 990 | 188 | 3 | 129 |
| 991 | 190 | 5 | 131 |
| 992 | 192 | 7 | 133 |
| 993 | 194 | 9 | 135 |
| 994 | 196 | 11 | 137 |
| 995 | 198 | 13 | 139 |
| 996 | 200 | 15 | 141 |
| 997 | 202 | 17 | 143 |
| 998 | 204 | 19 | 145 |
| 999 | 206 | 21 | 147 |
| 1000 | 208 | 23 | 149 |
| 1001 | 210 | 25 | 151 |
| 1002 | 212 | 27 | 153 |
| 1003 | 214 | 29 | 155 |
| 1004 | 216 | 31 | 157 |
| 1005 | 218 | 33 | 159 |
| 1006 | 220 | 35 | 161 |
| 1007 | 222 | 37 | 163 |
| 1008 | 224 | 39 | 165 |
| 1009 | 226 | 41 | 167 |
| 1010 | 228 | 43 | 169 |
| 1011 | 230 | 45 | 171 |
| 1012 | 232 | 47 | 173 |
| 1013 | 234 | 49 | 175 |
| 1014 | 236 | 51 | 177 |
| 1015 | 238 | 53 | 179 |
| 1016 | 240 | 55 | 181 |
| 1017 | 242 | 57 | 183 |
| 1018 | 244 | 59 | 185 |
| 1019 | 246 | 61 | 187 |
| 1020 | 248 | 63 | 189 |
| 1021 | 250 | 65 | 191 |
| 1022 | 252 | 67 | 193 |
| 1023 | 254 | 69 | 195 |
| 1024 | 256 | 71 | 197 |

TABLE 9

H(d)

| b | c | c |
|---|---|---|
| 1025 | 1 | 2 |
| 1026 | 2 | 3 |
| 1027 | 3 | 4 |
| 1028 | 4 | 5 |
| 1029 | 5 | 6 |
| 1030 | 6 | 7 |
| 1031 | 7 | 8 |
| 1032 | 8 | 9 |
| 1033 | 9 | 10 |
| 1034 | 10 | 11 |
| 1035 | 11 | 12 |
| 1036 | 12 | 13 |
| 1037 | 13 | 14 |
| 1038 | 14 | 15 |
| 1039 | 15 | 16 |
| 1040 | 16 | 17 |
| 1041 | 17 | 18 |
| 1042 | 18 | 19 |
| 1043 | 19 | 20 |
| 1044 | 20 | 21 |
| 1045 | 21 | 22 |
| 1046 | 22 | 23 |
| 1047 | 23 | 24 |
| 1048 | 24 | 25 |

TABLE 9-continued

H(d)

| b | c | c |
|---|---|---|
| 1049 | 25 | 26 |
| 1050 | 26 | 27 |
| 1051 | 27 | 28 |
| 1052 | 28 | 29 |
| 1053 | 29 | 30 |
| 1054 | 30 | 31 |
| 1055 | 31 | 32 |
| 1056 | 32 | 33 |
| 1057 | 33 | 34 |
| 1058 | 34 | 35 |
| 1059 | 35 | 36 |
| 1060 | 36 | 37 |
| 1061 | 37 | 38 |
| 1062 | 38 | 39 |
| 1063 | 39 | 40 |
| 1064 | 40 | 41 |
| 1065 | 41 | 42 |
| 1066 | 42 | 43 |
| 1067 | 43 | 44 |
| 1068 | 44 | 45 |
| 1069 | 45 | 46 |
| 1070 | 46 | 47 |
| 1071 | 47 | 48 |
| 1072 | 48 | 49 |
| 1073 | 49 | 50 |
| 1074 | 50 | 51 |
| 1075 | 51 | 52 |
| 1076 | 52 | 53 |
| 1077 | 53 | 54 |
| 1078 | 54 | 55 |
| 1079 | 55 | 56 |
| 1080 | 56 | 57 |
| 1081 | 57 | 58 |
| 1082 | 58 | 59 |
| 1083 | 59 | 60 |
| 1084 | 60 | 61 |
| 1085 | 61 | 62 |
| 1086 | 62 | 63 |
| 1087 | 63 | 64 |
| 1088 | 64 | 65 |
| 1089 | 65 | 66 |
| 1090 | 66 | 67 |
| 1091 | 67 | 68 |
| 1092 | 68 | 69 |
| 1093 | 69 | 70 |
| 1094 | 70 | 71 |
| 1095 | 71 | 72 |
| 1096 | 72 | 73 |
| 1097 | 73 | 74 |
| 1098 | 74 | 75 |
| 1099 | 75 | 76 |
| 1100 | 76 | 77 |
| 1101 | 77 | 78 |
| 1102 | 78 | 79 |
| 1103 | 79 | 80 |
| 1104 | 80 | 81 |
| 1105 | 81 | 82 |
| 1106 | 82 | 83 |
| 1107 | 83 | 84 |
| 1108 | 84 | 85 |
| 1109 | 85 | 86 |
| 1110 | 86 | 87 |
| 1111 | 87 | 88 |
| 1112 | 88 | 89 |
| 1113 | 89 | 90 |
| 1114 | 90 | 91 |
| 1115 | 91 | 92 |
| 1116 | 92 | 93 |
| 1117 | 93 | 94 |
| 1118 | 94 | 95 |
| 1119 | 95 | 96 |
| 1120 | 96 | 97 |
| 1121 | 97 | 98 |
| 1122 | 98 | 99 |
| 1123 | 99 | 100 |

TABLE 9-continued

| | H(d) | |
|---|---|---|
| b | c | c |
| 1124 | 100 | 101 |
| 1125 | 101 | 102 |
| 1126 | 102 | 103 |
| 1127 | 103 | 104 |
| 1128 | 104 | 105 |
| 1129 | 105 | 106 |
| 1130 | 106 | 107 |
| 1131 | 107 | 108 |
| 1132 | 108 | 109 |
| 1133 | 109 | 110 |
| 1134 | 110 | 111 |
| 1135 | 111 | 112 |
| 1136 | 112 | 113 |
| 1137 | 113 | 114 |
| 1138 | 114 | 115 |
| 1139 | 115 | 116 |
| 1140 | 116 | 117 |
| 1141 | 117 | 118 |
| 1142 | 118 | 119 |
| 1143 | 119 | 120 |
| 1144 | 120 | 121 |
| 1145 | 121 | 122 |
| 1146 | 122 | 123 |
| 1147 | 123 | 124 |
| 1148 | 124 | 125 |
| 1149 | 125 | 126 |
| 1150 | 126 | 127 |
| 1151 | 127 | 128 |
| 1152 | 128 | 129 |
| 1153 | 129 | 130 |
| 1154 | 130 | 131 |
| 1155 | 131 | 132 |
| 1156 | 132 | 133 |
| 1157 | 133 | 134 |
| 1158 | 134 | 135 |
| 1159 | 135 | 136 |
| 1160 | 136 | 137 |
| 1161 | 137 | 138 |
| 1162 | 138 | 139 |
| 1163 | 139 | 140 |
| 1164 | 140 | 141 |
| 1165 | 141 | 142 |
| 1166 | 142 | 143 |
| 1167 | 143 | 144 |
| 1168 | 144 | 145 |
| 1169 | 145 | 146 |
| 1170 | 146 | 147 |
| 1171 | 147 | 148 |
| 1172 | 148 | 149 |
| 1173 | 149 | 150 |
| 1174 | 150 | 151 |
| 1175 | 151 | 152 |
| 1176 | 152 | 153 |
| 1177 | 153 | 154 |
| 1178 | 154 | 155 |
| 1179 | 155 | 156 |
| 1180 | 156 | 157 |
| 1181 | 157 | 158 |
| 1182 | 158 | 159 |
| 1183 | 159 | 160 |
| 1184 | 160 | 161 |
| 1185 | 161 | 162 |
| 1186 | 162 | 163 |
| 1187 | 163 | 164 |
| 1188 | 164 | 165 |
| 1189 | 165 | 166 |
| 1190 | 166 | 167 |
| 1191 | 167 | 168 |
| 1192 | 168 | 169 |
| 1193 | 169 | 170 |
| 1194 | 170 | 171 |
| 1195 | 171 | 172 |
| 1196 | 172 | 173 |
| 1197 | 173 | 174 |
| 1198 | 174 | 175 |
| 1199 | 175 | 176 |
| 1200 | 176 | 177 |
| 1201 | 177 | 178 |
| 1202 | 178 | 179 |
| 1203 | 179 | 180 |
| 1204 | 180 | 181 |
| 1205 | 181 | 182 |
| 1206 | 182 | 183 |
| 1207 | 183 | 184 |
| 1208 | 184 | 185 |
| 1209 | 185 | 186 |
| 1210 | 186 | 187 |
| 1211 | 187 | 188 |
| 1212 | 188 | 189 |
| 1213 | 189 | 190 |
| 1214 | 190 | 191 |
| 1215 | 191 | 192 |
| 1216 | 192 | 193 |
| 1217 | 193 | 194 |
| 1218 | 194 | 195 |
| 1219 | 195 | 196 |
| 1220 | 196 | 197 |
| 1221 | 197 | 198 |
| 1222 | 198 | 199 |
| 1223 | 199 | 200 |
| 1224 | 200 | 201 |
| 1225 | 201 | 202 |
| 1226 | 202 | 203 |
| 1227 | 203 | 204 |
| 1228 | 204 | 205 |
| 1229 | 205 | 206 |
| 1230 | 206 | 207 |
| 1231 | 207 | 208 |
| 1232 | 208 | 209 |
| 1233 | 209 | 210 |
| 1234 | 210 | 211 |
| 1235 | 211 | 212 |
| 1236 | 212 | 213 |
| 1237 | 213 | 214 |
| 1238 | 214 | 215 |
| 1239 | 215 | 216 |
| 1240 | 216 | 217 |
| 1241 | 217 | 218 |
| 1242 | 218 | 219 |
| 1243 | 219 | 220 |
| 1244 | 220 | 221 |
| 1245 | 221 | 222 |
| 1246 | 222 | 223 |
| 1247 | 223 | 224 |
| 1248 | 224 | 225 |
| 1249 | 225 | 226 |
| 1250 | 226 | 227 |
| 1251 | 227 | 228 |
| 1252 | 228 | 229 |
| 1253 | 229 | 230 |
| 1254 | 230 | 231 |
| 1255 | 231 | 232 |
| 1256 | 232 | 233 |
| 1257 | 233 | 234 |
| 1258 | 234 | 235 |
| 1259 | 235 | 236 |
| 1260 | 236 | 237 |
| 1261 | 237 | 238 |
| 1262 | 238 | 239 |
| 1263 | 239 | 240 |
| 1264 | 240 | 241 |
| 1265 | 241 | 242 |
| 1266 | 242 | 243 |
| 1267 | 243 | 244 |
| 1268 | 244 | 245 |
| 1269 | 245 | 246 |
| 1270 | 246 | 247 |
| 1271 | 247 | 248 |
| 1272 | 248 | 249 |
| 1273 | 249 | 250 |

TABLE 9-continued

H(d)

| b | c | c |
|---|---|---|
| 1274 | 250 | 251 |
| 1275 | 251 | 252 |
| 1276 | 252 | 253 |
| 1277 | 253 | 254 |
| 1278 | 254 | 255 |
| 1279 | 255 | 256 |
| 1280 | 256 | |

Appendix B

2. Another embodiment of a parity check matrix of a (1280, 1024) LDPC code is presented below.

The following presents another possible embodiment of a (1280,1024) irregular LDPC code parity check matrix that is constructed in accordance with certain aspects of the invention. The parity check matrix is presented in the following format:

H=[H(7,1), H(7,2), H(3,1), H(3,3), H(3,4), H(3,5), H(3,6), H(d)]

TABLE 1

H(7, 1)

| b | c | c | c | c | c | c | c |
|---|---|---|---|---|---|---|---|
| 1 | 1 | 203 | 21 | 57 | 85 | 42 | 191 |
| 2 | 3 | 205 | 23 | 59 | 87 | 44 | 193 |
| 3 | 5 | 207 | 25 | 61 | 89 | 46 | 195 |
| 4 | 7 | 209 | 27 | 63 | 91 | 48 | 197 |
| 5 | 9 | 211 | 29 | 65 | 93 | 50 | 199 |
| 6 | 11 | 213 | 31 | 67 | 95 | 52 | 201 |
| 7 | 13 | 215 | 33 | 69 | 97 | 54 | 203 |
| 8 | 15 | 217 | 35 | 71 | 99 | 56 | 205 |
| 9 | 17 | 219 | 37 | 73 | 101 | 58 | 207 |
| 10 | 19 | 221 | 39 | 75 | 103 | 60 | 209 |
| 11 | 21 | 223 | 41 | 77 | 105 | 62 | 211 |
| 12 | 23 | 225 | 43 | 79 | 107 | 64 | 213 |
| 13 | 25 | 227 | 45 | 81 | 109 | 66 | 215 |
| 14 | 27 | 229 | 47 | 83 | 111 | 68 | 217 |
| 15 | 29 | 231 | 49 | 85 | 113 | 70 | 219 |
| 16 | 31 | 233 | 51 | 87 | 115 | 72 | 221 |
| 17 | 33 | 235 | 53 | 89 | 117 | 74 | 223 |
| 18 | 35 | 237 | 55 | 91 | 119 | 76 | 225 |
| 19 | 37 | 239 | 57 | 93 | 121 | 78 | 227 |
| 20 | 39 | 241 | 59 | 95 | 123 | 80 | 229 |
| 21 | 41 | 243 | 61 | 97 | 125 | 82 | 231 |
| 22 | 43 | 245 | 63 | 99 | 127 | 84 | 233 |
| 23 | 45 | 247 | 65 | 101 | 129 | 86 | 235 |
| 24 | 47 | 249 | 67 | 103 | 131 | 88 | 237 |
| 25 | 49 | 251 | 69 | 105 | 133 | 90 | 239 |
| 26 | 51 | 253 | 71 | 107 | 135 | 92 | 241 |
| 27 | 53 | 255 | 73 | 109 | 137 | 94 | 243 |
| 28 | 55 | 1 | 75 | 111 | 139 | 96 | 245 |
| 29 | 57 | 3 | 77 | 113 | 141 | 98 | 247 |
| 30 | 59 | 5 | 79 | 115 | 143 | 100 | 249 |
| 31 | 61 | 7 | 81 | 117 | 145 | 102 | 251 |
| 32 | 63 | 9 | 83 | 119 | 147 | 104 | 253 |
| 33 | 65 | 11 | 85 | 121 | 149 | 106 | 255 |
| 34 | 67 | 13 | 87 | 123 | 151 | 108 | 1 |
| 35 | 69 | 15 | 89 | 125 | 153 | 110 | 3 |
| 36 | 71 | 17 | 91 | 127 | 155 | 112 | 5 |
| 37 | 73 | 19 | 93 | 129 | 157 | 114 | 7 |
| 38 | 75 | 21 | 95 | 131 | 159 | 116 | 9 |
| 39 | 77 | 23 | 97 | 133 | 161 | 118 | 11 |
| 40 | 79 | 25 | 99 | 135 | 163 | 120 | 13 |
| 41 | 81 | 27 | 101 | 137 | 165 | 122 | 15 |
| 42 | 83 | 29 | 103 | 139 | 167 | 124 | 17 |
| 43 | 85 | 31 | 105 | 141 | 169 | 126 | 19 |

TABLE 1-continued

H(7, 1)

| b | c | c | c | c | c | c | c |
|---|---|---|---|---|---|---|---|
| 44 | 87 | 33 | 107 | 143 | 171 | 128 | 21 |
| 45 | 89 | 35 | 109 | 145 | 173 | 130 | 23 |
| 46 | 91 | 37 | 111 | 147 | 175 | 132 | 25 |
| 47 | 93 | 39 | 113 | 149 | 177 | 134 | 27 |
| 48 | 95 | 41 | 115 | 151 | 179 | 136 | 29 |
| 49 | 97 | 43 | 117 | 153 | 181 | 138 | 31 |
| 50 | 99 | 45 | 119 | 155 | 183 | 140 | 33 |
| 51 | 101 | 47 | 121 | 157 | 185 | 142 | 35 |
| 52 | 103 | 49 | 123 | 159 | 187 | 144 | 37 |
| 53 | 105 | 51 | 125 | 161 | 189 | 146 | 39 |
| 54 | 107 | 53 | 127 | 163 | 191 | 148 | 41 |
| 55 | 109 | 55 | 129 | 165 | 193 | 150 | 43 |
| 56 | 111 | 57 | 131 | 167 | 195 | 152 | 45 |
| 57 | 113 | 59 | 133 | 169 | 197 | 154 | 47 |
| 58 | 115 | 61 | 135 | 171 | 199 | 156 | 49 |
| 59 | 117 | 63 | 137 | 173 | 201 | 158 | 51 |
| 60 | 119 | 65 | 139 | 175 | 203 | 160 | 53 |
| 61 | 121 | 67 | 141 | 177 | 205 | 162 | 55 |
| 62 | 123 | 69 | 143 | 179 | 207 | 164 | 57 |
| 63 | 125 | 71 | 145 | 181 | 209 | 166 | 59 |
| 64 | 127 | 73 | 147 | 183 | 211 | 168 | 61 |
| 65 | 129 | 75 | 149 | 185 | 213 | 170 | 63 |
| 66 | 131 | 77 | 151 | 187 | 215 | 172 | 65 |
| 67 | 133 | 79 | 153 | 189 | 217 | 174 | 67 |
| 68 | 135 | 81 | 155 | 191 | 219 | 176 | 69 |
| 69 | 137 | 83 | 157 | 193 | 221 | 178 | 71 |
| 70 | 139 | 85 | 159 | 195 | 223 | 180 | 73 |
| 71 | 141 | 87 | 161 | 197 | 225 | 182 | 75 |
| 72 | 143 | 89 | 163 | 199 | 227 | 184 | 77 |
| 73 | 145 | 91 | 165 | 201 | 229 | 186 | 79 |
| 74 | 147 | 93 | 167 | 203 | 231 | 188 | 81 |
| 75 | 149 | 95 | 169 | 205 | 233 | 190 | 83 |
| 76 | 151 | 97 | 171 | 207 | 235 | 192 | 85 |
| 77 | 153 | 99 | 173 | 209 | 237 | 194 | 87 |
| 78 | 155 | 101 | 175 | 211 | 239 | 196 | 89 |
| 79 | 157 | 103 | 177 | 213 | 241 | 198 | 91 |
| 80 | 159 | 105 | 179 | 215 | 243 | 200 | 93 |
| 81 | 161 | 107 | 181 | 217 | 245 | 202 | 95 |
| 82 | 163 | 109 | 183 | 219 | 247 | 204 | 97 |
| 83 | 165 | 111 | 185 | 221 | 249 | 206 | 99 |
| 84 | 167 | 113 | 187 | 223 | 251 | 208 | 101 |
| 85 | 169 | 115 | 189 | 225 | 253 | 210 | 103 |
| 86 | 171 | 117 | 191 | 227 | 255 | 212 | 105 |
| 87 | 173 | 119 | 193 | 229 | 1 | 214 | 107 |
| 88 | 175 | 121 | 195 | 231 | 3 | 216 | 109 |
| 89 | 177 | 123 | 197 | 233 | 5 | 218 | 111 |
| 90 | 179 | 125 | 199 | 235 | 7 | 220 | 113 |
| 91 | 181 | 127 | 201 | 237 | 9 | 222 | 115 |
| 92 | 183 | 129 | 203 | 239 | 11 | 224 | 117 |
| 93 | 185 | 131 | 205 | 241 | 13 | 226 | 119 |
| 94 | 187 | 133 | 207 | 243 | 15 | 228 | 121 |
| 95 | 189 | 135 | 209 | 245 | 17 | 230 | 123 |
| 96 | 191 | 137 | 211 | 247 | 19 | 232 | 125 |
| 97 | 193 | 139 | 213 | 249 | 21 | 234 | 127 |
| 98 | 195 | 141 | 215 | 251 | 23 | 236 | 129 |
| 99 | 197 | 143 | 217 | 253 | 25 | 238 | 131 |
| 100 | 199 | 145 | 219 | 255 | 27 | 240 | 133 |
| 101 | 201 | 147 | 221 | 1 | 29 | 242 | 135 |
| 102 | 203 | 149 | 223 | 3 | 31 | 244 | 137 |
| 103 | 205 | 151 | 225 | 5 | 33 | 246 | 139 |
| 104 | 207 | 153 | 227 | 7 | 35 | 248 | 141 |
| 105 | 209 | 155 | 229 | 9 | 37 | 250 | 143 |
| 106 | 211 | 157 | 231 | 11 | 39 | 252 | 145 |
| 107 | 213 | 159 | 233 | 13 | 41 | 254 | 147 |
| 108 | 215 | 161 | 235 | 15 | 43 | 256 | 149 |
| 109 | 217 | 163 | 237 | 17 | 45 | 2 | 151 |
| 110 | 219 | 165 | 239 | 19 | 47 | 4 | 153 |
| 111 | 221 | 167 | 241 | 21 | 49 | 6 | 155 |
| 112 | 223 | 169 | 243 | 23 | 51 | 8 | 157 |
| 113 | 225 | 171 | 245 | 25 | 53 | 10 | 159 |
| 114 | 227 | 173 | 247 | 27 | 55 | 12 | 161 |
| 115 | 229 | 175 | 249 | 29 | 57 | 14 | 163 |
| 116 | 231 | 177 | 251 | 31 | 59 | 16 | 165 |
| 117 | 233 | 179 | 253 | 33 | 61 | 18 | 167 |
| 118 | 235 | 181 | 255 | 35 | 63 | 20 | 169 |

TABLE 1-continued

H(7, 1)

| b | c | c | c | c | c | c | c |
|---|---|---|---|---|---|---|---|
| 119 | 237 | 183 | 1 | 37 | 65 | 22 | 171 |
| 120 | 239 | 185 | 3 | 39 | 67 | 24 | 173 |
| 121 | 241 | 187 | 5 | 41 | 69 | 26 | 175 |
| 122 | 243 | 189 | 7 | 43 | 71 | 28 | 177 |
| 123 | 245 | 191 | 9 | 45 | 73 | 30 | 179 |
| 124 | 247 | 193 | 11 | 47 | 75 | 32 | 181 |
| 125 | 249 | 195 | 13 | 49 | 77 | 34 | 183 |
| 126 | 251 | 197 | 15 | 51 | 79 | 36 | 185 |
| 127 | 253 | 199 | 17 | 53 | 81 | 38 | 187 |
| 128 | 255 | 201 | 19 | 55 | 83 | 40 | 189 |

TABLE 2

H(7, 2)

| b | c | c | c | c | c | c | c |
|---|---|---|---|---|---|---|---|
| 129 | 2 | 180 | 54 | 122 | 188 | 225 | 144 |
| 130 | 4 | 182 | 56 | 124 | 190 | 227 | 146 |
| 131 | 6 | 184 | 58 | 126 | 192 | 229 | 148 |
| 132 | 8 | 186 | 60 | 128 | 194 | 231 | 150 |
| 133 | 10 | 188 | 62 | 130 | 196 | 233 | 152 |
| 134 | 12 | 190 | 64 | 132 | 198 | 235 | 154 |
| 135 | 14 | 192 | 66 | 134 | 200 | 237 | 156 |
| 136 | 16 | 194 | 68 | 136 | 202 | 239 | 158 |
| 137 | 18 | 196 | 70 | 138 | 204 | 241 | 160 |
| 138 | 20 | 198 | 72 | 140 | 206 | 243 | 162 |
| 139 | 22 | 200 | 74 | 142 | 208 | 245 | 164 |
| 140 | 24 | 202 | 76 | 144 | 210 | 247 | 166 |
| 141 | 26 | 204 | 78 | 146 | 212 | 249 | 168 |
| 142 | 28 | 206 | 80 | 148 | 214 | 251 | 170 |
| 143 | 30 | 208 | 82 | 150 | 216 | 253 | 172 |
| 144 | 32 | 210 | 84 | 152 | 218 | 255 | 174 |
| 145 | 34 | 212 | 86 | 154 | 220 | 1 | 176 |
| 146 | 36 | 214 | 88 | 156 | 222 | 3 | 178 |
| 147 | 38 | 216 | 90 | 158 | 224 | 5 | 180 |
| 148 | 40 | 218 | 92 | 160 | 226 | 7 | 182 |
| 149 | 42 | 220 | 94 | 162 | 228 | 9 | 184 |
| 150 | 44 | 222 | 96 | 164 | 230 | 11 | 186 |
| 151 | 46 | 224 | 98 | 166 | 232 | 13 | 188 |
| 152 | 48 | 226 | 100 | 168 | 234 | 15 | 190 |
| 153 | 50 | 228 | 102 | 170 | 236 | 17 | 192 |
| 154 | 52 | 230 | 104 | 172 | 238 | 19 | 194 |
| 155 | 54 | 232 | 106 | 174 | 240 | 21 | 196 |
| 156 | 56 | 234 | 108 | 176 | 242 | 23 | 198 |
| 157 | 58 | 236 | 110 | 178 | 244 | 25 | 200 |
| 158 | 60 | 238 | 112 | 180 | 246 | 27 | 202 |
| 159 | 62 | 240 | 114 | 182 | 248 | 29 | 204 |
| 160 | 64 | 242 | 116 | 184 | 250 | 31 | 206 |
| 161 | 66 | 244 | 118 | 186 | 252 | 33 | 208 |
| 162 | 68 | 246 | 120 | 188 | 254 | 35 | 210 |
| 163 | 70 | 248 | 122 | 190 | 256 | 37 | 212 |
| 164 | 72 | 250 | 124 | 192 | 2 | 39 | 214 |
| 165 | 74 | 252 | 126 | 194 | 4 | 41 | 216 |
| 166 | 76 | 254 | 128 | 196 | 6 | 43 | 218 |
| 167 | 78 | 256 | 130 | 198 | 8 | 45 | 220 |
| 168 | 80 | 2 | 132 | 200 | 10 | 47 | 222 |
| 169 | 82 | 4 | 134 | 202 | 12 | 49 | 224 |
| 170 | 84 | 6 | 136 | 204 | 14 | 51 | 226 |
| 171 | 86 | 8 | 138 | 206 | 16 | 53 | 228 |
| 172 | 88 | 10 | 140 | 208 | 18 | 55 | 230 |
| 173 | 90 | 12 | 142 | 210 | 20 | 57 | 232 |
| 174 | 92 | 14 | 144 | 212 | 22 | 59 | 234 |
| 175 | 94 | 16 | 146 | 214 | 24 | 61 | 236 |
| 176 | 96 | 18 | 148 | 216 | 26 | 63 | 238 |
| 177 | 98 | 20 | 150 | 218 | 28 | 65 | 240 |
| 178 | 100 | 22 | 152 | 220 | 30 | 67 | 242 |
| 179 | 102 | 24 | 154 | 222 | 32 | 69 | 244 |
| 180 | 104 | 26 | 156 | 224 | 34 | 71 | 246 |
| 181 | 106 | 28 | 158 | 226 | 36 | 73 | 248 |
| 182 | 108 | 30 | 160 | 228 | 38 | 75 | 250 |
| 183 | 110 | 32 | 162 | 230 | 40 | 77 | 252 |

TABLE 2-continued

H(7, 2)

| b | c | c | c | c | c | c | c |
|---|---|---|---|---|---|---|---|
| 184 | 112 | 34 | 164 | 232 | 42 | 79 | 254 |
| 185 | 114 | 36 | 166 | 234 | 44 | 81 | 256 |
| 186 | 116 | 38 | 168 | 236 | 46 | 83 | 2 |
| 187 | 118 | 40 | 170 | 238 | 48 | 85 | 4 |
| 188 | 120 | 42 | 172 | 240 | 50 | 87 | 6 |
| 189 | 122 | 44 | 174 | 242 | 52 | 89 | 8 |
| 190 | 124 | 46 | 176 | 244 | 54 | 91 | 10 |
| 191 | 126 | 48 | 178 | 246 | 56 | 93 | 12 |
| 192 | 128 | 50 | 180 | 248 | 58 | 95 | 14 |
| 193 | 130 | 52 | 182 | 250 | 60 | 97 | 16 |
| 194 | 132 | 54 | 184 | 252 | 62 | 99 | 18 |
| 195 | 134 | 56 | 186 | 254 | 64 | 101 | 20 |
| 196 | 136 | 58 | 188 | 256 | 66 | 103 | 22 |
| 197 | 138 | 60 | 190 | 2 | 68 | 105 | 24 |
| 198 | 140 | 62 | 192 | 4 | 70 | 107 | 26 |
| 199 | 142 | 64 | 194 | 6 | 72 | 109 | 28 |
| 200 | 144 | 66 | 196 | 8 | 74 | 111 | 30 |
| 201 | 146 | 68 | 198 | 10 | 76 | 113 | 32 |
| 202 | 148 | 70 | 200 | 12 | 78 | 115 | 34 |
| 203 | 150 | 72 | 202 | 14 | 80 | 117 | 36 |
| 204 | 152 | 74 | 204 | 16 | 82 | 119 | 38 |
| 205 | 154 | 76 | 206 | 18 | 84 | 121 | 40 |
| 206 | 156 | 78 | 208 | 20 | 86 | 123 | 42 |
| 207 | 158 | 80 | 210 | 22 | 88 | 125 | 44 |
| 208 | 160 | 82 | 212 | 24 | 90 | 127 | 46 |
| 209 | 162 | 84 | 214 | 26 | 92 | 129 | 48 |
| 210 | 164 | 86 | 216 | 28 | 94 | 131 | 50 |
| 211 | 166 | 88 | 218 | 30 | 96 | 133 | 52 |
| 212 | 168 | 90 | 220 | 32 | 98 | 135 | 54 |
| 213 | 170 | 92 | 222 | 34 | 100 | 137 | 56 |
| 214 | 172 | 94 | 224 | 36 | 102 | 139 | 58 |
| 215 | 174 | 96 | 226 | 38 | 104 | 141 | 60 |
| 216 | 176 | 98 | 228 | 40 | 106 | 143 | 62 |
| 217 | 178 | 100 | 230 | 42 | 108 | 145 | 64 |
| 218 | 180 | 102 | 232 | 44 | 110 | 147 | 66 |
| 219 | 182 | 104 | 234 | 46 | 112 | 149 | 68 |
| 220 | 184 | 106 | 236 | 48 | 114 | 151 | 70 |
| 221 | 186 | 108 | 238 | 50 | 116 | 153 | 72 |
| 222 | 188 | 110 | 240 | 52 | 118 | 155 | 74 |
| 223 | 190 | 112 | 242 | 54 | 120 | 157 | 76 |
| 224 | 192 | 114 | 244 | 56 | 122 | 159 | 78 |
| 225 | 194 | 116 | 246 | 58 | 124 | 161 | 80 |
| 226 | 196 | 118 | 248 | 60 | 126 | 163 | 82 |
| 227 | 198 | 120 | 250 | 62 | 128 | 165 | 84 |
| 228 | 200 | 122 | 252 | 64 | 130 | 167 | 86 |
| 229 | 202 | 124 | 254 | 66 | 132 | 169 | 88 |
| 230 | 204 | 126 | 256 | 68 | 134 | 171 | 90 |
| 231 | 206 | 128 | 2 | 70 | 136 | 173 | 92 |
| 232 | 208 | 130 | 4 | 72 | 138 | 175 | 94 |
| 233 | 210 | 132 | 6 | 74 | 140 | 177 | 96 |
| 234 | 212 | 134 | 8 | 76 | 142 | 179 | 98 |
| 235 | 214 | 136 | 10 | 78 | 144 | 181 | 100 |
| 236 | 216 | 138 | 12 | 80 | 146 | 183 | 102 |
| 237 | 218 | 140 | 14 | 82 | 148 | 185 | 104 |
| 238 | 220 | 142 | 16 | 84 | 150 | 187 | 106 |
| 239 | 222 | 144 | 18 | 86 | 152 | 189 | 108 |
| 240 | 224 | 146 | 20 | 88 | 154 | 191 | 110 |
| 241 | 226 | 148 | 22 | 90 | 156 | 193 | 112 |
| 242 | 228 | 150 | 24 | 92 | 158 | 195 | 114 |
| 243 | 230 | 152 | 26 | 94 | 160 | 197 | 116 |
| 244 | 232 | 154 | 28 | 96 | 162 | 199 | 118 |
| 245 | 234 | 156 | 30 | 98 | 164 | 201 | 120 |
| 246 | 236 | 158 | 32 | 100 | 166 | 203 | 122 |
| 247 | 238 | 160 | 34 | 102 | 168 | 205 | 124 |
| 248 | 240 | 162 | 36 | 104 | 170 | 207 | 126 |
| 249 | 242 | 164 | 38 | 106 | 172 | 209 | 128 |
| 250 | 244 | 166 | 40 | 108 | 174 | 211 | 130 |
| 251 | 246 | 168 | 42 | 110 | 176 | 213 | 132 |
| 252 | 248 | 170 | 44 | 112 | 178 | 215 | 134 |
| 253 | 250 | 172 | 46 | 114 | 180 | 217 | 136 |
| 254 | 252 | 174 | 48 | 116 | 182 | 219 | 138 |
| 255 | 254 | 176 | 50 | 118 | 184 | 221 | 140 |
| 256 | 256 | 178 | 52 | 120 | 186 | 223 | 142 |

TABLE 3

H(3, 1)

| b | c | c | c |
|---|---|---|---|
| 257 | 1 | 24 | 179 |
| 258 | 3 | 26 | 181 |
| 259 | 5 | 28 | 183 |
| 260 | 7 | 30 | 185 |
| 261 | 9 | 32 | 187 |
| 262 | 11 | 34 | 189 |
| 263 | 13 | 36 | 191 |
| 264 | 15 | 38 | 193 |
| 265 | 17 | 40 | 195 |
| 266 | 19 | 42 | 197 |
| 267 | 21 | 44 | 199 |
| 268 | 23 | 46 | 201 |
| 269 | 25 | 48 | 203 |
| 270 | 27 | 50 | 205 |
| 271 | 29 | 52 | 207 |
| 272 | 31 | 54 | 209 |
| 273 | 33 | 56 | 211 |
| 274 | 35 | 58 | 213 |
| 275 | 37 | 60 | 215 |
| 276 | 39 | 62 | 217 |
| 277 | 41 | 64 | 219 |
| 278 | 43 | 66 | 221 |
| 279 | 45 | 68 | 223 |
| 280 | 47 | 70 | 225 |
| 281 | 49 | 72 | 227 |
| 282 | 51 | 74 | 229 |
| 283 | 53 | 76 | 231 |
| 284 | 55 | 78 | 233 |
| 285 | 57 | 80 | 235 |
| 286 | 59 | 82 | 237 |
| 287 | 61 | 84 | 239 |
| 288 | 63 | 86 | 241 |
| 289 | 65 | 88 | 243 |
| 290 | 67 | 90 | 245 |
| 291 | 69 | 92 | 247 |
| 292 | 71 | 94 | 249 |
| 293 | 73 | 96 | 251 |
| 294 | 75 | 98 | 253 |
| 295 | 77 | 100 | 255 |
| 296 | 79 | 102 | 1 |
| 297 | 81 | 104 | 3 |
| 298 | 83 | 106 | 5 |
| 299 | 85 | 108 | 7 |
| 300 | 87 | 110 | 9 |
| 301 | 89 | 112 | 11 |
| 302 | 91 | 114 | 13 |
| 303 | 93 | 116 | 15 |
| 304 | 95 | 118 | 17 |
| 305 | 97 | 120 | 19 |
| 306 | 99 | 122 | 21 |
| 307 | 101 | 124 | 23 |
| 308 | 103 | 126 | 25 |
| 309 | 105 | 128 | 27 |
| 310 | 107 | 130 | 29 |
| 311 | 109 | 132 | 31 |
| 312 | 111 | 134 | 33 |
| 313 | 113 | 136 | 35 |
| 314 | 115 | 138 | 37 |
| 315 | 117 | 140 | 39 |
| 316 | 119 | 142 | 41 |
| 317 | 121 | 144 | 43 |
| 318 | 123 | 146 | 45 |
| 319 | 125 | 148 | 47 |
| 320 | 127 | 150 | 49 |
| 321 | 129 | 152 | 51 |
| 322 | 131 | 154 | 53 |
| 323 | 133 | 156 | 55 |
| 324 | 135 | 158 | 57 |
| 325 | 137 | 160 | 59 |
| 326 | 139 | 162 | 61 |
| 327 | 141 | 164 | 63 |
| 328 | 143 | 166 | 65 |
| 329 | 145 | 168 | 67 |
| 330 | 147 | 170 | 69 |
| 331 | 149 | 172 | 71 |
| 332 | 151 | 174 | 73 |
| 333 | 153 | 176 | 75 |
| 334 | 155 | 178 | 77 |
| 335 | 157 | 180 | 79 |
| 336 | 159 | 182 | 81 |
| 337 | 161 | 184 | 83 |
| 338 | 163 | 186 | 85 |
| 339 | 165 | 188 | 87 |
| 340 | 167 | 190 | 89 |
| 341 | 169 | 192 | 91 |
| 342 | 171 | 194 | 93 |
| 343 | 173 | 196 | 95 |
| 344 | 175 | 198 | 97 |
| 345 | 177 | 200 | 99 |
| 346 | 179 | 202 | 101 |
| 347 | 181 | 204 | 103 |
| 348 | 183 | 206 | 105 |
| 349 | 185 | 208 | 107 |
| 350 | 187 | 210 | 109 |
| 351 | 189 | 212 | 111 |
| 352 | 191 | 214 | 113 |
| 353 | 193 | 216 | 115 |
| 354 | 195 | 218 | 117 |
| 355 | 197 | 220 | 119 |
| 356 | 199 | 222 | 121 |
| 357 | 201 | 224 | 123 |
| 358 | 203 | 226 | 125 |
| 359 | 205 | 228 | 127 |
| 360 | 207 | 230 | 129 |
| 361 | 209 | 232 | 131 |
| 362 | 211 | 234 | 133 |
| 363 | 213 | 236 | 135 |
| 364 | 215 | 238 | 137 |
| 365 | 217 | 240 | 139 |
| 366 | 219 | 242 | 141 |
| 367 | 221 | 244 | 143 |
| 368 | 223 | 246 | 145 |
| 369 | 225 | 248 | 147 |
| 370 | 227 | 250 | 149 |
| 371 | 229 | 252 | 151 |
| 372 | 231 | 254 | 153 |
| 373 | 233 | 256 | 155 |
| 374 | 235 | 2 | 157 |
| 375 | 237 | 4 | 159 |
| 376 | 239 | 6 | 161 |
| 377 | 241 | 8 | 163 |
| 378 | 243 | 10 | 165 |
| 379 | 245 | 12 | 167 |
| 380 | 247 | 14 | 169 |
| 381 | 249 | 16 | 171 |
| 382 | 251 | 18 | 173 |
| 383 | 253 | 20 | 175 |
| 384 | 255 | 22 | 177 |

TABLE 4

H(3, 2)

| b | c | c | c |
|---|---|---|---|
| 385 | 2 | 239 | 140 |
| 386 | 4 | 241 | 142 |
| 387 | 6 | 243 | 144 |
| 388 | 8 | 245 | 146 |
| 389 | 10 | 247 | 148 |
| 390 | 12 | 249 | 150 |
| 391 | 14 | 251 | 152 |
| 392 | 16 | 253 | 154 |
| 393 | 18 | 255 | 156 |
| 394 | 20 | 1 | 158 |
| 395 | 22 | 3 | 160 |
| 396 | 24 | 5 | 162 |

TABLE 4-continued

H(3, 2)

| b | c | c | c |
|---|---|---|---|
| 397 | 26 | 7 | 164 |
| 398 | 28 | 9 | 166 |
| 399 | 30 | 11 | 168 |
| 400 | 32 | 13 | 170 |
| 401 | 34 | 15 | 172 |
| 402 | 36 | 17 | 174 |
| 403 | 38 | 19 | 176 |
| 404 | 40 | 21 | 178 |
| 405 | 42 | 23 | 180 |
| 406 | 44 | 25 | 182 |
| 407 | 46 | 27 | 184 |
| 408 | 48 | 29 | 186 |
| 409 | 50 | 31 | 188 |
| 410 | 52 | 33 | 190 |
| 411 | 54 | 35 | 192 |
| 412 | 56 | 37 | 194 |
| 413 | 58 | 39 | 196 |
| 414 | 60 | 41 | 198 |
| 415 | 62 | 43 | 200 |
| 416 | 64 | 45 | 202 |
| 417 | 66 | 47 | 204 |
| 418 | 68 | 49 | 206 |
| 419 | 70 | 51 | 208 |
| 420 | 72 | 53 | 210 |
| 421 | 74 | 55 | 212 |
| 422 | 76 | 57 | 214 |
| 423 | 78 | 59 | 216 |
| 424 | 80 | 61 | 218 |
| 425 | 82 | 63 | 220 |
| 426 | 84 | 65 | 222 |
| 427 | 86 | 67 | 224 |
| 428 | 88 | 69 | 226 |
| 429 | 90 | 71 | 228 |
| 430 | 92 | 73 | 230 |
| 431 | 94 | 75 | 232 |
| 432 | 96 | 77 | 234 |
| 433 | 98 | 79 | 236 |
| 434 | 100 | 81 | 238 |
| 435 | 102 | 83 | 240 |
| 436 | 104 | 85 | 242 |
| 437 | 106 | 87 | 244 |
| 438 | 108 | 89 | 246 |
| 439 | 110 | 91 | 248 |
| 440 | 112 | 93 | 250 |
| 441 | 114 | 95 | 252 |
| 442 | 116 | 97 | 254 |
| 443 | 118 | 99 | 256 |
| 444 | 120 | 101 | 2 |
| 445 | 122 | 103 | 4 |
| 446 | 124 | 105 | 6 |
| 447 | 126 | 107 | 8 |
| 448 | 128 | 109 | 10 |
| 449 | 130 | 111 | 12 |
| 450 | 132 | 113 | 14 |
| 451 | 134 | 115 | 16 |
| 452 | 136 | 117 | 18 |
| 453 | 138 | 119 | 20 |
| 454 | 140 | 121 | 22 |
| 455 | 142 | 123 | 24 |
| 456 | 144 | 125 | 26 |
| 457 | 146 | 127 | 28 |
| 458 | 148 | 129 | 30 |
| 459 | 150 | 131 | 32 |
| 460 | 152 | 133 | 34 |
| 461 | 154 | 135 | 36 |
| 462 | 156 | 137 | 38 |
| 463 | 158 | 139 | 40 |
| 464 | 160 | 141 | 42 |
| 465 | 162 | 143 | 44 |
| 466 | 164 | 145 | 46 |
| 467 | 166 | 147 | 48 |
| 468 | 168 | 149 | 50 |
| 469 | 170 | 151 | 52 |
| 470 | 172 | 153 | 54 |
| 471 | 174 | 155 | 56 |
| 472 | 176 | 157 | 58 |
| 473 | 178 | 159 | 60 |
| 474 | 180 | 161 | 62 |
| 475 | 182 | 163 | 64 |
| 476 | 184 | 165 | 66 |
| 477 | 186 | 167 | 68 |
| 478 | 188 | 169 | 70 |
| 479 | 190 | 171 | 72 |
| 480 | 192 | 173 | 74 |
| 481 | 194 | 175 | 76 |
| 482 | 196 | 177 | 78 |
| 483 | 198 | 179 | 80 |
| 484 | 200 | 181 | 82 |
| 485 | 202 | 183 | 84 |
| 486 | 204 | 185 | 86 |
| 487 | 206 | 187 | 88 |
| 488 | 208 | 189 | 90 |
| 489 | 210 | 191 | 92 |
| 490 | 212 | 193 | 94 |
| 491 | 214 | 195 | 96 |
| 492 | 216 | 197 | 98 |
| 493 | 218 | 199 | 100 |
| 494 | 220 | 201 | 102 |
| 495 | 222 | 203 | 104 |
| 496 | 224 | 205 | 106 |
| 497 | 226 | 207 | 108 |
| 498 | 228 | 209 | 110 |
| 499 | 230 | 211 | 112 |
| 500 | 232 | 213 | 114 |
| 501 | 234 | 215 | 116 |
| 502 | 236 | 217 | 118 |
| 503 | 238 | 219 | 120 |
| 504 | 240 | 221 | 122 |
| 505 | 242 | 223 | 124 |
| 506 | 244 | 225 | 126 |
| 507 | 246 | 227 | 128 |
| 508 | 248 | 229 | 130 |
| 509 | 250 | 231 | 132 |
| 510 | 252 | 233 | 134 |
| 511 | 254 | 235 | 136 |
| 512 | 256 | 237 | 138 |

TABLE 5

H(3, 3)

| b | c | c | c |
|---|---|---|---|
| 513 | 1 | 36 | 219 |
| 514 | 3 | 38 | 221 |
| 515 | 5 | 40 | 223 |
| 516 | 7 | 42 | 225 |
| 517 | 9 | 44 | 227 |
| 518 | 11 | 46 | 229 |
| 519 | 13 | 48 | 231 |
| 520 | 15 | 50 | 233 |
| 521 | 17 | 52 | 235 |
| 522 | 19 | 54 | 237 |
| 523 | 21 | 56 | 239 |
| 524 | 23 | 58 | 241 |
| 525 | 25 | 60 | 243 |
| 526 | 27 | 62 | 245 |
| 527 | 29 | 64 | 247 |
| 528 | 31 | 66 | 249 |
| 529 | 33 | 68 | 251 |
| 530 | 35 | 70 | 253 |
| 531 | 37 | 72 | 255 |
| 532 | 39 | 74 | 1 |
| 533 | 41 | 76 | 3 |
| 534 | 43 | 78 | 5 |
| 535 | 45 | 80 | 7 |
| 536 | 47 | 82 | 9 |

TABLE 5-continued

H(3, 3)

| b | c | c | c |
|---|---|---|---|
| 537 | 49 | 84 | 11 |
| 538 | 51 | 86 | 13 |
| 539 | 53 | 88 | 15 |
| 540 | 55 | 90 | 17 |
| 541 | 57 | 92 | 19 |
| 542 | 59 | 94 | 21 |
| 543 | 61 | 96 | 23 |
| 544 | 63 | 98 | 25 |
| 545 | 65 | 100 | 27 |
| 546 | 67 | 102 | 29 |
| 547 | 69 | 104 | 31 |
| 548 | 71 | 106 | 33 |
| 549 | 73 | 108 | 35 |
| 550 | 75 | 110 | 37 |
| 551 | 77 | 112 | 39 |
| 552 | 79 | 114 | 41 |
| 553 | 81 | 116 | 43 |
| 554 | 83 | 118 | 45 |
| 555 | 85 | 120 | 47 |
| 556 | 87 | 122 | 49 |
| 557 | 89 | 124 | 51 |
| 558 | 91 | 126 | 53 |
| 559 | 93 | 128 | 55 |
| 560 | 95 | 130 | 57 |
| 561 | 97 | 132 | 59 |
| 562 | 99 | 134 | 61 |
| 563 | 101 | 136 | 63 |
| 564 | 103 | 138 | 65 |
| 565 | 105 | 140 | 67 |
| 566 | 107 | 142 | 69 |
| 567 | 109 | 144 | 71 |
| 568 | 111 | 146 | 73 |
| 569 | 113 | 148 | 75 |
| 570 | 115 | 150 | 77 |
| 571 | 117 | 152 | 79 |
| 572 | 119 | 154 | 81 |
| 573 | 121 | 156 | 83 |
| 574 | 123 | 158 | 85 |
| 575 | 125 | 160 | 87 |
| 576 | 127 | 162 | 89 |
| 577 | 129 | 164 | 91 |
| 578 | 131 | 166 | 93 |
| 579 | 133 | 168 | 95 |
| 580 | 135 | 170 | 97 |
| 581 | 137 | 172 | 99 |
| 582 | 139 | 174 | 101 |
| 583 | 141 | 176 | 103 |
| 584 | 143 | 178 | 105 |
| 585 | 145 | 180 | 107 |
| 586 | 147 | 182 | 109 |
| 587 | 149 | 184 | 111 |
| 588 | 151 | 186 | 113 |
| 589 | 153 | 188 | 115 |
| 590 | 155 | 190 | 117 |
| 591 | 157 | 192 | 119 |
| 592 | 159 | 194 | 121 |
| 593 | 161 | 196 | 123 |
| 594 | 163 | 198 | 125 |
| 595 | 165 | 200 | 127 |
| 596 | 167 | 202 | 129 |
| 597 | 169 | 204 | 131 |
| 598 | 171 | 206 | 133 |
| 599 | 173 | 208 | 135 |
| 600 | 175 | 210 | 137 |
| 601 | 177 | 212 | 139 |
| 602 | 179 | 214 | 141 |
| 603 | 181 | 216 | 143 |
| 604 | 183 | 218 | 145 |
| 605 | 185 | 220 | 147 |
| 606 | 187 | 222 | 149 |
| 607 | 189 | 224 | 151 |
| 608 | 191 | 226 | 153 |
| 609 | 193 | 228 | 155 |
| 610 | 195 | 230 | 157 |
| 611 | 197 | 232 | 159 |

TABLE 5-continued

H(3, 3)

| b | c | c | c |
|---|---|---|---|
| 612 | 199 | 234 | 161 |
| 613 | 201 | 236 | 163 |
| 614 | 203 | 238 | 165 |
| 615 | 205 | 240 | 167 |
| 616 | 207 | 242 | 169 |
| 617 | 209 | 244 | 171 |
| 618 | 211 | 246 | 173 |
| 619 | 213 | 248 | 175 |
| 620 | 215 | 250 | 177 |
| 621 | 217 | 252 | 179 |
| 622 | 219 | 254 | 181 |
| 623 | 221 | 256 | 183 |
| 624 | 223 | 2 | 185 |
| 625 | 225 | 4 | 187 |
| 626 | 227 | 6 | 189 |
| 627 | 229 | 8 | 191 |
| 628 | 231 | 10 | 193 |
| 629 | 233 | 12 | 195 |
| 630 | 235 | 14 | 197 |
| 631 | 237 | 16 | 199 |
| 632 | 239 | 18 | 201 |
| 633 | 241 | 20 | 203 |
| 634 | 243 | 22 | 205 |
| 635 | 245 | 24 | 207 |
| 636 | 247 | 26 | 209 |
| 637 | 249 | 28 | 211 |
| 638 | 251 | 30 | 213 |
| 639 | 253 | 32 | 215 |
| 640 | 255 | 34 | 217 |

TABLE 6

H(3, 4)

| b | c | c | c |
|---|---|---|---|
| 641 | 2 | 127 | 216 |
| 642 | 4 | 129 | 218 |
| 643 | 6 | 131 | 220 |
| 644 | 8 | 133 | 222 |
| 645 | 10 | 135 | 224 |
| 646 | 12 | 137 | 226 |
| 647 | 14 | 139 | 228 |
| 648 | 16 | 141 | 230 |
| 649 | 18 | 143 | 232 |
| 650 | 20 | 145 | 234 |
| 651 | 22 | 147 | 236 |
| 652 | 24 | 149 | 238 |
| 653 | 26 | 151 | 240 |
| 654 | 28 | 153 | 242 |
| 655 | 30 | 155 | 244 |
| 656 | 32 | 157 | 246 |
| 657 | 34 | 159 | 248 |
| 658 | 36 | 161 | 250 |
| 659 | 38 | 163 | 252 |
| 660 | 40 | 165 | 254 |
| 661 | 42 | 167 | 256 |
| 662 | 44 | 169 | 2 |
| 663 | 46 | 171 | 4 |
| 664 | 48 | 173 | 6 |
| 665 | 50 | 175 | 8 |
| 666 | 52 | 177 | 10 |
| 667 | 54 | 179 | 12 |
| 668 | 56 | 181 | 14 |
| 669 | 58 | 183 | 16 |
| 670 | 60 | 185 | 18 |
| 671 | 62 | 187 | 20 |
| 672 | 64 | 189 | 22 |
| 673 | 66 | 191 | 24 |
| 674 | 68 | 193 | 26 |
| 675 | 70 | 195 | 28 |
| 676 | 72 | 197 | 30 |

TABLE 6-continued

H(3, 4)

| b | c | c | c |
|---|---|---|---|
| 677 | 74 | 199 | 32 |
| 678 | 76 | 201 | 34 |
| 679 | 78 | 203 | 36 |
| 680 | 80 | 205 | 38 |
| 681 | 82 | 207 | 40 |
| 682 | 84 | 209 | 42 |
| 683 | 86 | 211 | 44 |
| 684 | 88 | 213 | 46 |
| 685 | 90 | 215 | 48 |
| 686 | 92 | 217 | 50 |
| 687 | 94 | 219 | 52 |
| 688 | 96 | 221 | 54 |
| 689 | 98 | 223 | 56 |
| 690 | 100 | 225 | 58 |
| 691 | 102 | 227 | 60 |
| 692 | 104 | 229 | 62 |
| 693 | 106 | 231 | 64 |
| 694 | 108 | 233 | 66 |
| 695 | 110 | 235 | 68 |
| 696 | 112 | 237 | 70 |
| 697 | 114 | 239 | 72 |
| 698 | 116 | 241 | 74 |
| 699 | 118 | 243 | 76 |
| 700 | 120 | 245 | 78 |
| 701 | 122 | 247 | 80 |
| 702 | 124 | 249 | 82 |
| 703 | 126 | 251 | 84 |
| 704 | 128 | 253 | 86 |
| 705 | 130 | 255 | 88 |
| 706 | 132 | 1 | 90 |
| 707 | 134 | 3 | 92 |
| 708 | 136 | 5 | 94 |
| 709 | 138 | 7 | 96 |
| 710 | 140 | 9 | 98 |
| 711 | 142 | 11 | 100 |
| 712 | 144 | 13 | 102 |
| 713 | 146 | 15 | 104 |
| 714 | 148 | 17 | 106 |
| 715 | 150 | 19 | 108 |
| 716 | 152 | 21 | 110 |
| 717 | 154 | 23 | 112 |
| 718 | 156 | 25 | 114 |
| 719 | 158 | 27 | 116 |
| 720 | 160 | 29 | 118 |
| 721 | 162 | 31 | 120 |
| 722 | 164 | 33 | 122 |
| 723 | 166 | 35 | 124 |
| 724 | 168 | 37 | 126 |
| 725 | 170 | 39 | 128 |
| 726 | 172 | 41 | 130 |
| 727 | 174 | 43 | 132 |
| 728 | 176 | 45 | 134 |
| 729 | 178 | 47 | 136 |
| 730 | 180 | 49 | 138 |
| 731 | 182 | 51 | 140 |
| 732 | 184 | 53 | 142 |
| 733 | 186 | 55 | 144 |
| 734 | 188 | 57 | 146 |
| 735 | 190 | 59 | 148 |
| 736 | 192 | 61 | 150 |
| 737 | 194 | 63 | 152 |
| 738 | 196 | 65 | 154 |
| 739 | 198 | 67 | 156 |
| 740 | 200 | 69 | 158 |
| 741 | 202 | 71 | 160 |
| 742 | 204 | 73 | 162 |
| 743 | 206 | 75 | 164 |
| 744 | 208 | 77 | 166 |
| 745 | 210 | 79 | 168 |
| 746 | 212 | 81 | 170 |
| 747 | 214 | 83 | 172 |
| 748 | 216 | 85 | 174 |
| 749 | 218 | 87 | 176 |
| 750 | 220 | 89 | 178 |
| 751 | 222 | 91 | 180 |

TABLE 6-continued

H(3, 4)

| b | c | c | c |
|---|---|---|---|
| 752 | 224 | 93 | 182 |
| 753 | 226 | 95 | 184 |
| 754 | 228 | 97 | 186 |
| 755 | 230 | 99 | 188 |
| 756 | 232 | 101 | 190 |
| 757 | 234 | 103 | 192 |
| 758 | 236 | 105 | 194 |
| 759 | 238 | 107 | 196 |
| 760 | 240 | 109 | 198 |
| 761 | 242 | 111 | 200 |
| 762 | 244 | 113 | 202 |
| 763 | 246 | 115 | 204 |
| 764 | 248 | 117 | 206 |
| 765 | 250 | 119 | 208 |
| 766 | 252 | 121 | 210 |
| 767 | 254 | 123 | 212 |
| 768 | 256 | 125 | 214 |

TABLE 7

H(3, 5)

| b | c | c | c |
|---|---|---|---|
| 769 | 1 | 82 | 53 |
| 770 | 3 | 84 | 55 |
| 771 | 5 | 86 | 57 |
| 772 | 7 | 88 | 59 |
| 773 | 9 | 90 | 61 |
| 774 | 11 | 92 | 63 |
| 775 | 13 | 94 | 65 |
| 776 | 15 | 96 | 67 |
| 777 | 17 | 98 | 69 |
| 778 | 19 | 100 | 71 |
| 779 | 21 | 102 | 73 |
| 780 | 23 | 104 | 75 |
| 781 | 25 | 106 | 77 |
| 782 | 27 | 108 | 79 |
| 783 | 29 | 110 | 81 |
| 784 | 31 | 112 | 83 |
| 785 | 33 | 114 | 85 |
| 786 | 35 | 116 | 87 |
| 787 | 37 | 118 | 89 |
| 788 | 39 | 120 | 91 |
| 789 | 41 | 122 | 93 |
| 790 | 43 | 124 | 95 |
| 791 | 45 | 126 | 97 |
| 792 | 47 | 128 | 99 |
| 793 | 49 | 130 | 101 |
| 794 | 51 | 132 | 103 |
| 795 | 53 | 134 | 105 |
| 796 | 55 | 136 | 107 |
| 797 | 57 | 138 | 109 |
| 798 | 59 | 140 | 111 |
| 799 | 61 | 142 | 113 |
| 800 | 63 | 144 | 115 |
| 801 | 65 | 146 | 117 |
| 802 | 67 | 148 | 119 |
| 803 | 69 | 150 | 121 |
| 804 | 71 | 152 | 123 |
| 805 | 73 | 154 | 125 |
| 806 | 75 | 156 | 127 |
| 807 | 77 | 158 | 129 |
| 808 | 79 | 160 | 131 |
| 809 | 81 | 162 | 133 |
| 810 | 83 | 164 | 135 |
| 811 | 85 | 166 | 137 |
| 812 | 87 | 168 | 139 |
| 813 | 89 | 170 | 141 |
| 814 | 91 | 172 | 143 |
| 815 | 93 | 174 | 145 |
| 816 | 95 | 176 | 147 |

TABLE 7-continued

H(3, 5)

| b | c | c | c |
|---|---|---|---|
| 817 | 97 | 178 | 149 |
| 818 | 99 | 180 | 151 |
| 819 | 101 | 182 | 153 |
| 820 | 103 | 184 | 155 |
| 821 | 105 | 186 | 157 |
| 822 | 107 | 188 | 159 |
| 823 | 109 | 190 | 161 |
| 824 | 111 | 192 | 163 |
| 825 | 113 | 194 | 165 |
| 826 | 115 | 196 | 167 |
| 827 | 117 | 198 | 169 |
| 828 | 119 | 200 | 171 |
| 829 | 121 | 202 | 173 |
| 830 | 123 | 204 | 175 |
| 831 | 125 | 206 | 177 |
| 832 | 127 | 208 | 179 |
| 833 | 129 | 210 | 181 |
| 834 | 131 | 212 | 183 |
| 835 | 133 | 214 | 185 |
| 836 | 135 | 216 | 187 |
| 837 | 137 | 218 | 189 |
| 838 | 139 | 220 | 191 |
| 839 | 141 | 222 | 193 |
| 840 | 143 | 224 | 195 |
| 841 | 145 | 226 | 197 |
| 842 | 147 | 228 | 199 |
| 843 | 149 | 230 | 201 |
| 844 | 151 | 232 | 203 |
| 845 | 153 | 234 | 205 |
| 846 | 155 | 236 | 207 |
| 847 | 157 | 238 | 209 |
| 848 | 159 | 240 | 211 |
| 849 | 161 | 242 | 213 |
| 850 | 163 | 244 | 215 |
| 851 | 165 | 246 | 217 |
| 852 | 167 | 248 | 219 |
| 853 | 169 | 250 | 221 |
| 854 | 171 | 252 | 223 |
| 855 | 173 | 254 | 225 |
| 856 | 175 | 256 | 227 |
| 857 | 177 | 2 | 229 |
| 858 | 179 | 4 | 231 |
| 859 | 181 | 6 | 233 |
| 860 | 183 | 8 | 235 |
| 861 | 185 | 10 | 237 |
| 862 | 187 | 12 | 239 |
| 863 | 189 | 14 | 241 |
| 864 | 191 | 16 | 243 |
| 865 | 193 | 18 | 245 |
| 866 | 195 | 20 | 247 |
| 867 | 197 | 22 | 249 |
| 868 | 199 | 24 | 251 |
| 869 | 201 | 26 | 253 |
| 870 | 203 | 28 | 255 |
| 871 | 205 | 30 | 1 |
| 872 | 207 | 32 | 3 |
| 873 | 209 | 34 | 5 |
| 874 | 211 | 36 | 7 |
| 875 | 213 | 38 | 9 |
| 876 | 215 | 40 | 11 |
| 877 | 217 | 42 | 13 |
| 878 | 219 | 44 | 15 |
| 879 | 221 | 46 | 17 |
| 880 | 223 | 48 | 19 |
| 881 | 225 | 50 | 21 |
| 882 | 227 | 52 | 23 |
| 883 | 229 | 54 | 25 |
| 884 | 231 | 56 | 27 |
| 885 | 233 | 58 | 29 |
| 886 | 235 | 60 | 31 |
| 887 | 237 | 62 | 33 |
| 888 | 239 | 64 | 35 |
| 889 | 241 | 66 | 37 |
| 890 | 243 | 68 | 39 |
| 891 | 245 | 70 | 41 |

TABLE 7-continued

H(3, 5)

| b | c | c | c |
|---|---|---|---|
| 892 | 247 | 72 | 43 |
| 893 | 249 | 74 | 45 |
| 894 | 251 | 76 | 47 |
| 895 | 253 | 78 | 49 |
| 896 | 255 | 80 | 51 |

TABLE 8

H(3, 6)

| b | c | c | c |
|---|---|---|---|
| 897 | 2 | 251 | 226 |
| 898 | 4 | 253 | 228 |
| 899 | 6 | 255 | 230 |
| 900 | 8 | 1 | 232 |
| 901 | 10 | 3 | 234 |
| 902 | 12 | 5 | 236 |
| 903 | 14 | 7 | 238 |
| 904 | 16 | 9 | 240 |
| 905 | 18 | 11 | 242 |
| 906 | 20 | 13 | 244 |
| 907 | 22 | 15 | 246 |
| 908 | 24 | 17 | 248 |
| 909 | 26 | 19 | 250 |
| 910 | 28 | 21 | 252 |
| 911 | 30 | 23 | 254 |
| 912 | 32 | 25 | 256 |
| 913 | 34 | 27 | 2 |
| 914 | 36 | 29 | 4 |
| 915 | 38 | 31 | 6 |
| 916 | 40 | 33 | 8 |
| 917 | 42 | 35 | 10 |
| 918 | 44 | 37 | 12 |
| 919 | 46 | 39 | 14 |
| 920 | 48 | 41 | 16 |
| 921 | 50 | 43 | 18 |
| 922 | 52 | 45 | 20 |
| 923 | 54 | 47 | 22 |
| 924 | 56 | 49 | 24 |
| 925 | 58 | 51 | 26 |
| 926 | 60 | 53 | 28 |
| 927 | 62 | 55 | 30 |
| 928 | 64 | 57 | 32 |
| 929 | 66 | 59 | 34 |
| 930 | 68 | 61 | 36 |
| 931 | 70 | 63 | 38 |
| 932 | 72 | 65 | 40 |
| 933 | 74 | 67 | 42 |
| 934 | 76 | 69 | 44 |
| 935 | 78 | 71 | 46 |
| 936 | 80 | 73 | 48 |
| 937 | 82 | 75 | 50 |
| 938 | 84 | 77 | 52 |
| 939 | 86 | 79 | 54 |
| 940 | 88 | 81 | 56 |
| 941 | 90 | 83 | 58 |
| 942 | 92 | 85 | 60 |
| 943 | 94 | 87 | 62 |
| 944 | 96 | 89 | 64 |
| 945 | 98 | 91 | 66 |
| 946 | 100 | 93 | 68 |
| 947 | 102 | 95 | 70 |
| 948 | 104 | 97 | 72 |
| 949 | 106 | 99 | 74 |
| 950 | 108 | 101 | 76 |
| 951 | 110 | 103 | 78 |
| 952 | 112 | 105 | 80 |
| 953 | 114 | 107 | 82 |
| 954 | 116 | 109 | 84 |
| 955 | 118 | 111 | 86 |
| 956 | 120 | 113 | 88 |

TABLE 8-continued

H(3, 6)

| b | c | c | c |
|---|---|---|---|
| 957 | 122 | 115 | 90 |
| 958 | 124 | 117 | 92 |
| 959 | 126 | 119 | 94 |
| 960 | 128 | 121 | 96 |
| 961 | 130 | 123 | 98 |
| 962 | 132 | 125 | 100 |
| 963 | 134 | 127 | 102 |
| 964 | 136 | 129 | 104 |
| 965 | 138 | 131 | 106 |
| 966 | 140 | 133 | 108 |
| 967 | 142 | 135 | 110 |
| 968 | 144 | 137 | 112 |
| 969 | 146 | 139 | 114 |
| 970 | 148 | 141 | 116 |
| 971 | 150 | 143 | 118 |
| 972 | 152 | 145 | 120 |
| 973 | 154 | 147 | 122 |
| 974 | 156 | 149 | 124 |
| 975 | 158 | 151 | 126 |
| 976 | 160 | 153 | 128 |
| 977 | 162 | 155 | 130 |
| 978 | 164 | 157 | 132 |
| 979 | 166 | 159 | 134 |
| 980 | 168 | 161 | 136 |
| 981 | 170 | 163 | 138 |
| 982 | 172 | 165 | 140 |
| 983 | 174 | 167 | 142 |
| 984 | 176 | 169 | 144 |
| 985 | 178 | 171 | 146 |
| 986 | 180 | 173 | 148 |
| 987 | 182 | 175 | 150 |
| 988 | 184 | 177 | 152 |
| 989 | 186 | 179 | 154 |
| 990 | 188 | 181 | 156 |
| 991 | 190 | 183 | 158 |
| 992 | 192 | 185 | 160 |
| 993 | 194 | 187 | 162 |
| 994 | 196 | 189 | 164 |
| 995 | 198 | 191 | 166 |
| 996 | 200 | 193 | 168 |
| 997 | 202 | 195 | 170 |
| 998 | 204 | 197 | 172 |
| 999 | 206 | 199 | 174 |
| 1000 | 208 | 201 | 176 |
| 1001 | 210 | 203 | 178 |
| 1002 | 212 | 205 | 180 |
| 1003 | 214 | 207 | 182 |
| 1004 | 216 | 209 | 184 |
| 1005 | 218 | 211 | 186 |
| 1006 | 220 | 213 | 188 |
| 1007 | 222 | 215 | 190 |
| 1008 | 224 | 217 | 192 |
| 1009 | 226 | 219 | 194 |
| 1010 | 228 | 221 | 196 |
| 1011 | 230 | 223 | 198 |
| 1012 | 232 | 225 | 200 |
| 1013 | 234 | 227 | 202 |
| 1014 | 236 | 229 | 204 |
| 1015 | 238 | 231 | 206 |
| 1016 | 240 | 233 | 208 |
| 1017 | 242 | 235 | 210 |
| 1018 | 244 | 237 | 212 |
| 1019 | 246 | 239 | 214 |
| 1020 | 248 | 241 | 216 |
| 1021 | 250 | 243 | 218 |
| 1022 | 252 | 245 | 220 |
| 1023 | 254 | 247 | 222 |
| 1024 | 256 | 249 | 224 |

TABLE 9

H(d)

| b | c | c |
|---|---|---|
| 1025 | 1 | 2 |
| 1026 | 2 | 3 |
| 1027 | 3 | 4 |
| 1028 | 4 | 5 |
| 1029 | 5 | 6 |
| 1030 | 6 | 7 |
| 1031 | 7 | 8 |
| 1032 | 8 | 9 |
| 1033 | 9 | 10 |
| 1034 | 10 | 11 |
| 1035 | 11 | 12 |
| 1036 | 12 | 13 |
| 1037 | 13 | 14 |
| 1038 | 14 | 15 |
| 1039 | 15 | 16 |
| 1040 | 16 | 17 |
| 1041 | 17 | 18 |
| 1042 | 18 | 19 |
| 1043 | 19 | 20 |
| 1044 | 20 | 21 |
| 1045 | 21 | 22 |
| 1046 | 22 | 23 |
| 1047 | 23 | 24 |
| 1048 | 24 | 25 |
| 1049 | 25 | 26 |
| 1050 | 26 | 27 |
| 1051 | 27 | 28 |
| 1052 | 28 | 29 |
| 1053 | 29 | 30 |
| 1054 | 30 | 31 |
| 1055 | 31 | 32 |
| 1056 | 32 | 33 |
| 1057 | 33 | 34 |
| 1058 | 34 | 35 |
| 1059 | 35 | 36 |
| 1060 | 36 | 37 |
| 1061 | 37 | 38 |
| 1062 | 38 | 39 |
| 1063 | 39 | 40 |
| 1064 | 40 | 41 |
| 1065 | 41 | 42 |
| 1066 | 42 | 43 |
| 1067 | 43 | 44 |
| 1068 | 44 | 45 |
| 1069 | 45 | 46 |
| 1070 | 46 | 47 |
| 1071 | 47 | 48 |
| 1072 | 48 | 49 |
| 1073 | 49 | 50 |
| 1074 | 50 | 51 |
| 1075 | 51 | 52 |
| 1076 | 52 | 53 |
| 1077 | 53 | 54 |
| 1078 | 54 | 55 |
| 1079 | 55 | 56 |
| 1080 | 56 | 57 |
| 1081 | 57 | 58 |
| 1082 | 58 | 59 |
| 1083 | 59 | 60 |
| 1084 | 60 | 61 |
| 1085 | 61 | 62 |
| 1086 | 62 | 63 |
| 1087 | 63 | 64 |
| 1088 | 64 | 65 |
| 1089 | 65 | 66 |
| 1090 | 66 | 67 |
| 1091 | 67 | 68 |
| 1092 | 68 | 69 |
| 1093 | 69 | 70 |
| 1094 | 70 | 71 |
| 1095 | 71 | 72 |
| 1096 | 72 | 73 |
| 1097 | 73 | 74 |
| 1098 | 74 | 75 |
| 1099 | 75 | 76 |

TABLE 9-continued

| | H(d) | |
|---|---|---|
| b | c | c |
| 1100 | 76 | 77 |
| 1101 | 77 | 78 |
| 1102 | 78 | 79 |
| 1103 | 79 | 80 |
| 1104 | 80 | 81 |
| 1105 | 81 | 82 |
| 1106 | 82 | 83 |
| 1107 | 83 | 84 |
| 1108 | 84 | 85 |
| 1109 | 85 | 86 |
| 1110 | 86 | 87 |
| 1111 | 87 | 88 |
| 1112 | 88 | 89 |
| 1113 | 89 | 90 |
| 1114 | 90 | 91 |
| 1115 | 91 | 92 |
| 1116 | 92 | 93 |
| 1117 | 93 | 94 |
| 1118 | 94 | 95 |
| 1119 | 95 | 96 |
| 1120 | 96 | 97 |
| 1121 | 97 | 98 |
| 1122 | 98 | 99 |
| 1123 | 99 | 100 |
| 1124 | 100 | 101 |
| 1125 | 101 | 102 |
| 1126 | 102 | 103 |
| 1127 | 103 | 104 |
| 1128 | 104 | 105 |
| 1129 | 105 | 106 |
| 1130 | 106 | 107 |
| 1131 | 107 | 108 |
| 1132 | 108 | 109 |
| 1133 | 109 | 110 |
| 1134 | 110 | 111 |
| 1135 | 111 | 112 |
| 1136 | 112 | 113 |
| 1137 | 113 | 114 |
| 1138 | 114 | 115 |
| 1139 | 115 | 116 |
| 1140 | 116 | 117 |
| 1141 | 117 | 118 |
| 1142 | 118 | 119 |
| 1143 | 119 | 120 |
| 1144 | 120 | 121 |
| 1145 | 121 | 122 |
| 1146 | 122 | 123 |
| 1147 | 123 | 124 |
| 1148 | 124 | 125 |
| 1149 | 125 | 126 |
| 1150 | 126 | 127 |
| 1151 | 127 | 128 |
| 1152 | 128 | 129 |
| 1153 | 129 | 130 |
| 1154 | 130 | 131 |
| 1155 | 131 | 132 |
| 1156 | 132 | 133 |
| 1157 | 133 | 134 |
| 1158 | 134 | 135 |
| 1159 | 135 | 136 |
| 1160 | 136 | 137 |
| 1161 | 137 | 138 |
| 1162 | 138 | 139 |
| 1163 | 139 | 140 |
| 1164 | 140 | 141 |
| 1165 | 141 | 142 |
| 1166 | 142 | 143 |
| 1167 | 143 | 144 |
| 1168 | 144 | 145 |
| 1169 | 145 | 146 |
| 1170 | 146 | 147 |
| 1171 | 147 | 148 |
| 1172 | 148 | 149 |
| 1173 | 149 | 150 |
| 1174 | 150 | 151 |
| 1175 | 151 | 152 |
| 1176 | 152 | 153 |
| 1177 | 153 | 154 |
| 1178 | 154 | 155 |
| 1179 | 155 | 156 |
| 1180 | 156 | 157 |
| 1181 | 157 | 158 |
| 1182 | 158 | 159 |
| 1183 | 159 | 160 |
| 1184 | 160 | 161 |
| 1185 | 161 | 162 |
| 1186 | 162 | 163 |
| 1187 | 163 | 164 |
| 1188 | 164 | 165 |
| 1189 | 165 | 166 |
| 1190 | 166 | 167 |
| 1191 | 167 | 168 |
| 1192 | 168 | 169 |
| 1193 | 169 | 170 |
| 1194 | 170 | 171 |
| 1195 | 171 | 172 |
| 1196 | 172 | 173 |
| 1197 | 173 | 174 |
| 1198 | 174 | 175 |
| 1199 | 175 | 176 |
| 1200 | 176 | 177 |
| 1201 | 177 | 178 |
| 1202 | 178 | 179 |
| 1203 | 179 | 180 |
| 1204 | 180 | 181 |
| 1205 | 181 | 182 |
| 1206 | 182 | 183 |
| 1207 | 183 | 184 |
| 1208 | 184 | 185 |
| 1209 | 185 | 186 |
| 1210 | 186 | 187 |
| 1211 | 187 | 188 |
| 1212 | 188 | 189 |
| 1213 | 189 | 190 |
| 1214 | 190 | 191 |
| 1215 | 191 | 192 |
| 1216 | 192 | 193 |
| 1217 | 193 | 194 |
| 1218 | 194 | 195 |
| 1219 | 195 | 196 |
| 1220 | 196 | 197 |
| 1221 | 197 | 198 |
| 1222 | 198 | 199 |
| 1223 | 199 | 200 |
| 1224 | 200 | 201 |
| 1225 | 201 | 202 |
| 1226 | 202 | 203 |
| 1227 | 203 | 204 |
| 1228 | 204 | 205 |
| 1229 | 205 | 206 |
| 1230 | 206 | 207 |
| 1231 | 207 | 208 |
| 1232 | 208 | 209 |
| 1233 | 209 | 210 |
| 1234 | 210 | 211 |
| 1235 | 211 | 212 |
| 1236 | 212 | 213 |
| 1237 | 213 | 214 |
| 1238 | 214 | 215 |
| 1239 | 215 | 216 |
| 1240 | 216 | 217 |
| 1241 | 217 | 218 |
| 1242 | 218 | 219 |
| 1243 | 219 | 220 |
| 1244 | 220 | 221 |
| 1245 | 221 | 222 |
| 1246 | 222 | 223 |
| 1247 | 223 | 224 |
| 1248 | 224 | 225 |
| 1249 | 225 | 226 |

TABLE 9-continued

| H(d) | | |
|---|---|---|
| b | c | c |
| 1250 | 226 | 227 |
| 1251 | 227 | 228 |
| 1252 | 228 | 229 |
| 1253 | 229 | 230 |
| 1254 | 230 | 231 |
| 1255 | 231 | 232 |
| 1256 | 232 | 233 |
| 1257 | 233 | 234 |
| 1258 | 234 | 235 |
| 1259 | 235 | 236 |
| 1260 | 236 | 237 |
| 1261 | 237 | 238 |
| 1262 | 238 | 239 |
| 1263 | 239 | 240 |
| 1264 | 240 | 241 |
| 1265 | 241 | 242 |
| 1266 | 242 | 243 |
| 1267 | 243 | 244 |
| 1268 | 244 | 245 |
| 1269 | 245 | 246 |
| 1270 | 246 | 247 |
| 1271 | 247 | 248 |
| 1272 | 248 | 249 |
| 1273 | 249 | 250 |
| 1274 | 250 | 251 |
| 1275 | 251 | 252 |
| 1276 | 252 | 253 |
| 1277 | 253 | 254 |
| 1278 | 254 | 255 |
| 1279 | 255 | 256 |
| 1280 | 256 | |

What is claimed is:

1. A communication device that is operable to generate an LDPC (Low Density Parity Check) coded signal, the communication device comprising:
    an LDPC encoder that is operable to encode at least one information bit using a generator matrix, G, that has a corresponding parity check matrix, H, thereby generating an LDPC codeword that comprises at least one LDPC coded bit and at least one uncoded bit, wherein the at least one LDPC coded bit and the at least one uncoded bit of the LDPC codeword are arranged thereby forming a plurality LDPC symbols; and
    a symbol mapper that is operable to map the plurality of LDPC symbols according to a substantially evenly distributed 128 2-D (128 2-Dimensional) constellation, wherein the substantially evenly distributed 128 2-D constellation is generated from a 2-D 12-PAM (2-Dimensional 12-Pulse Amplitude Modulation) constellation comprising 144 possible constellation points that is evenly partitioned into 9 regions such that each region comprises 16 possible constellation points therein and such that 8 of the 9 regions comprise 14 constellation points therein and 1 of the 9 regions comprises all 16 possible constellation points therein.

2. The communication device of claim 1, wherein:
the at least one LDPC coded bit comprises 4 coded bits;
the at least one uncoded bit comprises 3 uncoded bits;
the 3 uncoded bits indicate which subset, among 8 subsets each containing 16 constellation points, to which the 4 coded bits correspond and are symbol mapped; and
for 7 of the 8 subsets, the 16 constellation points therein are distributed among at least 2 of the 9 regions.

3. The communication device of claim 1, wherein:
the LDPC coded signal is generated using an (1280, 1024) LDPC code; and
the parity check matrix, H, is provided within Appendix A.

4. The communication device of claim 1, wherein:
the LDPC coded signal is generated using an (1280, 1024) LDPC code; and
the parity check matrix, H, is provided within Appendix B.

5. The communication device of claim 1, wherein:
the at least one uncoded bit comprises 3 uncoded bits; and
the at least one LDPC coded bit comprises 4 LDPC coded bits.

6. The communication device of claim 5, wherein:
the 3 uncoded bits indicate which subset, among 8 subsets each containing 16 constellation points, to which the 4 LDPC coded bits correspond and are symbol mapped; and
the mapping of the 4 LDPC coded bits to the corresponding 16 constellation points within each of the 8 subsets is performed using Gray code mapping.

7. The communication device of claim 1, wherein:
the LDPC coded signal is generated using an (1280, 1024) LDPC code; and
the parity check matrix, H, is a 256×1280 matrix;
the (1280, 1024) LDPC code comprises 1 degree 1 bit node;
the (1280, 1024) LDPC code comprises 255 degree 2 bit nodes;
the (1280, 1024) LDPC code comprises 768 degree 3 bit nodes;
the (1280, 1024) LDPC code comprises 256 degree 7 bit nodes;
each check node of the (1280, 1024) LDPC code, except one check node comprising degree 17, comprises degree 18; and
an LDPC bipartite graph corresponding to the (1280, 1024) LDPC code comprises 4607 edges.

8. The communication device of claim 7, wherein:
the parity check matrix, H, is a 256×1280 matrix that may be decomposed into:
a first sub-matrix, $H_d$, that is a 256×1280 matrix;
a second sub-matrix, $H_7$, that is a 256×256 matrix that may be decomposed into 2 separate 2-cyclic sub-matrices; and
a third sub-matrix, $H_3$, that is a 256×768 matrix that may be decomposed into 6 separate 2-cyclic sub-matrices.

9. The communication device of claim 1, wherein:
the LDPC coded signal is generated using an (1280, 1024) LDPC code; and
a smallest loop size of an LDPC bipartite graph corresponding to the (1280, 1024) LDPC code is greater than or equal to 6.

10. The communication device of claim 1, wherein:
the communication device is a communication transceiver including a transmitter portion and a receiver portion;
the LDPC encoder and the symbol mapper are implemented in the transmitter portion; and
the receiver portion comprises a decoder that is operable to decode LDPC coded signals received from at least one additional communication device.

11. The communication device of claim 1, wherein:
the communication device is operable to support communication in accordance with recommended practices provided by the IEEE (Institute of Electrical & Electronics Engineers) P802.3an (10GBASE-T) Task Force.

12. A communication device that is operable to generate an LDPC (Low Density Parity Check) coded signal, the communication device comprising:
- an LDPC encoder that is operable to encode at least one information bit using a generator matrix, G, that has a corresponding parity check matrix, H, thereby generating an LDPC codeword that comprises at least one LDPC coded bit and at least one uncoded bit, wherein the at least one LDPC coded bit and the at least one uncoded bit of the LDPC codeword are arranged thereby forming a plurality LDPC symbols;
- a symbol mapper that is operable to map the plurality of LDPC symbols according to a substantially evenly distributed 128 2-D (128 2-Dimensional) constellation thereby generating a sequence of discrete-valued modulation symbols that comprises a digital format of the LDPC coded signal, wherein each symbol of the sequence of discrete-valued modulation symbols includes a pair of I, Q (In-phase, Quadrature) values, wherein the substantially evenly distributed 128 2-D constellation is generated from a 2-D 12-PAM (2-Dimensional 12-Pulse Amplitude Modulation) constellation comprising 144 possible constellation points that is evenly partitioned into 9 regions such that each region comprises 16 possible constellation points therein and such that 8 of the 9 regions comprise 14 constellation points therein and 1 of the 9 regions comprises all 16 possible constellation points therein;
- a DAC (Digital to Analog Converter) that is operable to generate a continuous-time baseband signal using each pair of I, Q values corresponding to each symbol of the sequence of discrete-valued modulation symbols; and
- a transmit driver that is operable to transform the continuous-time baseband signal to a continuous-time transmit signal and to launch the continuous-time transmit signal into a communication channel to which the communication device is communicatively coupled.

13. The communication device of claim 12, wherein:
the at least one uncoded bit comprises 3 uncoded bits; and
the at least one LDPC coded bit comprises 4 LDPC coded bits.

14. The communication device of claim 13, wherein:
the 3 uncoded bits indicate which subset, among 8 subsets each containing 16 constellation points, to which the 4 LDPC coded bits correspond and are symbol mapped; and
the mapping of the 4 LDPC coded bits to the corresponding 16 constellation points within each of the 8 subsets is performed using Gray code mapping.

15. The communication device of claim 12, wherein:
the LDPC coded signal is generated using an (1280, 1024) LDPC code; and
a smallest loop size of an LDPC bipartite graph corresponding to the (1280, 1024) LDPC code is greater than or equal to 6.

16. The communication device of claim 12, wherein:
the communication device is a communication transceiver including a transmitter portion and a receiver portion;
the LDPC encoder, the symbol mapper, the DAC, and the transmit driver are implemented in the transmitter portion; and
the receiver portion comprises a decoder that is operable to decode LDPC coded signals received from at least one additional communication device.

17. The communication device of claim 12, wherein:
the communication device is operable to support communication in accordance with recommended practices provided by the IEEE (Institute of Electrical & Electronics Engineers) P802.3an (10GBASE-T) Task Force.

18. A method for generating an LDPC (Low Density Parity Check) coded signal, the method comprising:
- encoding at least one information bit using a generator matrix, G, that has a corresponding parity check matrix, H, thereby generating an LDPC codeword that comprises at least one LDPC coded bit and at least one uncoded bit, wherein the at least one LDPC coded bit and the at least one uncoded bit of the LDPC codeword are arranged thereby forming a plurality LDPC symbols;
- symbol mapping the plurality of LDPC symbols according to a substantially evenly distributed 128 2-D (128 2-Dimensional) constellation, wherein the substantially evenly distributed 128 2-D constellation is generated from a 2-D 12-PAM (2-Dimensional 12-Pulse Amplitude Modulation) constellation comprising 144 possible constellation points that is evenly partitioned into 9 regions such that each region comprises 16 possible constellation points therein and such that 8 of the 9 regions comprise 14 constellation points therein and 1 of the 9 regions comprises all 16 possible constellation points therein.

19. The method of claim 18, wherein:
the at least one uncoded bit comprises 3 uncoded bits;
the at least one LDPC coded bit comprises 4 LDPC coded bits; and
the 3 uncoded bits indicate which subset, among 8 subsets each containing 16 constellation points, to which the 4 LDPC coded bits correspond and are symbol mapped.

20. The method of claim 18, wherein:
the LDPC coded signal is generated using an (1280, 1024) LDPC code; and
a smallest loop size of an LDPC bipartite graph corresponding to the (1280, 1024) LDPC code is greater than or equal to 6.

* * * * *